(12) United States Patent
Zhang et al.

(10) Patent No.: US 6,396,470 B1
(45) Date of Patent: May 28, 2002

(54) LIQUID CRYSTAL DISPLAY APPARATUS

(75) Inventors: Hongyong Zhang; Noriko Uchida; Takatoshi Mayama; Tetsuya Kobayashi; Kazutaka Hanaoka; Seiji Tanuma; Yuichi Inoue, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/431,596

(22) Filed: Nov. 1, 1999

(30) Foreign Application Priority Data

Mar. 19, 1999 (JP) .......................................... 11-076802
Mar. 19, 1999 (JP) .......................................... 11-076804

(51) Int. Cl.[7] ................................................ G90G 3/36
(52) U.S. Cl. ........................................ 345/87; 349/138
(58) Field of Search ........................... 345/87; 349/110, 349/44, 106, 8, 345, 349

(56) References Cited

U.S. PATENT DOCUMENTS 5,847,792 A * 12/1998 Kobayashi et al. ......... 349/110

FOREIGN PATENT DOCUMENTS

| JP | 63-81327 | * | 4/1988 | ........... G02F/1/133 |
| JP | 8-220524 | * | 8/1996 | ........... G02F/1/133 |
| JP | 8328000 | | 12/1996 | |
| JP | 9304793 | | 11/1997 | |
| JP | 10039332 | | 2/1998 | |
| JP | 2000284323 | * | 10/2000 | ........... G02F/1/136 |

* cited by examiner

Primary Examiner—Amare Mengistu
(74) Attorney, Agent, or Firm—Greer, Burns & Crain, Ltd.

(57) ABSTRACT

A liquid crystal display apparatus has a display section formed on a first substrate. The display section including a plurality of pixels disposed in a matrix pattern, a plurality of scan lines extending in a row direction and a plurality of signal lines extending in a column direction. One pixel is connected at each cross point between the scan and signal lines and each pixel includes a semiconductor active element and a pixel electrode. A signal line driver circuit is disposed at opposite end portions in the row direction and includes semiconductor active elements for driving the scan lines. A scan line driver circuit is disposed at opposite end portions in the column direction and includes semiconductor active elements for driving the signal lines. A transparent second substrate is disposed opposing the first substrate and a liquid crystal layer is sandwiched between the first and second substrates. An insulating black color shading film is formed on an inner surface of the second substrate and covers at least a partial area of the signal line driver circuit.

30 Claims, 44 Drawing Sheets

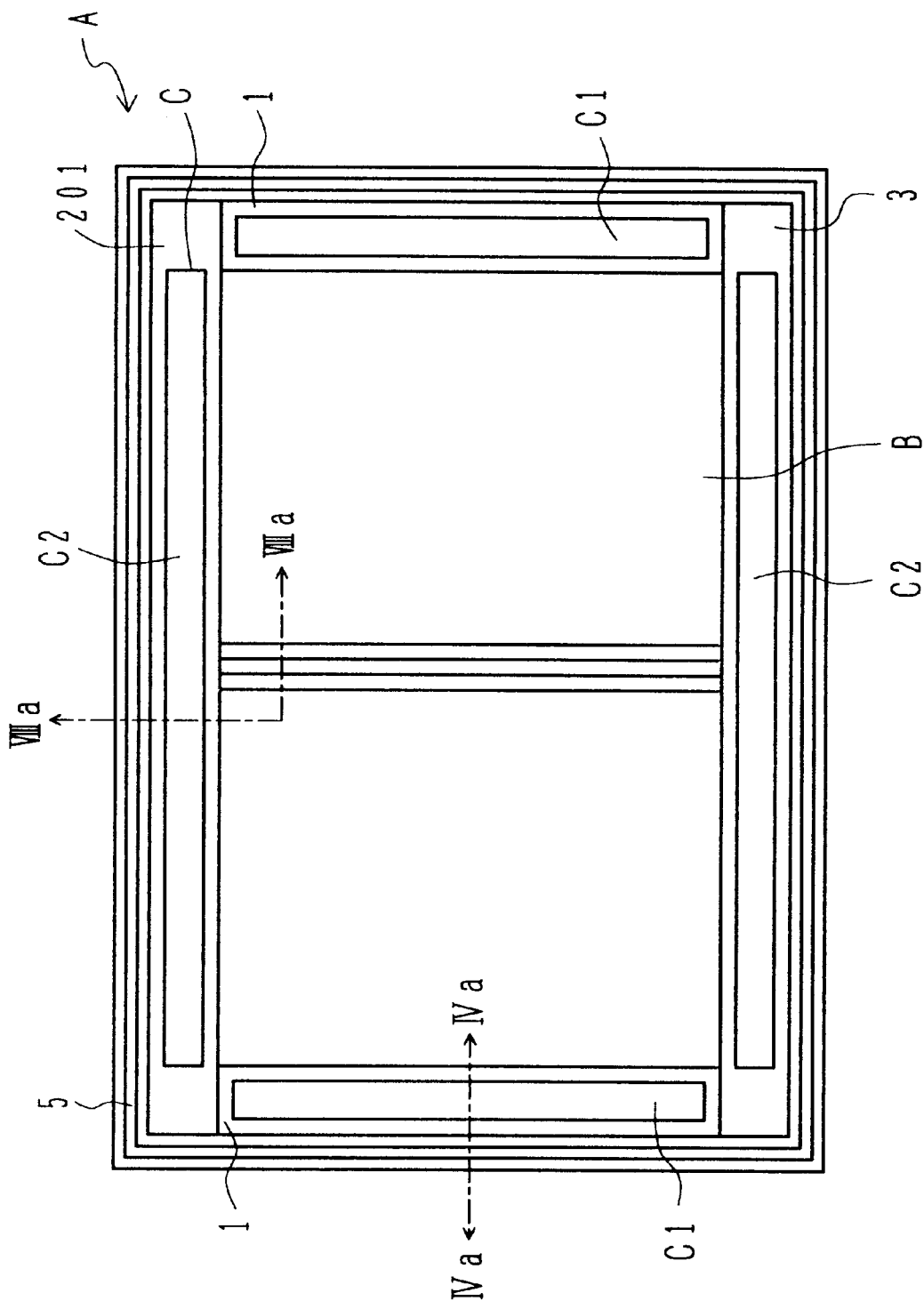

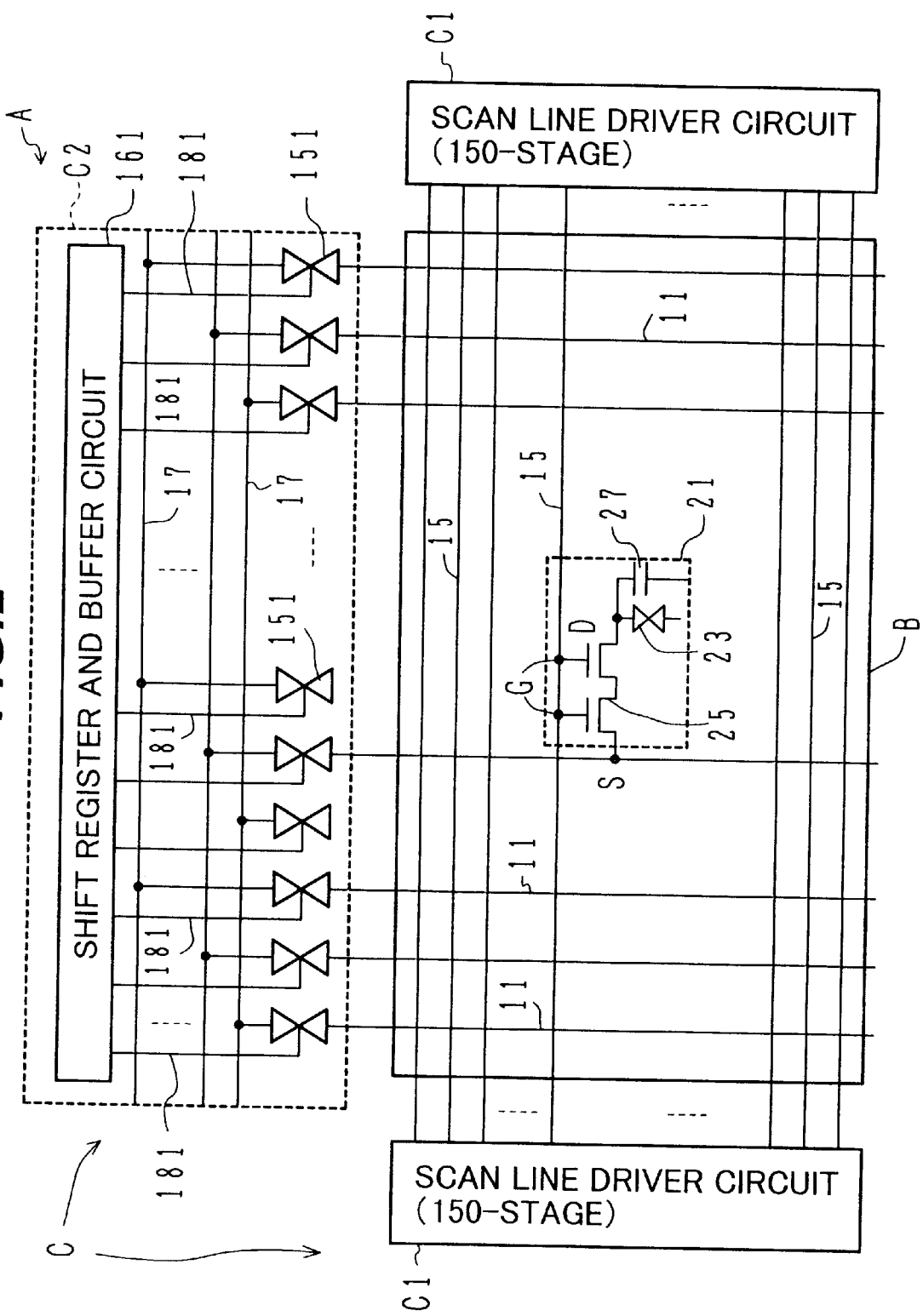

LIQUID CRYSTAL DISPLAY APPARATUS

This application is based on Japanese patent applications No. HEI 11-076802 and No. HEI-11-076804, both filed on Mar. 19, 1999, all the contents of which are incorporated herein by reference.

BACKGROUND OF THE INVENTION a) Field of the Invention

The present invention relates to a liquid crystal display apparatus and an electronic instrument using the same, and more particularly to an active matrix type liquid crystal display apparatus having semiconductor active elements such as thin film transistors (hereinafter abbreviated as "TFT") as a switching element of each pixel, and to an electronic instrument using such a liquid crystal display apparatus.

b) Description of the Related Art

In an active matrix liquid crystal display apparatus, a plurality of scan lines are disposed in a row direction and a plurality of signal lines are disposed in a column direction. A pixel is disposed at each cross point of the matrix pattern of the scan and signal lines. Each pixel includes a pixel electrode and a switching element connected to the pixel electrode. Pixel image data of the active matrix liquid crystal display is controlled to be turned on and off by the switching element. Display medium of the apparatus is liquid crystal.

MIM (metal insulator metal) elements or three-electrode elements, particularly TFT having a gate, source and drain, are used as the switching elements. In this specification, a current terminal connected to a pixel electrode is called a drain, and the other current terminal connected to a signal line is called a source. A unit cell including a pixel electrode and a TFT is called a pixel. An image is displayed in a pixel area unit where a number of pixels are disposed in a matrix pattern.

A scan line (gate line) of each row disposed in a row direction is connected to the gate electrodes of TFTs of that row. A signal line (source line) of each column disposed in a column direction is connected to the sources of TFTs of that column. A circuit for driving the scan line is called a scan line driver circuit, and a circuit for driving the signal line is called a signal driver circuit. A circuit for driving the display unit including the scan line and signal line drivers is collectively called a peripheral circuit.

An active matrix liquid crystal display apparatus of the type using TFTs as switching elements for pixel electrodes, is more suitable for multi-pixel and provides clearer images, than a simple matrix liquid crystal display apparatus having crossed wiring lines on a pair of substrates. Recently, most of display units of personal computers, video cameras (view finders) and the like use active matrix liquid crystal display apparatuses.

A number of pixel electrodes and thin film transistors are formed on a transparent glass substrate to fabricate an active matrix liquid crystal display apparatus. A silicon crystallization process accompanied with high temperature annealing is difficult to be applied to a transparent glass substrate. As TFTs used by a liquid crystal display apparatus, amorphous silicon TFTs able to be manufactured at a low temperature have been used.

However, the mobility of electrons and holes in amorphous silicon is as small as about 1 $cm^2/Vs$. An amorphous silicon TFT using amorphous silicon as a channel layer is difficult to be switched at high speed. To solve this problem, the following structures have been proposed. Namely, a chip of a peripheral circuit formed on a single crystal silicon substrate is mounted on the glass substrate of the liquid crystal display apparatus, or a flexible circuit board with a peripheral circuit chip is adhered to the glass substrate.

Techniques of polycrystallizing amorphous silicon through laser annealing have also been adopted.

If the pixel electrodes formed on a TFT substrate of an active matrix type liquid crystal display apparatus are made of reflection electrodes, a reflection type liquid crystal display apparatus can be formed.

This reflection type liquid crystal display apparatus does not require back light as in the case of a transmission type liquid crystal display apparatus. As compared to a transparent liquid crystal display apparatus, it can be made less in power consumption, thinner, more compact, and lighter in weight.

A reflection type liquid crystal display apparatus is easy to be applied to a projector panel. A projector panel using the reflection type liquid crystal display apparatus can be made more compact and precise and can use more inexpensive optical systems than a transmission type liquid crystal display panel. In addition, a projector panel using a reflection type liquid crystal display apparatus can be made to have a ultra high luminance. It also has a high reliability because of less optical degradation and ease of panel cooling.

A conventional reflection type liquid crystal display apparatus is, however, associated with the following problems.

1) Problem of Coupling

Electrical coupling occurs among reflection electrodes, signal bus lines and TFTs. The electrical characteristics and optical quality of a liquid crystal display apparatus may be degraded by flicker capacitance and crosstalk capacitance.

(2) Problem of Crosstalk by Photocurrent

In a reflection type liquid crystal display apparatus, light passing through an opposing substrate (second substrate) may become incident upon the first substrate through a gap between reflection electrodes. If this light enters a pixel TFT of the display unit, display degradation such as crosstalk may be caused by photocurrent generated by TFT.

SUMMARY OF THE INVENTION

It is desired to monolithically fabricate a display unit and a peripheral circuit on the same substrate in order to reduce a manufacture cost of a liquid crystal display apparatus and raise a manufacture efficiency.

It is an object of the present invention to provide a liquid crystal display apparatus having a peripheral circuit integrated with a display unit and providing a high speed operation.

It is another object of the invention to provide a reflection type liquid crystal display apparatus with fine pixels formed in a display unit, and a display panel using such a reflection type liquid crystal display apparatus.

According to one aspect of the present invention, there is provided a liquid crystal display apparatus comprising: a first substrate; a display section formed on the first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode; a first peripheral circuit disposed at opposite end portions of the first substrate in the row direction and including a scan line driver circuit including semiconductor active elements for driving the scan lines; a second peripheral circuit disposed at opposite end portions of the first substrate in the column direction and including a signal line driver circuit including semiconductor active elements for driving the signal lines; a transparent second substrate disposed opposing the first substrate; a liquid crystal layer sandwiched between the first and second substrates; and an insulating black color shading film formed on an inner surface of the second substrate and covering at least a partial area of the second peripheral circuit.

According to another aspect of the present invention, there is provided a reflection type liquid crystal display apparatus comprising: a first substrate including a display section with a plurality of pixels disposed in a matrix pattern; a second substrate disposed opposing the first substrate and formed with a first common electrode; and a liquid crystal layer sandwiched between the first and second substrates, wherein the display section of the first substrate comprises: a plurality of semiconductor active elements disposed in a matrix pattern, each having a source, a drain and a gate; an interlayer insulating film deposited covering the semiconductor active elements; a plurality of scan lines formed in the interlayer insulating film each for connecting the gate of the semiconductor active element dispose in a row direction; a plurality of signal lines formed in the interlayer insulating film each for connecting the source of the semiconductor active element disposed in a column direction; a second common electrode formed in the interlayer insulating film at a level higher than the scan and signal lines, covering a plurality of pixels, electrically connected to the first common electrode, and having an opening above the drain of each semiconductor active element; and a plurality of pixel electrodes formed on the interlayer insulating film, each being connected to the drain of a corresponding one of the semiconductor active element by penetrating through a contact hole formed in the interlayer insulating film in an area corresponding to the opening, the pixel electrode being separated for each pixel and opposing the first common electrode via the liquid crystal layer.

As above, in a peripheral circuit integrated liquid crystal display apparatus, an insulating black color shading film covering at least a partial area of the peripheral circuit thin film transistors constituting the signal line driver circuit is formed. It is therefore possible to prevent malfunction of TFTs to be caused by incidence light and also prevent large parasitic capacitance to maintain a high operation performance of the peripheral circuit.

By using the reflection type liquid crystal display apparatus of the invention, high integration and high performance of the reflection type liquid crystal display apparatus can be realized.

BRIEF DESCRIPTION OF THE DRAWINGS

FIG. 1 is a plan view of a liquid crystal display apparatus according to a first embodiment of the invention.

FIG. 2 is an equivalent circuit diagram of the liquid crystal display apparatus of the first embodiment.

FIG. 3A shows a bottom-gate type TFT and FIG. 3B shows a top-gate type TFT.

FIG. 7A is a circuit diagram of a flip-flop circuit constituting a shift register, and FIG. 7B is a circuit diagram of a buffer circuit.

FIG. 23A shows an application to a direct view type liquid crystal panel, and FIG. 23B shows an application to a projection type liquid crystal panel.

DETAILED DESCRIPTION OF THE PREFERRED EMBODIMENTS

Figure 3A:
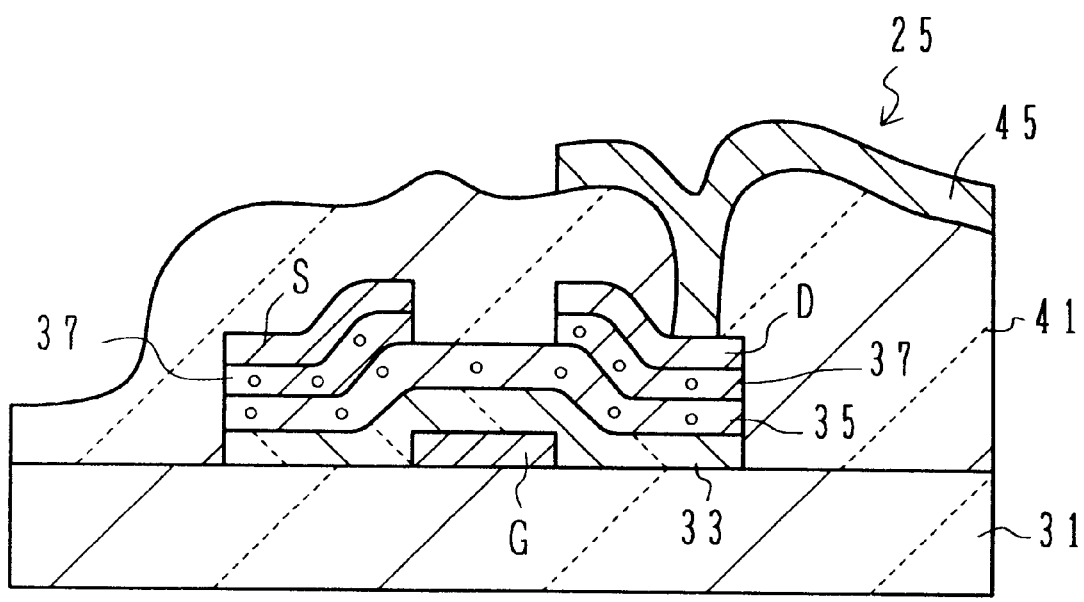
FIGS. 3A and 3B are cross sectional views mainly showing a pixel TFT of the liquid crystal display apparatus of the first embodiment.

Low temperature crystallization techniques have been developed recently, such as laser annealing with excimer laser and crystallization of amorphous silicone doped with Ni or Ge. Based on these techniques, other techniques of forming polycrystalline silicon (polysilicon) by crystallizing amorphous silicon formed on a glass substrate by applying excimer laser are also being developed.

The mobility of electrons and holes in a polysilicon channel layer is about 50 to 100 $cm^2/Vs$, which is far larger than that of amorphous silicon. Therefore, if a polysilicon TFT is used, a very fast switching operation is possible as compared to an amorphous silicon TFT.

A liquid crystal display apparatus according to the first embodiment of the invention will be described with reference to FIGS. 1 to 8.

FIG. 1 shows an example of a plan layout of an active matrix type liquid crystal display apparatus A having a pixel area for displaying an image and a peripheral circuit area for controlling the pixel area integrally formed on the same substrate. This liquid crystal display apparatus has the pixel area B of a generally rectangle for displaying an image and the peripheral circuit area C disposed around the pixel area for driving the pixel area B.

The peripheral circuit area C includes first peripheral circuits (hereinafter called a "scan line driver circuit") C1 disposed along right and left shorter sides of the pixel area B to which scan lines extend and second peripheral circuits (hereinafter called a "signal line driver circuit") C2 disposed along upper and lower longer sides to which signal lines extend. A black matrix (BM) 1 made of Cr is disposed on the scan line driver circuits C1 as conducting shield films. An insulating black shield films 201 made of insulating black resin are formed on the signal line driver circuits C2.

The outer periphery of the peripheral circuit area C is surrounded by a sealing member 5 for sealing liquid crystal in the apparatus housing. Both the pixel area B and peripheral circuit area C include a plurality of TFTs dispersively disposed and having a semiconductor layer of polysilicon.

FIG. 2 is an equivalent circuit diagram showing the whole circuit structure of the active matrix type liquid crystal display apparatus A. As described above, the liquid crystal display apparatus A includes the pixel area B and peripheral circuit area C.

For example, signal lines 11, 11, 11, . . . , 2400 lines in total, extend in a column direction in the pixel area B. Color information such as RGB is transferred by three signal lines. Namely, 800 pieces of color information can be signalled by 2400 signal lines.

For example, scan lines 15, 15, 15, . . . , 600 lines in total, extend in a row direction also in the pixel area B, crossing the signal lines 11. A pixel 21 is disposed at each cross point between the signal and scan lines. Pixels 21, 21, 21, . . . , 2400×600 pixels in total, are disposed in a matrix pattern in the pixel area B. Each pixel unit constituted of three pixels can display three colors of RGB. 800×600 pieces of color information can be displayed in the whole area of the pixel area.

The pixel 21 includes a liquid crystal cell 23, a pixel TFT 25, and a storage capacitor 27. Although the pixel TFT 25 is illustratively shown as a double gate TFT in FIG. 2, it may be a single gate TFT. A double gate TFT is preferable in order to reduce leakage current.

The source electrode S of the pixel TFT 25 is connected to the signal line 11. The gate electrode of the pixel TFT 25 is connected to the scan line 15. The liquid crystal cell 23 and storage capacitor 27 are connected in parallel on the side of the drain electrode D of the pixel TFT 25.

The storage capacitor 27 of the pixel 21 stores signal charges supplied from the signal line 11. The storage capacitor 27 can effectively hold the stored signal charges, for example, even if leakage current of the pixel TFT 25 cannot be neglected. The storage capacitor 27 may be provided when necessary.

A number of pixels 21 are line sequentially driven by the 600 scan lines 15, 15, 15, . . . which are driven by the scan line driver circuit C1. During the scan period, each pixel 21 receives image information from a corresponding one of the 2400 signal lines 11 driven by the signal line driver circuit C2.

Figure 3B:
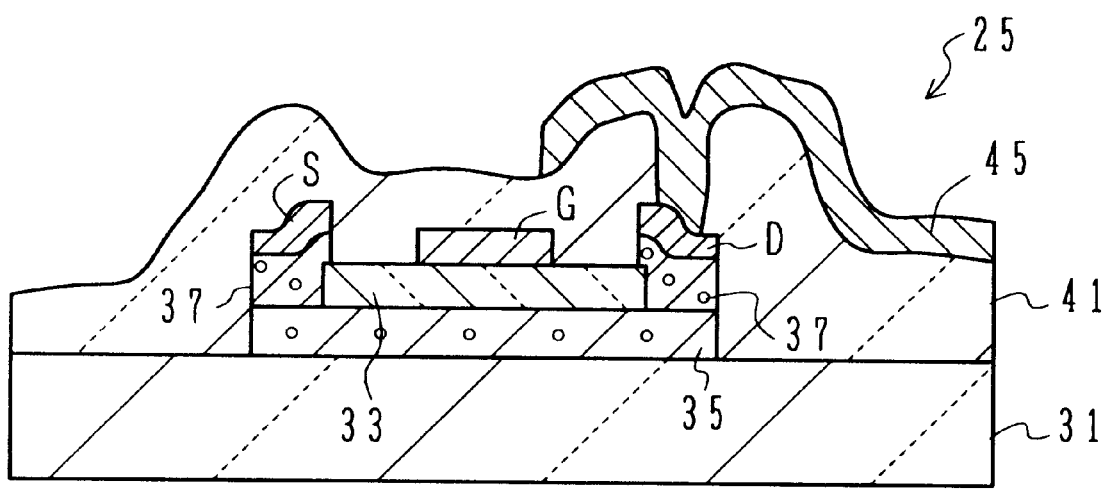

FIGS. 3A and 3B are cross sectional views showing the structure of the pixel TFT in the pixel area B.

FIG. 3A shows an example of the structure of a bottom-gate type TFT.

A bottom-gate type TFT 25 shown in FIG. 3A has,a gate electrode G made of metal such as Cr and formed on a transparent substrate 31. An insulating film 33 made of SiN, $SiNO_2$ or the like and functioning as a gate insulating film is formed over the gate electrode G. On the insulating film 33, a channel polysilicon film 35 functioning as a channel layer is deposited. Polysilicon layers 37 and 37 doped with impurities more than the channel polysilicon film 35 are formed on the channel polysilicon film 35 on both sides of the gate electrode G. On these high impurity concentration polysilicon layers 37 and 37, a source electrode S and a drain electrode D are formed. The pixel TFT 25 formed in the above manner is covered with an interlayer insulating film 41 made of silicon nitride, silicon oxide or the like to electrically insulate and protect the pixel TFT 25. A contact hole is formed through the interlayer insulating film 41, and a pixel electrode 45 made of ITO is formed filling the contact hole. This pixel electrode 45 is connected to the drain electrode D of the pixel TFT 25.

For example, the polysilicon film is formed by depositing an amorphous silicon film and crystallizing it. As a crystallizing process, it is preferable to adopt laser annealing crystallizing techniques using low temperature excimer laser supplied from a light source of XeCl (wavelength of 308 nm) or KrF (wavelength of 248 nm). By using the laser annealing crystallizing techniques, it is possible to crystallize only TFTs in the signal line driver circuit or only TFTs in the peripheral circuit area which are required to operate at high speed. In this case, the laser beam scan area can be reduced.

FIG. 3B shown an example of the structure of a top-gate type TFT.

In a top-gate type TFT 25 shown in FIG. 3B, a polysilicon layer 35 functioning as a channel layer is formed on a transparent substrate 31. On the polysilicon layer 35, an insulating film 33 made of SiN, $SiO_2$ or the like and functioning as a gate insulating film is formed. On the insulating film 33, a gate electrode made of metal such as Cr is formed. Polysilicon layers 37 and 37 doped with impurities more than the channel polysilicon film 35 are formed on the channel polysilicon film 35 in source and drain regions. On these high impurity concentration polysilicon layers 37 and 37, a source electrode S and a drain electrode D are formed.

The pixel TFT 25 formed in the above manner is covered with an interlayer insulating film 41 made of silicon nitride, silicon oxide or the like to electrically insulate and protect the pixel TFT 25. A contact hole is formed through the interlayer insulating film 41, and a pixel electrode 45 made of ITO is formed filling the contact hole. This pixel electrode 45 is connected to the drain electrode D of the pixel TFT 25.

Instead of the Cr layer, a Ti/Al/Ti lamination layer may be used. The high impurity concentration polysilicon layer 37 may be omitted by doping impurities at a high concentration into desired regions of the channel polysilicon layer 35. Peripheral circuit TFTs can be formed in an area different from an area where pixel electrodes are formed.

Figure 4:
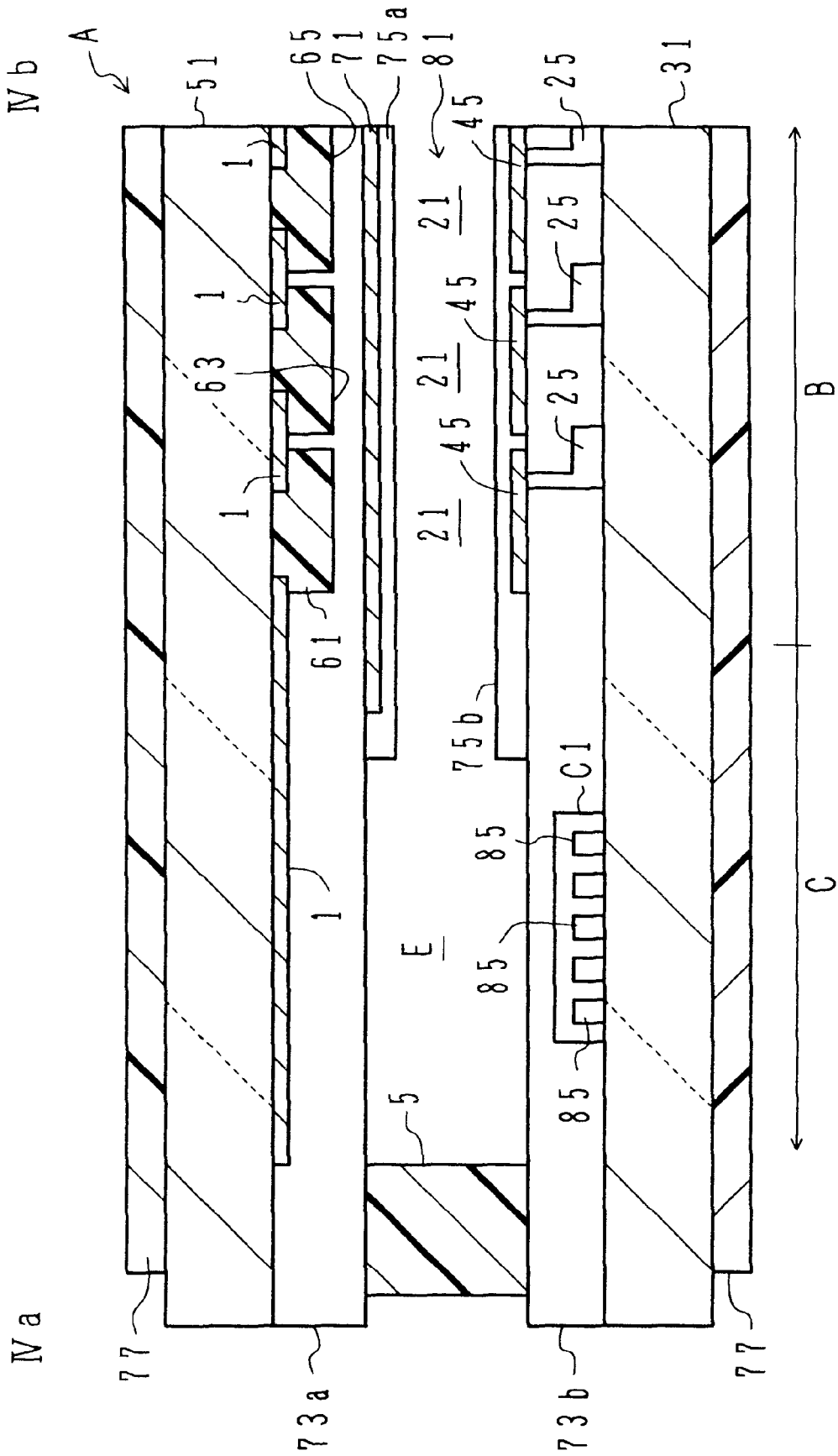
FIG. 4 is a cross sectional view of the liquid crystal display apparatus of the first embodiment, showing the scan line driver circuit side and taken along line IVa–IVb shown in FIG. 1.

FIG. 4 is a cross sectional view taken along line IVa–IVb shown in FIG. 1. The liquid crystal display apparatus A shown in FIG. 4 includes the pixel area B and the peripheral circuit area C formed outside of the pixel area B. The liquid crystal display apparatus A includes a first transparent substrate 31, a second transparent substrate 51, and liquid crystal material E filled in a liquid crystal storing space 81 formed between the two transparent substrates.

In the pixel area B, a plurality of pixels 21 are formed.

The pixel 21 includes a pixel TFT 25 and a pixel electrode 45 formed on the inner surface of the first transparent substrate 31.

As shown in FIG. 4, in the area outside of the pixel are B, the peripheral circuit area C is allocated. In FIG. 4, a peripheral circuit formed on the first transparent substrate 31 is the first peripheral circuit (scan line driver circuit) C1. The scan line river circuit C1 includes a number of polycrystalline thin film transistors, i.e., peripheral circuit TFTs 85, as active elements.

Uneven surfaces of the pixel TFT25 and peripheral circuit TFT 85 are planarized by a planarizing film 73b formed over the first transparent substrate 31. The pixel electrode 45 is formed on this planarizing film 73b. An orientation film 75b is formed covering the pixel electrode 45 and planarizing film 73b in the pixel area B.

The pixels 21 include color resin films 61, 63, and 65 of red (R), green (G) and blue (B) formed on the inner surface (on the side facing the first transparent substrate 31) of the second transparent substrate 51 and a common electrode 71 formed under the color resin films 61, 63 and 65. The color resin films 61, 63 and 65 are formed at the positions facing the corresponding pixel electrodes 45.

A black matrix (BM) 1 for shielding light from the pixel TFTs 25 is formed between adjacent ones of the color resin films 61, 63 and 65. Other black matrixes (BM) 1 made of Cr and functioning as light shielding films are also formed on the inner surface of the second transparent substrate 51 over the peripheral circuit TFTs 85, covering the peripheral circuit TFTs 85.

The color resin films 61, 63 and 65 and black matrixes BM 1 are covered with a planarizing dielectric film 73a. The planarizing dielectric film 73a covers the uneven surface of the color resin films 61, 63 and 65 to planarize the lower surface of the planarizing dielectric film 75a. On this planarized surface, a common electrode 71 for all pixels is formed. The surface of the common electrode 71 is covered with an orientation film 75a made of resin such as polyimide.

The insulating black resin may be polyimide containing black color pigment. If photosensitive polyimide is used as the material of insulating black resin, the light shielding film can be formed in a desired area, e.g., an area where a circuit necessary for a high speed operation in the second peripheral circuit, e.g., only a shift register circuit, without using a resist mask.

A sealing member 5 is interposed between the first and second transparent substrates 31 and 51 and outside of the peripheral circuit area C. The first and second transparent substrates 31 and 51 together with the sealing member 5 define the liquid crystal storing space 81. Liquid crystal material E is filled in the liquid crystal storing space 81.

A liquid crystal cell 23 (FIG. 2) includes the pixel electrode 45 made of ITO, the common electrode 71 made of ITO, and the liquid crystal material E filled between the electrodes.

The details of the circuit structure in the peripheral circuit area C will be given.

Figure 5:
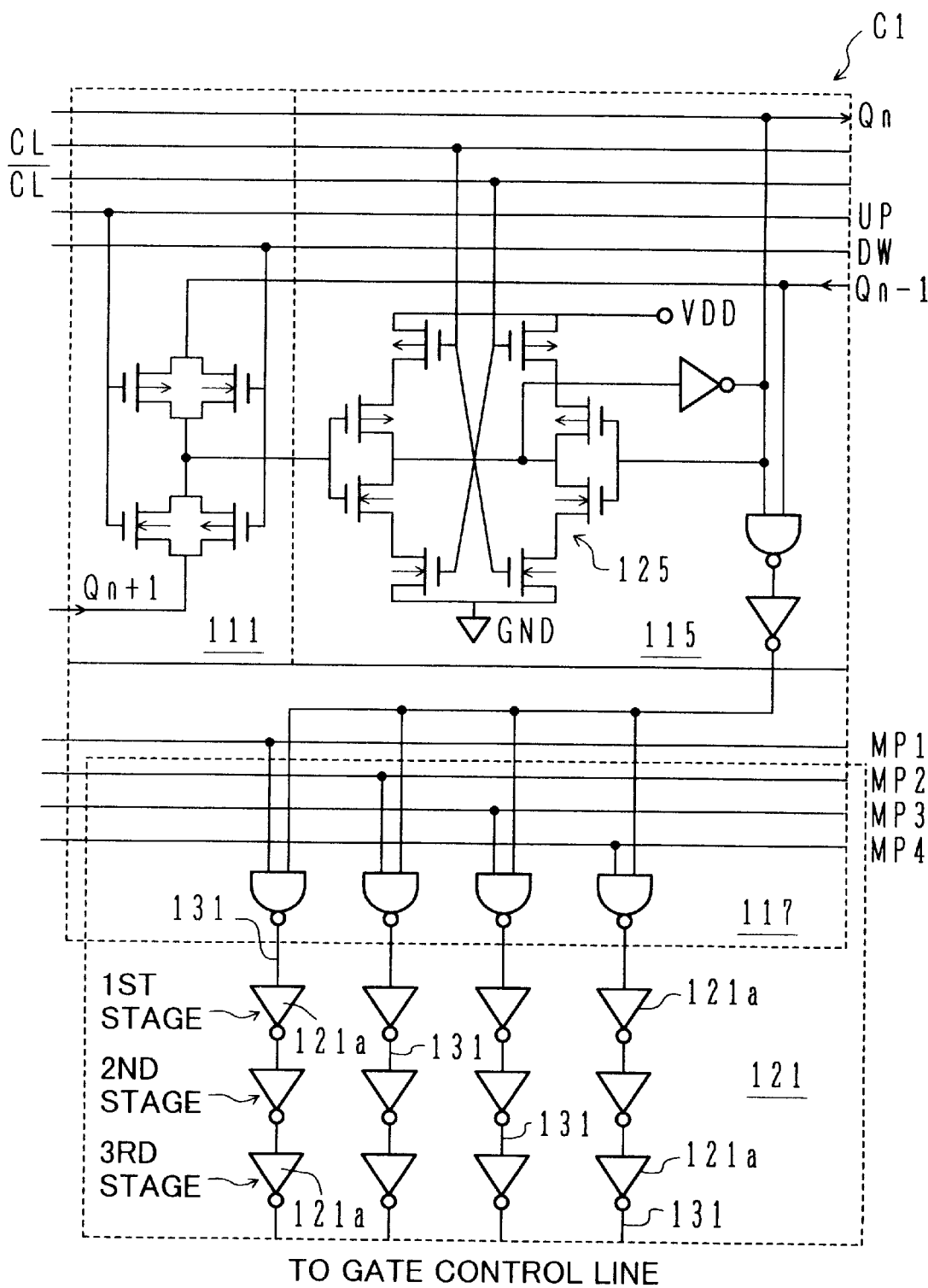
FIG. 5 is a circuit diagram of the liquid crystal display apparatus of the first embodiment, showing the scan line driver circuit side.

FIG. 5 is a circuit diagram of a driver circuit of one stage among 150 stages of the scan line driver circuit C1. The scan line driver circuit C1 has 150 serially connected stages of the driver circuit shown in FIG. 5. The driver circuit of one stage shown in FIG. 5 includes: a two-way switching section 111 for switching between scan modes; a shift register section 115 for generating scan signals; a multiplexer section 117 for determining a timing of each scan signal; and an output buffer 121 including serially connected three stages of inverters 121a, 121a and 121a used for increasing a load drivability.

Power supply voltages for a flip-flop circuit 125 are VDD and GND. An output of the flip-flop circuit 125 is supplied to the multiplexer section 117 via an AND gate and an inverter. In the multiplexer section 117, an output of the flip-flop circuit 125 is branched to four output signal lines. The branched four output signals are subjected to an AND operation with multiplex signals MP1 to MP4 and supplied to the output buffer section 121.

The output buffer section 121 outputs the four signals from the multiplexer section 117 by increasing a load drivability. The output buffer section 121 has four output terminals each being connected via the scan line to the gate G of the pixel TFT 25 in the pixel area B. The scan line driver circuit C1 is made of 150 stages each having four output terminals. Therefore, the scan line driver circuit C1 scans 600 scan lines 15, 15, 15, . . .

The operation of the scan line driver circuit C1 will be described. The scan line driver circuit C1 sequentially scans the scan lines 15 synchronously with a clock signal CL or its inverted signal (−CL). All pixels connected to one scan line are temporarily maintained in an on-state at the same time. Since rows are sequentially scanned, the number of scan line drive signals is 600 per one frame, and the shift register section 115 generates 150 signals per one frame. Therefore, the shift register section 115 on the scan line side is not required a high speed operation so much. The pulse frequency of clock signals CL and their inverted clock signals (−CL) of the shift register section 115 of the scan line driver circuit C1 is 40 to 60 kHz.

The structure of the signal line driver circuit C2 will be described.

The outline structure of the signal line driver circuit C2 is shown in FIG. 2.

The signal line driver circuit C2 includes: analog switches 151; an analog switch control section 161 for controlling the analog switches 151; and analog switch control signal lines 181 interconnecting the analog switches 151 and analog switch control section 161.

A video signal supplied from an unrepresented video signal generator is applied to the analog switch 151 via a video signal line 17. The video signal is supplied via the signal line 11 to the source electrode S of the pixel TFT 25 if the corresponding analog switch 151 is on.

The analog switch control section 161 turns on and off the analog switch to control whether or not the video signal is transferred to the source electrode S of the pixel TFT 25.

Figure 6:
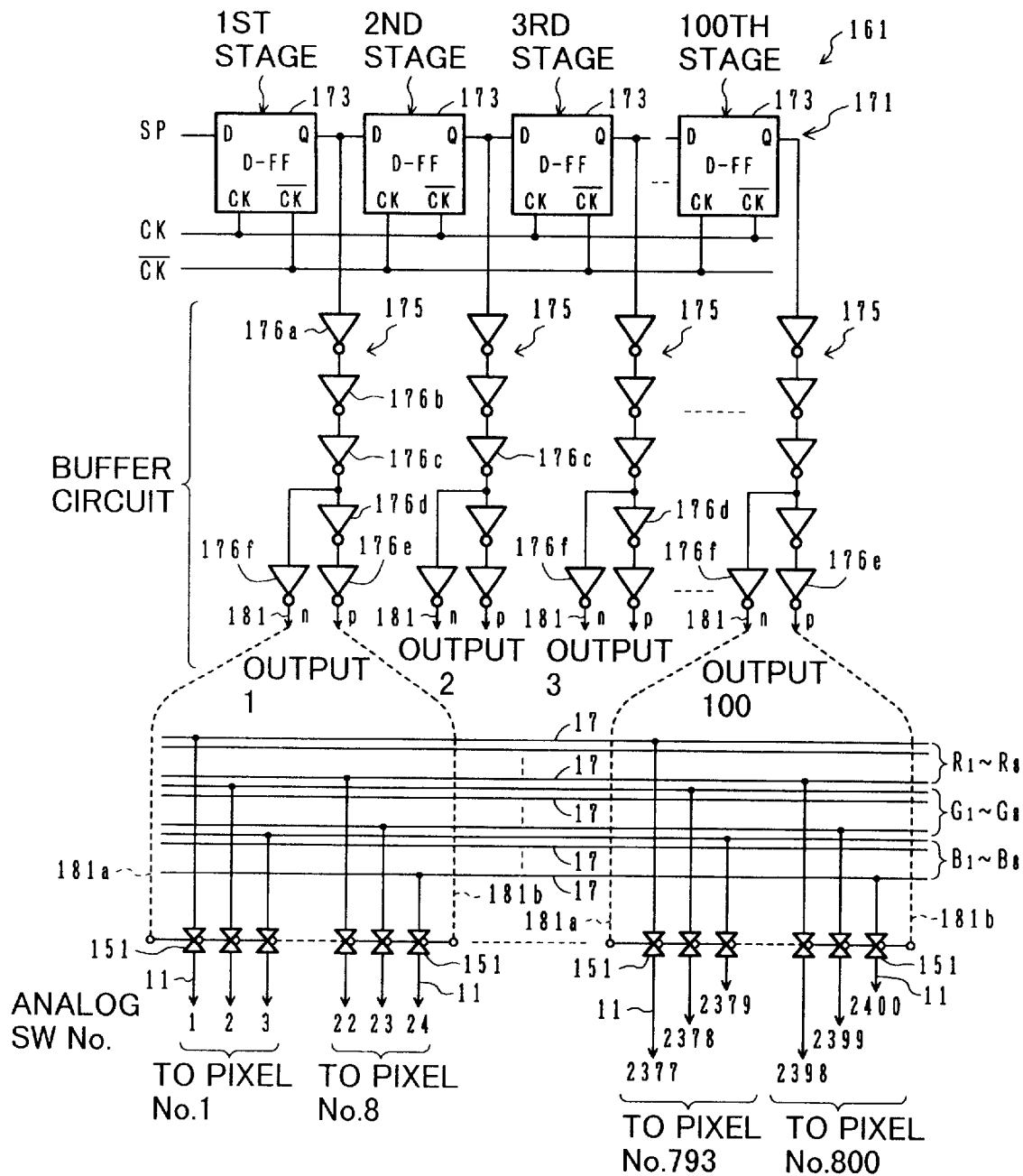
FIG. 6 is a circuit diagram of the liquid crystal display apparatus of the first embodiment, showing the signal line driver circuit side.

FIG. 6 shows the connection between the signal line driver circuit C2 which includes the analog switches 151 and analog switch control unit 161 for controlling the analog switches 151, video signal lines 17, and the pixels 21 in the pixel area B.

The total number of pixels 21 in the pixel area B is 800 including the pixel No. 1 to the pixel No. 800. One pixel 21 includes three sub-pixels of RGB colors. The number of sub-pixels in the pixel area B is 2400 (800×3).

The number of video signal lines 17 is 24, including eight R video signal lines R1 to R8, eight G video signal lines G1 to G8, and eight B video signal lines B1 B8.

The total number of analog switches 151 is 2400 including the analog witch No. 1 to the analog switch No. 2400. Each analog switch 151 includes a CMOS type TFT made of a pair of p- and n-type TFTs.

The analog switch control section 161 includes: a shift register circuit 171 made of serially connected 100 stages of flip-flop circuits 173, 173, 173, . . . ; buffer circuits 15 connected to each output of the flip-flow circuit 173 of the shift register circuit 171; and analog switch control signal lines 181 interconnecting the outputs of the buffer circuits 175 and the control electrodes of the analog switches.

The same clock signal CK and inverted clock signal (−CK) are input to the clock terminals of the flip-flop circuit of 100 stages. Of the flip-flop circuits of 100 stages, the first stage flip-flop circuit 173 is supplied with an SP signal at its input terminal. An output signal of the first stage flip-flop circuit 173 is supplied via its output terminal Q to the first stage buffer circuit 175.

An output Q of the first stage flip-flop circuit 173 is input to the input terminal D of the next stage (second stage) flip-flop circuit 172. An output of the second stage flip-flop circuit is applied to the input terminal of the second stage buffer circuit 175. Similarly, the output of each flip-flop circuit 173 is supplied to the input terminal of the next stage flip-flop circuit 173 and to the input terminal of the same stage output buffer circuit 175.

An output of the buffer circuit 175 is branched to two lines between third and fourth inverters 176c and 176d as counted from the flip-flop circuit 173 side. Of the two branched lines, one line delivers an n-output via one inverter 176f, and the other line delivers a p-output via two inverters 176d and 176e.

Figure 7A:
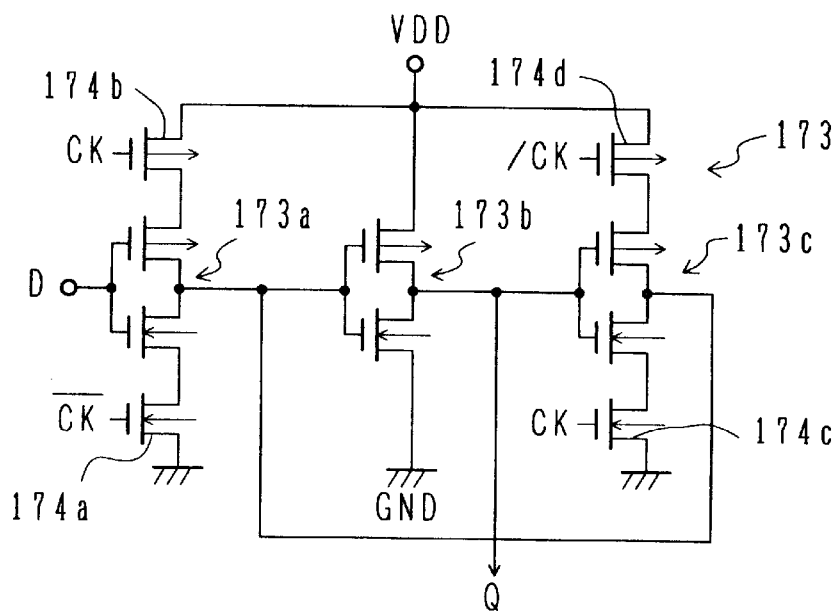
FIGS. 7A and 7B are circuit diagrams of the liquid crystal display apparatus of the first embodiment, showing the signal line driver side.
Figure 7B:
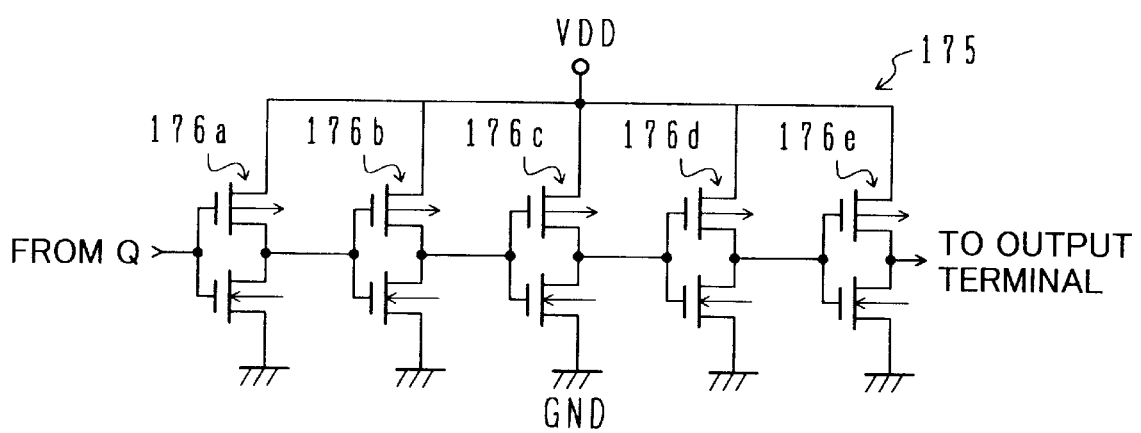

FIG. 7A is a circuit diagram showing the details of the flip-flow circuit 173 of the shift register circuit 171, and FIG. 7B is a circuit diagram showing the details of the buffer circuit 175.

The flip-flop circuit 173 includes serially connected three-stage CMOS circuits 173a, 173b and 173c. Power supply voltages are VDD and GND. The first stage CMOS circuit 173a is an clocked inverter and an n-type MOS transistor 174a is coupled to the ground terminal side. The inverted clock signal (−CK) is input to the gate electrode terminal of the n-type MOS transistor 174a. A p-type MOS transistor 174b is coupled to the power supply voltage VDD terminal side of the first stage CMOS circuit. The clock signal CK is input to the gate electrode terminal of the p-type MOS transistor 174b.

An input to the first stage CMOS circuit 173a is applied to the input terminal D of the shift register circuit 171. The second stage CMOS circuit 173b is an inverter whose input terminal is connected to the output terminal of the first stage CMOS circuit 173a, and whose output terminal is connected to the input terminal of the third stage clocked inverter.

An n-type MOS transistor 174c is coupled to the ground terminal side of the third stage CMOS circuit 173c. The clock signal CK is input to the gate electrode terminal of the n-type MOS transistor 174c. A p-type MOS transistor 174d is coupled to the power supply voltage VDD terminal side of the third stage CMOS circuit 173c. The inverted clock signal (−CK) is input to the gate electrode terminal of the p-type MOS transistor 174d.

The input terminal of the third stage CMOS circuit 173c is connected to the output terminal Q of the flip-flop circuit 173. The input terminal of the third stage CMOS circuit 173c is also connected to the input terminal D of the second stage shift register circuit 172. The output terminal of the third stage CMOS circuit 173c is also connected to the line coupling the output of the first stage CMOS circuit 173a and an input of the second stage CMOS circuit 173b.

FIG. 7B shows the details of the p-output side of the buffer circuit 175.

As shown in FIG. 7B, the p-output side of the buffer circuit 175 is constituted of serially connected five-stage CMOS inverters 176a, 176b, 176c, 176d and 176e. The input terminal of the buffer circuit 175 is connected to the output terminal Q of the flip-flop circuit 173 shown in FIG. 7A. The p-output of the buffer circuit 175 together with the branched n-output (FIG. 6) is supplied to the control terminal of the analog switch 153.

When a signal is input to the input terminal D of the flip-flop circuit 173, an output signal Q is output in response to the clock signal CK and inverted clock signal (−CK). The output Q of each flip-flop circuit 173 controls the corresponding analog switch 151 via the output buffer circuit 175. The output signal Q of each flip-flop circuit 173 is applied to the input terminal D of the next stage flip-flop circuit.

As shown in FIG. 6, the analog switches 151 from the analog switches No. 1 to No. 24 each constituted of two TFTs (p- and n-type TFTs) are made of 48 TFTS. The twenty four analog switches 151 are supplied with the same output signals (e.g., output 1, two polarities of p and n).

More specifically, the n-output from the buffer circuit is supplied to the gate electrodes of n-type TFTs of all twenty four analog switches via the analog switch control lines 181a, whereas the p-output from the buffer circuit is supplied to the gate electrodes of p-type TFTs of all twenty four analog switches via the analog switch control lines 181b.

The circuit operation will be described with reference to FIG. 6.

A control signal from the flip-flop circuit 173 of each stage controls at the same time the on/off of twenty four analog switches (e.g., twenty four analog switches from No. 1 to No. 24). When the control signal from the flip-flop circuit 173 of one stage turns on at the same timing the twenty four analog switches 151, data is written in eight pixels (three sub-pixels of RGB per each pixel) via the signal lines 11. This operation corresponds to a so-called point sequential writing system with data division by 8.

The circuit operation of the liquid crystal display apparatus will be described more specifically.

When the scan line driver circuit C1 selects one scan line 15 and all pixel TFTs 25 whose gates are connected to this selected scan line are made conductive, twenty four p-type TFTs and twenty four n-type TFTs of the analog switches 151 from No. 1 to No. 24 are turned "on" at the same time, in response to the analog switch control signals of the output 1 output from the n- and p-terminal of the output buffer 175 connected to the first stage flip-flop circuit 173 of the shift register circuit 171.

When the analog switches 151 are turned "on", electric charges are supplied, via the pixel TFT 25 already made conductive by the signal from the selected scan line 15 in the pixel area B, to each pixel cell (liquid crystal cell 23 and storage capacity 27) to write image information in each pixel cell, in accordance with the contents of signals on the video signal lines 17 including R1 to R8, G1 to G8, and B1 to B8.

The shift register circuit 171 including the first to hundredth flip-flop circuits sequentially outputs the control signal to sequentially turn "on" the analog switches 151 including No. 1 to No. 2400. The video signal (display signal) supplied from the video signal lines 17 is divided into 24 pixels per one stage flip-flop circuit 173, and finally transferred to the sub-pixels from No. 1 to No. 2400.

When the scan line driver circuit C1 selects the next scan line, the pixel TFTs selected at that time become non-conductive, so that the liquid crystal cell 23 and storage capacitor 27 are electrically disconnected from the signal line 11. During one horizontal period while one hundred and fifty (150) scan lines are sequentially scanned, the picture image information stored is maintained until the next scan.

The above-described operations are sequentially repeated to display images.

The operation speed of the shift register in the signal line driver circuit C2 is 4.88 MHz which is higher than that of the shift register in the scan line driver circuit.

Figure 8:
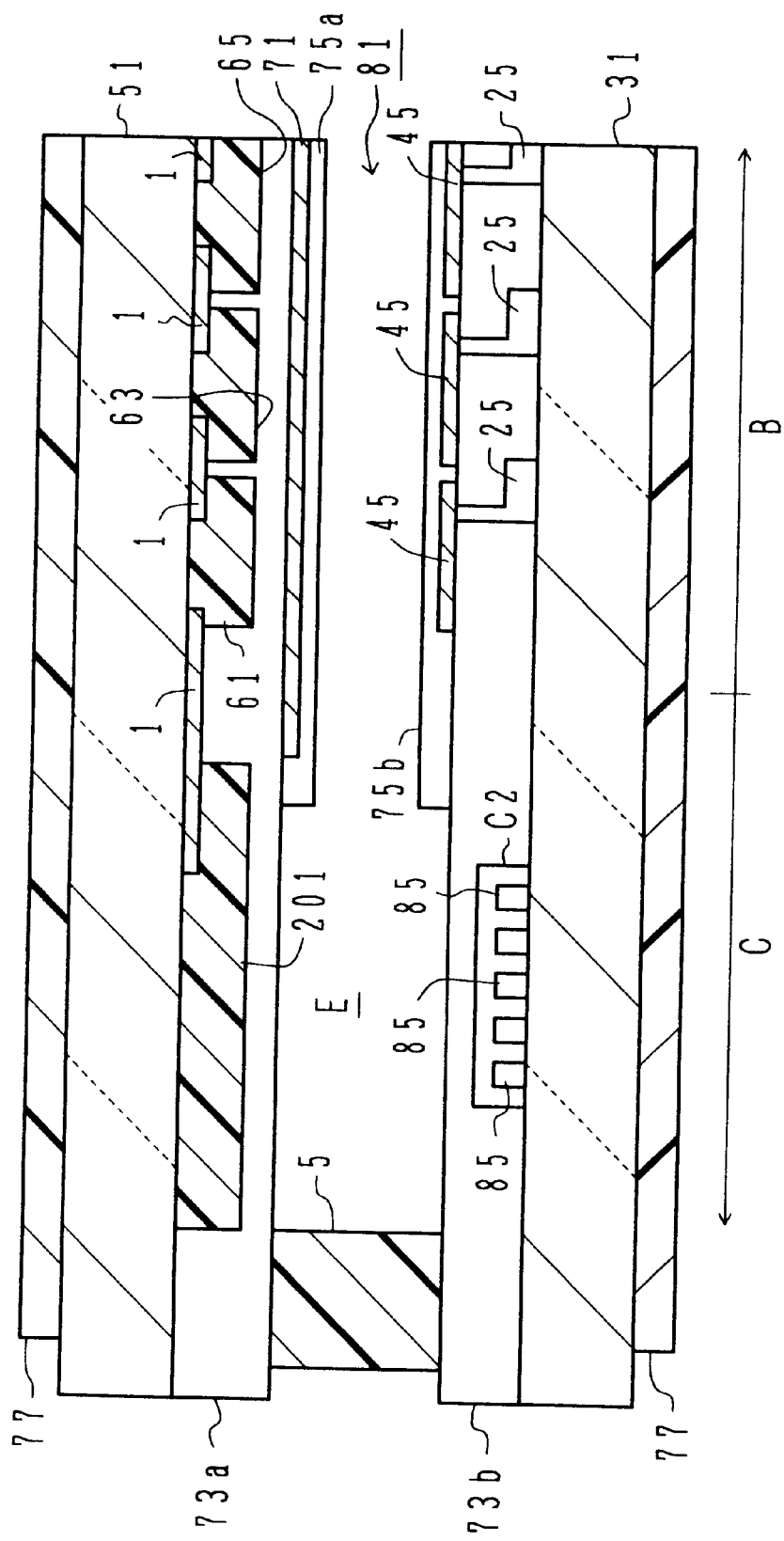
FIG. 8 is a cross sectional view of the liquid crystal display apparatus of the first embodiment, showing the signal line driver circuit side and taken along line VIIIa–VIIIb shown in FIG. 1.

FIG. 8 is a cross sectional view of the liquid crystal display apparatus taken along line VIIIa–VIIIb shown in FIG. 1, showing the peripheral circuit area including the signal line driver circuit. Peripheral circuit TFTs may be polysilicon TFTs. The structure of the pixel area B is similar to that shown in FIG. 4 taken along line IVa–IVb shown in FIG. 1.

In FIG. 8, the signal line driver circuit C2 on the first transparent substrate 31 using polycrystalline TFTs 85 as semiconductor active elements is shown. In the structure shown in FIG. 8, the light shielding film above the signal line driver circuit C2 (on the side of the second transparent substrate 51) for shielding light from the signal line driver circuit C2 is not a black matrix (BM), i.e., conducting shading film, but an insulating black resin film 201. The insulating black resin film 201 has preferably a film thickness generally equal to that of the color filters 61, 63 and 65.

Black matrixes (BM) 1, 1, 1, . . . partially overlapping the color filters 61, 63 and 65 are formed on the second transparent substrate 51 in the pixel area B, in order to prevent light leakage between pixels and improve the color display characteristics. The black matrix extends to the signal line driver circuit C2 and partially overlaps the insulating black resin form 201. This overlap realizes a continuous shading structure or double shading structure which improves the shading performance.

As the material of the insulating black resin film 201, polyimide mixed with black pigment is preferable. Acrylic or epoxy resin mixed with black pigment may also be used. If photosensitive resin is used, the black resin film can be patterned through exposure and development processes without using a photoresist mask.

The black resin film 201 shields light (mainly visible light) to be incident upon the signal line driver circuit C2 from the second transparent substrate 51 side. Even for oblique incidence light, the double shading structure made of the black matrixes 1 and black resin film 201 provides a sufficient shading performance.

The shading structure disposed near the signal line driver circuit C2 is only the black resin film 201. Therefore, a parasitic capacitance between the insulating black resin film 201 and TFTs 85 in the signal line driver circuit C2 can be made considerably small. Therefore, even if the shading structure is provided, the parasitic capacitance will not lower the operation speed of the signal line driver circuit C2.

Next, the manufacture method for a liquid crystal display apparatus will be described. For this manufacture method, a method of manufacturing an active matrix type liquid crystal display apparatus of a general type is used.

A method of manufacturing the pixel area B and peripheral circuit area C on the first transparent substrate side will be described by using top-gate type TFTs as semiconductor active elements.

Figure 16:
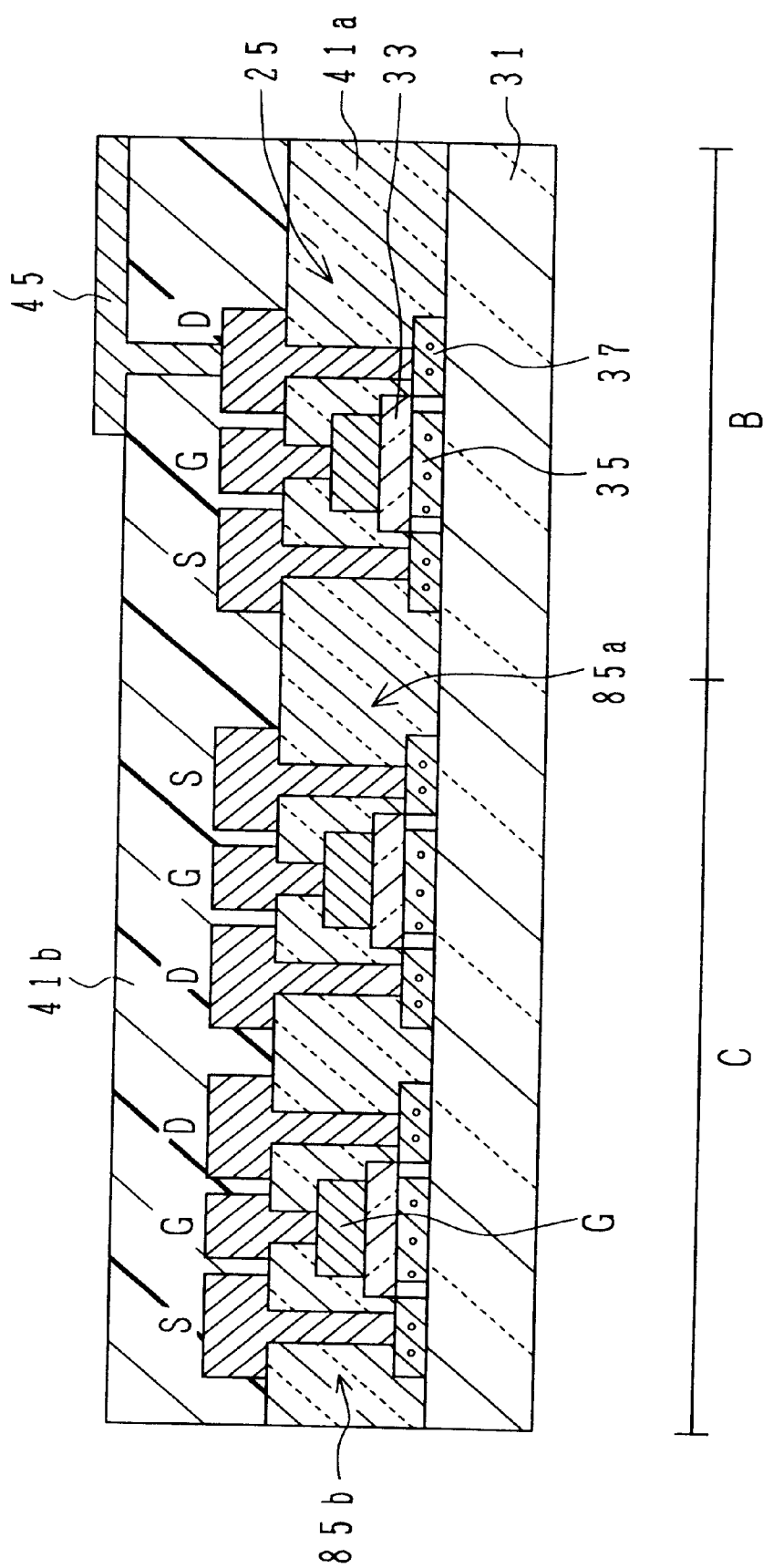
FIG. 16 is a cross sectional view of a pixel area and a peripheral circuit area of the liquid crystal display apparatus of the first embodiment, taken along line IVa–IVb shown in FIG. 1.

FIG. 16 is a cross sectional view of a liquid crystal display apparatus which uses the top-gate type TFTs having the same structure as that shown in FIG. 3B both for pixel TFTs and peripheral circuit TFTs.

In FIG. 16, the structure on the first transparent substrate 31 side is shown.

On the first transparent substrate 31, a polysilicon film 35, a gate insulating film of $SiO_2$ and a gate electrode G are sequentially formed. The polysilicon film on both sides of the gate electrode is doped with n- or p-type impurity ions to form high impurity concentration regions 37 and 37 as source and drain regions.

On the first transparent substrate, a first interlayer insulating film 41a is formed. Contact holes to the source, drain and gate electrode are formed through the first interlayer insulating film 41a. Source S, gate G and drain D electrode leads made of Ti/Al/Ti are formed on the first interlayer insulating film 41a, filling the contact holes.

A second interlayer insulating film 41b is formed on the first interlayer insulating film 41a.

A contact hole is formed through the second interlayer insulating film 41b over the drain electrode D of the pixel TFT 25.

A pixel electrode 45 made of ITO is formed on the second interlayer insulating film 41b, filling the contact hole. The pixel electrode 45 is connected to the drain electrode D of the pixel TFT 25 in the pixel area B.

The peripheral circuit TFT in the peripheral circuit area C includes n- and p-type TFTs 85a and 85b. Since high impurity concentration regions 37 and 37 are formed through ion implantation, both n- and p-type TFTs 85a and 85b can be formed on the same substrate. Since a complementary circuit (CMOS circuit) can be formed, high speed operation and low power consumption of circuits in the peripheral circuit area C are possible.

The detailed manufacture method for a liquid crystal display apparatus will be described in the following.

(1) On the first transparent substrate 31, an amorphous silicon film is deposited by CVD to a thickness of 1000 angstroms.

(2) The amorphous silicon film is crystallized by using excimer laser. With this crystallizing process, the amorphous silicon film is changed to a polysilicon film 35.

(3) The polysilicon film 35 is etched to form island TFT channel layers by normal photolithography and etching processes.

(4) A gate insulating film 33 is formed by PECVD (plasma-enhanced chemical vapor deposition). The gate insulating film 33 is worked to have a predetermined shape. Sputtering may be used instead of PECVD. Gate electrodes are formed on the gate insulating films.

(5) Polysilicon regions 37 are formed in the channel layer on both sides of a TFT gate electrode, the polysilicon regions 37 being doped with impurity ions to have an impurity concentration higher than that of the channel layer in order to lower the contact resistance of source and drain electrodes. In the peripheral circuit area C, different ions are implanted for n- and p-type TFTs 85a and 85b.

(6) A first interlayer insulating film 41 a is formed over the first transparent substrate 31. Contact holes are formed through the first interlayer insulating film 41 a for the gate, source and drain contacts.

(7) Source S, gate G and drain D electrode leads of Ti/Al/Ti are formed on the first interlayer insulating film 41a, filling the contact holes.

(8) An interlayer insulating film 41b of an oxide film is deposited over the whole surface of the first transparent substrate 31. Instead of the oxide film, a nitride film or a polyimide film may be used. A contact hole is formed through the interlayer insulating film 41b, and a pixel electrode 45 of ITO (indium-tin oxide) is formed filling the contact hole.

With the above processes, top-gate type TFTs are completed.

With reference to FIGS. 4 and 8, a method of manufacturing the pixel structure on the second transparent substrate 51 with color filters and the common electrode will be described.

(1) On the second transparent substrate 51, black matrixes (BM) 1, 1, 1, . . . are formed by forming a Cr film having a thickness of 2000 angstroms and etching it by using a mask having a predetermined pattern. The black matrixes (BM) function as shading films covering the pixel TFTs 25 in the pixel area B and the first peripheral circuit C1 in the peripheral circuit area C.

(2) Red color resist is coated on the second transparent substrate 51 and black matrixes 1 to a thickness of 1.5 $\mu$m to form red color filers 61 in the pixel area B through a normal photolithography process including drying, exposure and development processes.

(3) Green and blue color filters 63 and 65 are formed by the process similar to the process (2). The color filters 61, 63 and 65 partially overlap the black matrixes (BM) 1, 1, 1, . . . at their end portions.

(4) Black resin is coated on the inner surface of the second transparent substrate 51, covering the second peripheral circuit C1 in the peripheral circuit area C, to form an insulating black shading film 201 by a predetermined patterning process.

(5) A planarizing resin film 73a is formed to protect the color filters 61, 63 and 65 and the insulating black shading film 201 and planarize the uneven surfaces of the color filters and insulating black shading film 201.

(6) An ITO film having a thickness of 1000 angstroms is formed by sputtering to form a common electrode 71 by a predetermined patterning process.

(7) An orientation film 75a of polyimide or the like is formed covering the common electrode 71.

With the above processes, the structure on the second transparent substrate 51 side is completed.

In place of the process (4), an insulating black shading film or a conductive shading film may be formed on the outer surface of the second transparent substrate 51 to cover the second peripheral circuit. Alternatively, an insulating black shading film may be formed on the first transparent substrate side to cover the second peripheral circuit.

The first and second transparent substrates 31 and 51 manufactured by the above methods are mounted to form the liquid crystal display apparatus. This method will be described next.

(1) The orientation films 75a and 75b formed on the first and second transparent substrates 31 and 51 are heated and hardened when necessary.

(2) A rubbing process is performed to rub the orientation films 75a and 75b in a predetermined direction with a buff cloth to form the orientation structure in the orientation films 75a and 75b.

(3) Spherical spacers of polymer, glass, silica or the like are sprayed on the first transparent substrate 31. The spherical spacers maintain a predetermined distance between the substrates 31 and 51.

(4) Sealing resin is coated with a dispenser in an area outside of the peripheral circuit area C of the first transparent substrate. The first and second transparent substrates 31 and 51 are stacked upon each other and the sealing resin is hardened through heat and pressure. The first and second transparent substrates 31 and 51 are therefore adhered together by the sealing resin.

(5) Liquid crystal material E is injected into the liquid crystal storing space 81 via an unrepresented liquid crystal inlet, and thereafter, the inlet is sealed.

The insulating black resin film 201 formed over the signal line driver circuit C2 shields light incident upon the signal line drive circuit C2 from the second transparent substrate 51 side. It is therefore possible to lower a probability of malfunction of the semiconductor active elements or peripheral circuit TFTs 85 of the signal line driver circuit C2, the malfunction otherwise to be caused by incidence light. Therefore, the signal line driver circuit C2 operates stably independently from whether there is incidence light and the liquid crystal display apparatus can operate stably.

A specific dielectric constant ($\in$) of liquid crystal is about 5 to 11. The gap between the first and second transparent substrates is about 4 to 5 micron. Therefore, if the signal line driver circuit C2 is operated at 4.88 MHz, a lowered circuit operation speed to be caused by parasitic capacitance of the peripheral circuit TFTs 85 may arise.

If a black matrix (BM) made of metal is used as the shading film of the signal line driver circuit to be operated at high speed, parasitic capacitance between TFT and BM hinders a high speed operation of the signal line driver circuit C2. By using the insulating material shading film, an increase in parasitic capacitance and a lowered operation speed can be prevented.

In the liquid crystal display apparatus of this embodiment, the insulating black shading film may be formed to have a thickness of one micron or thinner.

The peripheral circuit area, particularly the signal line driver circuit, may be light shielded by a bevel formed on an outer periphery of the liquid crystal display apparatus on the outer side of the second transparent substrate 51 (on the far side from the first transparent substrate 31). However, the light shielding structure using a broad bevel may hinder the manufacture of a large display screen of the liquid crystal display apparatus (the manufacture of a narrow bevel of the liquid crystal display apparatus).

Carbon black resin may be used as the material of the shading film for shielding light from the signal line driver circuit (second peripheral circuit).

Some carbon resin is semi-insulating having an electric conductivity of $10^6$ $\Omega$m or smaller. If such semi-insulating carbon resin is used, parasitic capacitance of the shading film becomes larger than if an insulating material shading film is used. The shading film made of semi-insulating carbon resin has, however, a better shading performance than the insulating material shading film. If the shading performance has a priority over the parasitic capacitance, the shading film made of semi-insulating carbon resin may be used effectively.

Figure 9:
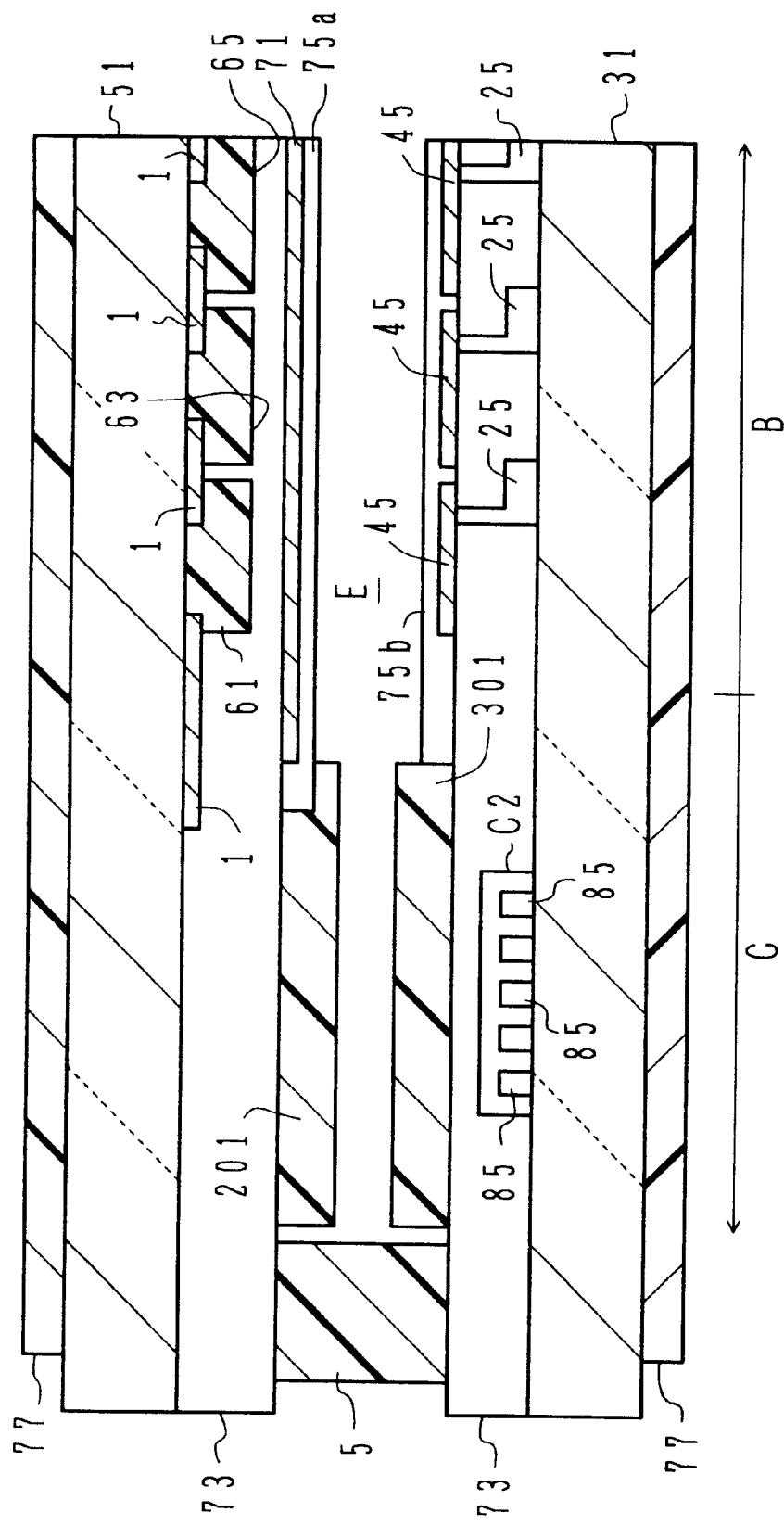
FIG. 9 is a cross sectional view of the liquid crystal display apparatus of the first embodiment, showing the signal line driver circuit side and taken along line VIIIa–VIIIb shown in FIG. 1.

FIG. 9 is a cross sectional view of a liquid crystal display apparatus according to a modification of the first embodiment of the invention.

In the liquid crystal display apparatus shown in FIG. 9, an insulating black resin film 201 is formed on the side of a second transparent substrate 51, and another insulating black resin film 301 is formed on the side of a first transparent substrate 31, respectively to shield light from the second peripheral circuit C2.

The shading film 301 formed on the side of the first transparent substrate also shields light from the signal line driver circuit C2.

The insulating shading films 201 and 301 of the liquid crystal display apparatus shown in FIG. 9 therefore provide a double shading structure over the signal line driver circuit C2. Therefore, the shading performance for the signal line driver circuit C2 is improved and the operation of the peripheral circuit, particularly the signal line driver circuit, can be made more stable than the liquid crystal display apparatus of the first embodiment.

Figure 10:
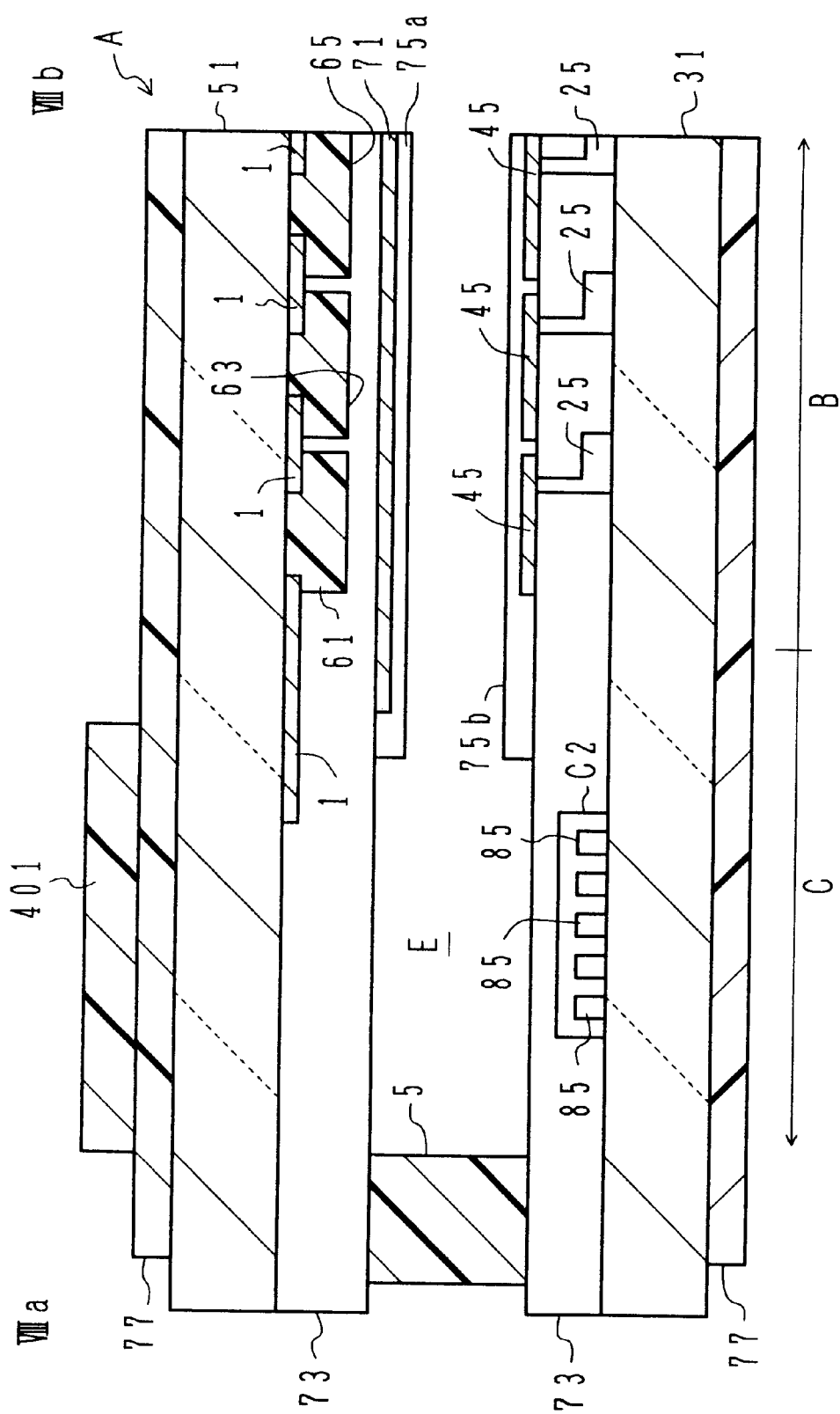
FIG. 10 is a cross sectional view of the liquid crystal display apparatus, showing the signal line driver circuit side and taken along line VIIIa–VIIIb shown in FIG. 1, according to a second embodiment of the invention.

FIG. 10 is a cross sectional view of a liquid crystal display apparatus according to the second embodiment of the invention. In the second embodiment, like components to those of the liquid crystal display apparatus of the first embodiment are represented by identical reference numerals and the description thereof is omitted.

FIG. 10 is a cross sectional view of the liquid crystal display apparatus, showing the structure of the peripheral circuit including the signal line driver circuit (second peripheral circuit) C2. FIG. 10 corresponds to FIG. 8 showing the liquid crystal display apparatus of the first embodiment.

In the liquid, crystal display apparatus shown in FIG. 10, a shading film 401 covering the signal line driver circuit C2 is formed on the outer surface of the second transparent substrate 51 (on the far side from the first transparent substrate 31), i.e., at the outside of the liquid crystal display apparatus. Also in this liquid crystal display apparatus, the shading film 401 shields light incident upon the signal line driver circuit C2 from the second transparent substrate 51.

The second transparent substrate 51 which is a thick insulating member is interposed between the signal line driver circuit C2 and shading film 401. Therefore, in place of insulating black resin used by the first embodiment, semi-insulating carbon black resin can be used and a conducting shading film can be used. The degree of freedom of shading film material selection increases. Furthermore, if semi-insulating carbon black resin or a conducting shading film is used, the shading performance is improved more than an insulating shading film.

Since the outer-panel shading film 401 is formed on the upper surface of the second transparent substrate 51, the shading film forming process becomes easier than it is formed in a narrow gap between the first and second transparent substrates 31 and 51. In the shading film forming process, the outer-panel shading film 401 may be formed on the upper surface of the second transparent film before the panel assembly process, or alternatively, after the panel assembly process, the outer-panel shading film 401 may be formed.

The degree of freedom of an assembly process increases therefore more than the first embodiment.

The material of the outer-panel shading film 401 may be resin black ink in addition to a black resin film. If the shading film is formed on the second transparent substrate 51 by using resin black ink, the shading film may be drawn on the second transparent substrate 51 with a black oil felt pen.

Drawing with the black felt pen facilitates to form a shading film in a desired area of the second transparent substrate 51. The shading film can be formed by coating resin black ink easier than the liquid crystal display apparatus of the first or second embodiment. The shading film may be formed by using a light shielding adhesive tape, a light shielding black film or the like.

The black shading film may be formed by using printing technology such as ink jetting. Use of printing technology is excellent in the mass production and cost effectiveness of shading films.

With the above-described methods, since the thickness of the second transparent substrate is about 0.7 μm and the gap between the first and second transparent substrates 31 and 51 is about 5 μm, there is a possibility of stray light to be generated by oblique incidence.

Figure 11:
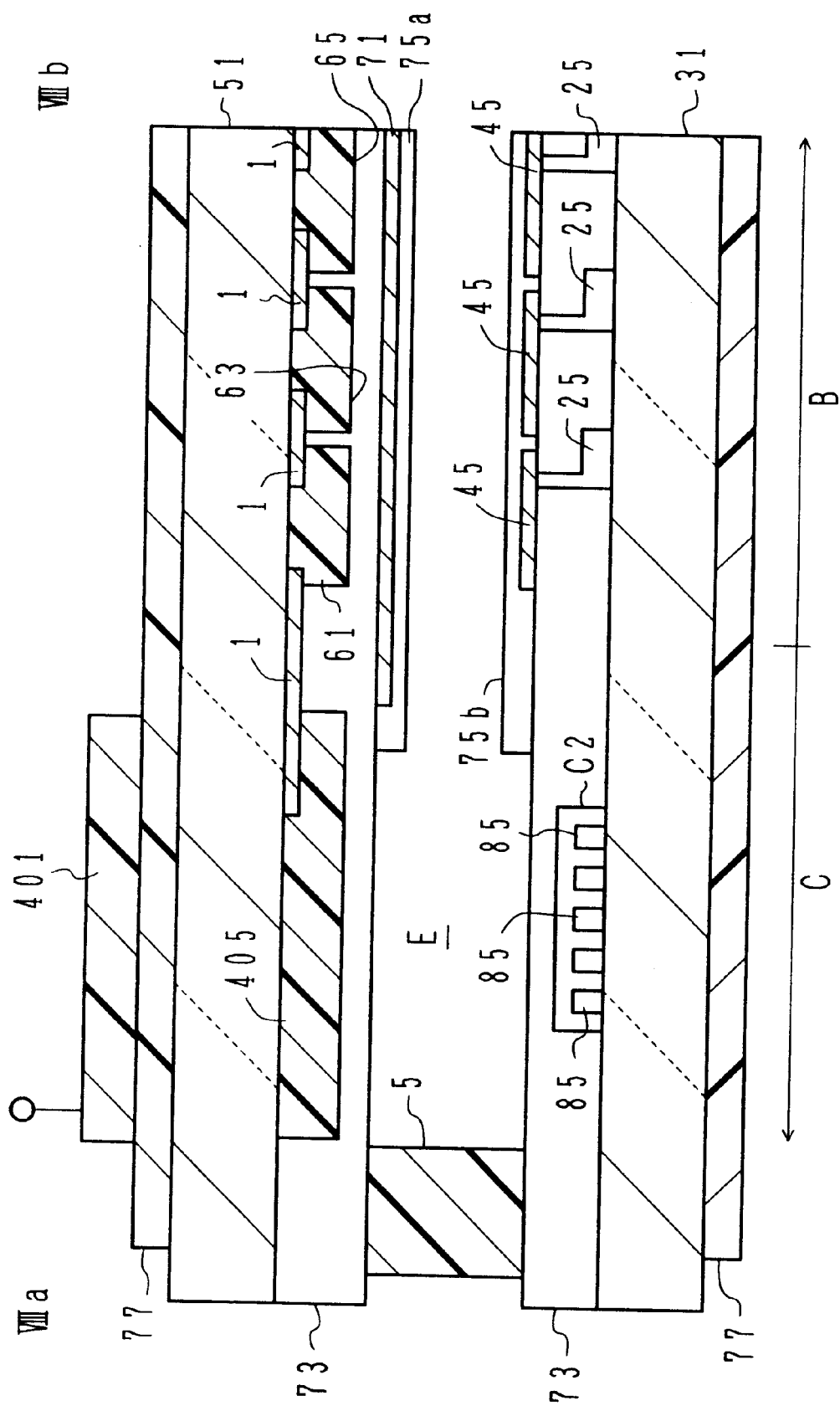
FIG. 11 is a cross sectional view of the liquid crystal display apparatus, showing the signal line driver circuit side, according to a first modification of the second embodiment.

FIG. 11 is a cross sectional view of a liquid crystal display apparatus according to a first modification of the second embodiment.

In the liquid crystal display apparatus shown in FIG. 11, as the shading film covering the signal line driver circuit C2, not only an outer-panel shading film 401 is formed on the upper surface of the first transparent substrate 51, but also an insulating inner-panel shading film 405 is formed on the lower surface of the first transparent substrate 51 in the area corresponding to the outer-panel shading film 401. The inner-panel shading film 405 also covers the signal line driver circuit C2.

Since two shading films are formed over the signal line driver circuit C2, he shading performance is improved and a possibility of stray light to be generated by oblique incidence lowers.

Figure 12:
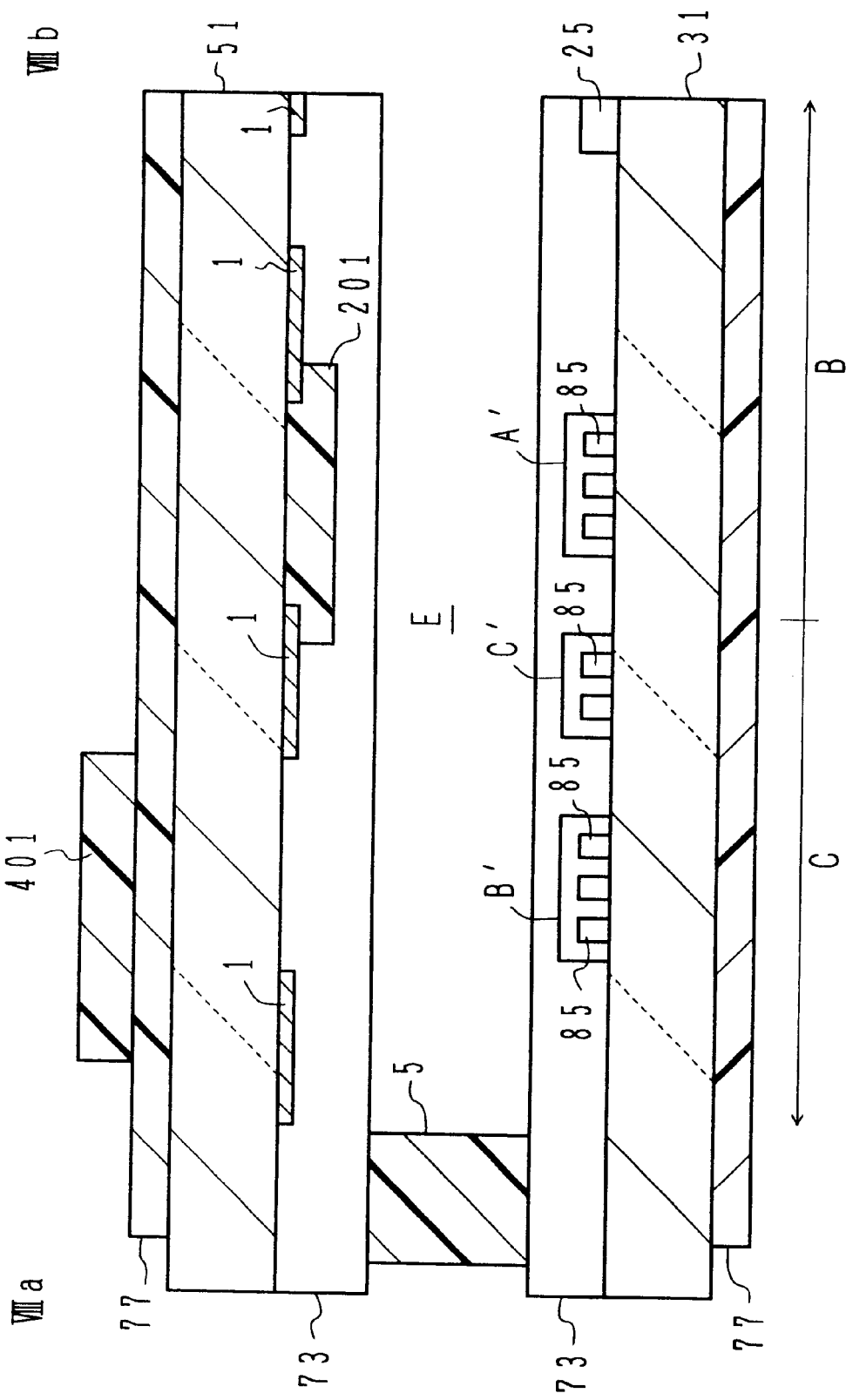
FIG. 12 is a cross sectional view of the liquid crystal display apparatus, showing the signal line driver circuit side and taken along line VIIIa—VIIIa shown in FIG. 1, according to a second modification of the second embodiment.

FIG. 12 shows a liquid crystal display apparatus according to a second modification of the second embodiment.

In the liquid crystal display apparatus shown in FIG. 12, an outer-panel shading film 401 and an insulating inner-panel shading film 201 are disposed at different areas as viewed vertically. For example, the outer-panel shading film 401 covers the shift register circuit (control circuit B') of the signal line driver circuit C2, and the inner-panel shading film 201 made of insulating black resin covers the control circuit A' (analog switches). A conducting shading film (BM) 1 is formed over the control circuit C' (output buffers). The shading structure and control circuit may be combined as desired, not being limited to that described above.

In the above manner, a shading film having a different structure is formed in a different area for each circuit portion of the signal line driver circuit, in accordance with the shading performance and a circuit operating rate.

With the structure of this second modification, a degree of freedom of design can be increased, and the positional relation between the shading film and signal line driver circuit can be designed finely to optimize the high speed operation and shading performance of the peripheral circuit.

Figure 13:
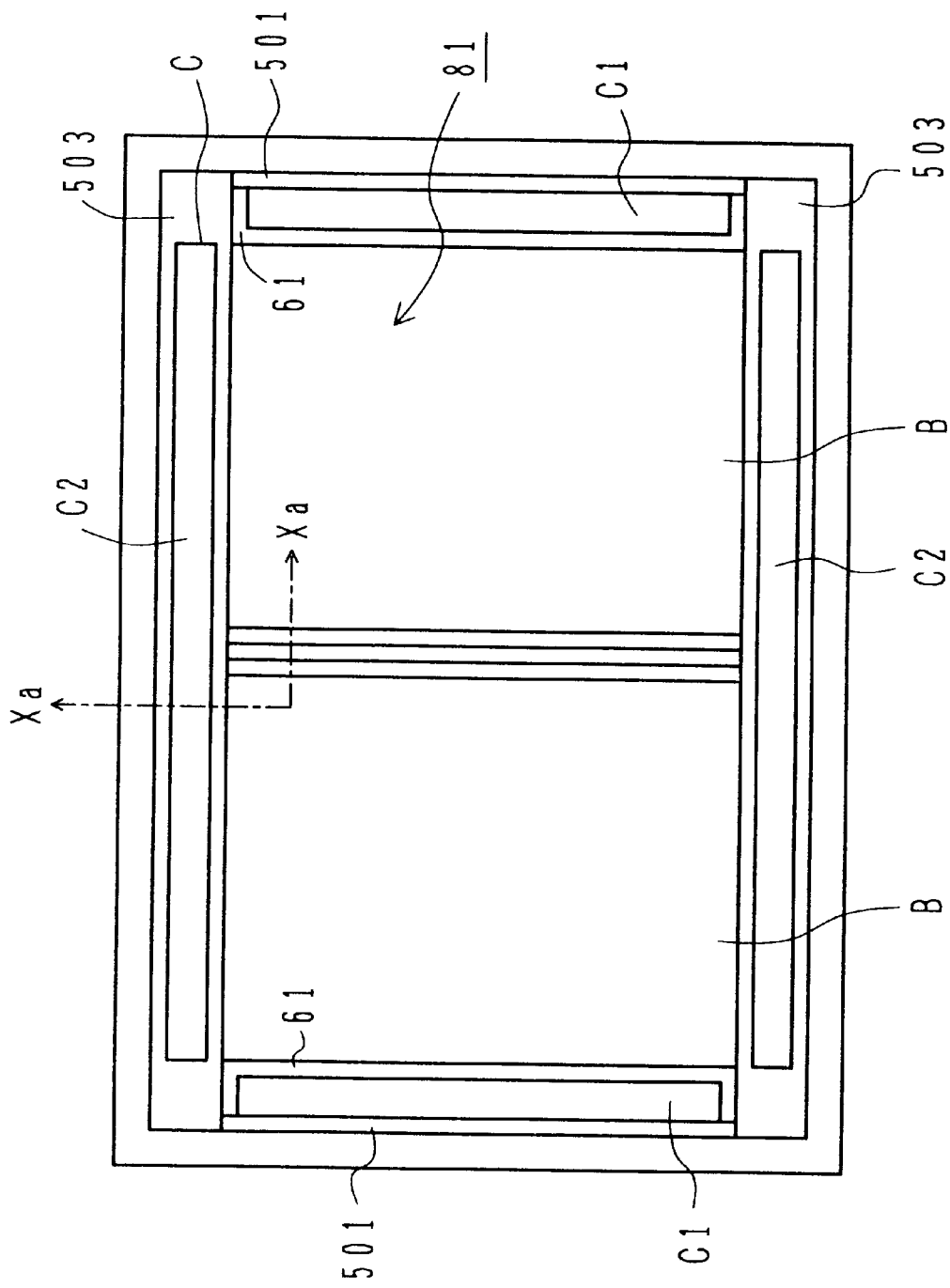
FIG. 13 is a plan view of a liquid crystal display apparatus according to a third embodiment of the invention.
Figure 14:
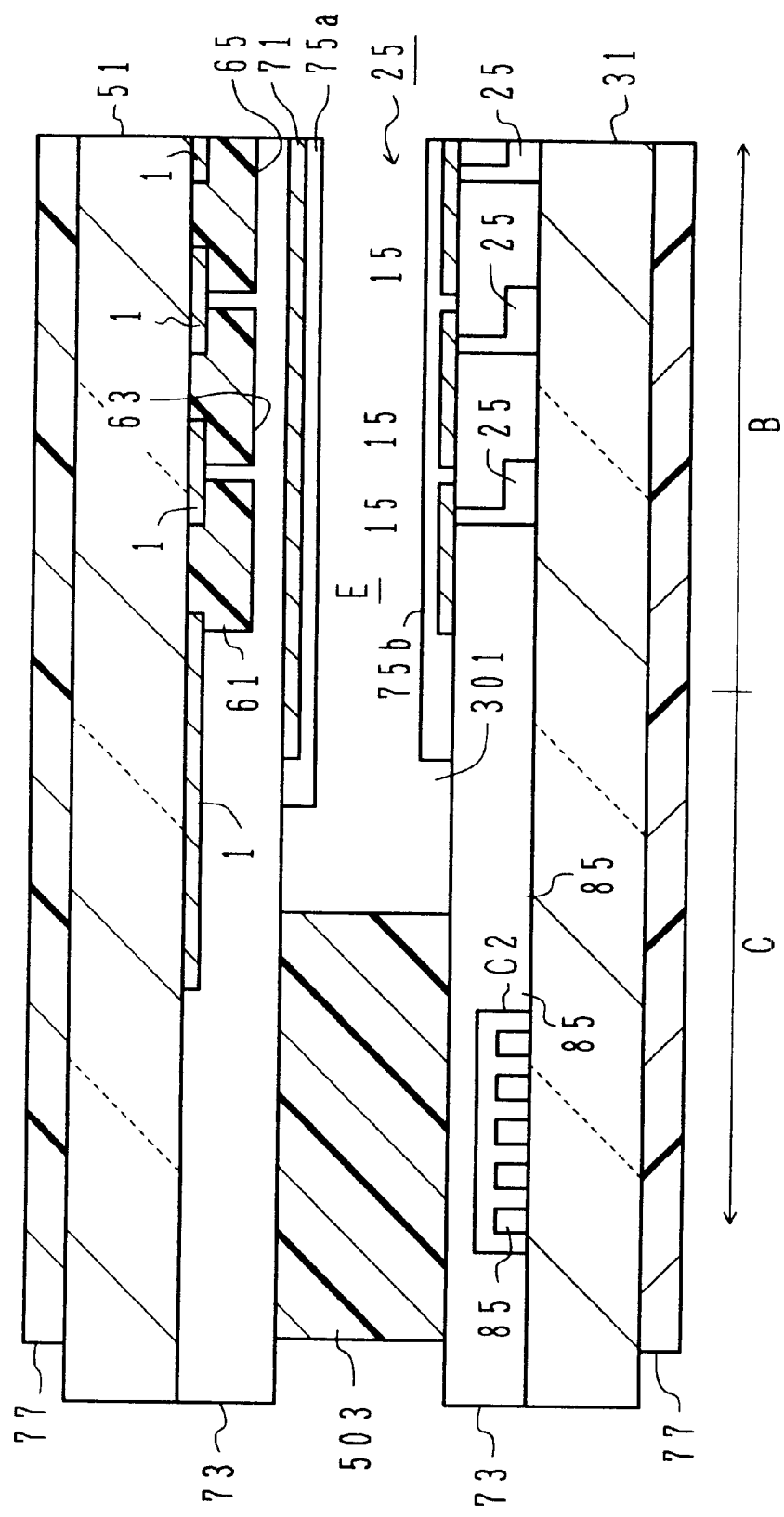
FIG. 14 is a cross sectional view of the liquid crystal display apparatus of the third embodiment, showing the signal line driver circuit side and taken along line VIIIa–VIIIb shown in FIG. 1.

FIGS. 13 and 14 show a liquid crystal display apparatus according to the third embodiment of the invention.

In the third embodiment, like components to those of the liquid crystal display apparatus of the first and second embodiments are represented by identical reference numerals, and the description thereof is omitted.

FIG. 13 is a plan view showing the overall structure of the liquid crystal display apparatus. This plan view corresponds to FIG. 1 showing the liquid crystal display apparatus of the first embodiment.

As shown in FIG. 13, the liquid crystal display apparatus includes a pixel area B and a peripheral circuit area C. The peripheral circuit area C includes a scan line driver circuit (first peripheral circuit) C1 and a signal line driver circuit (second peripheral circuit) C2.

Black matrix (BM) shading films 1 made of Cr are formed over the scan line driver circuit C1. A shading film 503 made of insulating black resin is formed over the signal line driver circuit C2.

FIG. 14 is a cross sectional view taken along line Xa—Xa shown in FIG. 13 and corresponds to FIG. 8 showing the liquid crystal display apparatus of the first embodiment.

As shown in FIG. 14, in the liquid crystal display apparatus of the third embodiment, the structure of a seal member 501 for shielding the liquid crystal storing space 81 which stores liquid crystal material E is different from that of the first embodiment.

In the liquid crystal display apparatus of the third embodiment, the seal member 501 is formed outside of the scan line driver circuits C1 disposed on the shorter sides of a rectangular pixel area B, similar to the liquid crystal display apparatus of the first embodiment. The seal member 503 on the longer sides of the rectangular pixel area B disposed at the signal line driver circuits C2 covers the signal line driver circuit C2. The seal members 501 and 503 surround the outer periphery of the peripheral circuit area C in a loop shape.

In the seal member forming process, a usual resin seal member 501 is formed outside of the scan line driver circuits C1. Next, a shading black resin seal member 503 is formed covering the signal line driver circuit C2.

In the liquid crystal display apparatus of this embodiment, the seal members 501 and 503 seal the liquid crystal material E filled in the liquid crystal storing space 81. The seal members 503 made of insulating black resin cover the signal line driver circuits C2 and shield light from the signal line driver circuits C2. The seal members 503 made of insulating black resin seal the liquid crystal material E and shield light from peripheral circuit polycrystalline TFTs 85 of the signal line driver circuits C2 to thereby suppress leakage current of TFTs to be caused by light.

In the liquid crystal display apparatus of this embodiment, the shading film 503 between the first and second transparent substrates 31 and 51 is made of resin which has a specific dielectric constant ∈ of about 3 smaller than that (about 5 to 11) of the liquid crystal material E. Therefore, as compared to the liquid crystal material disposed between the first and second transparent substrates above the signal line driver circuit C2, parasitic capacitance of the signal lines driver circuit C2 can be lowered.

Since the same structure for the seal member and shading film is used, the space efficiency improves so that the bevel of the liquid crystal display apparatus can be made more narrower.

The seal member disposed outside of the scan line driver circuit and the seal member covering the signal line driver circuit may be formed integrally by using shading seal material. In this case, the seal member manufacture process can be simplified.

Figure 15:
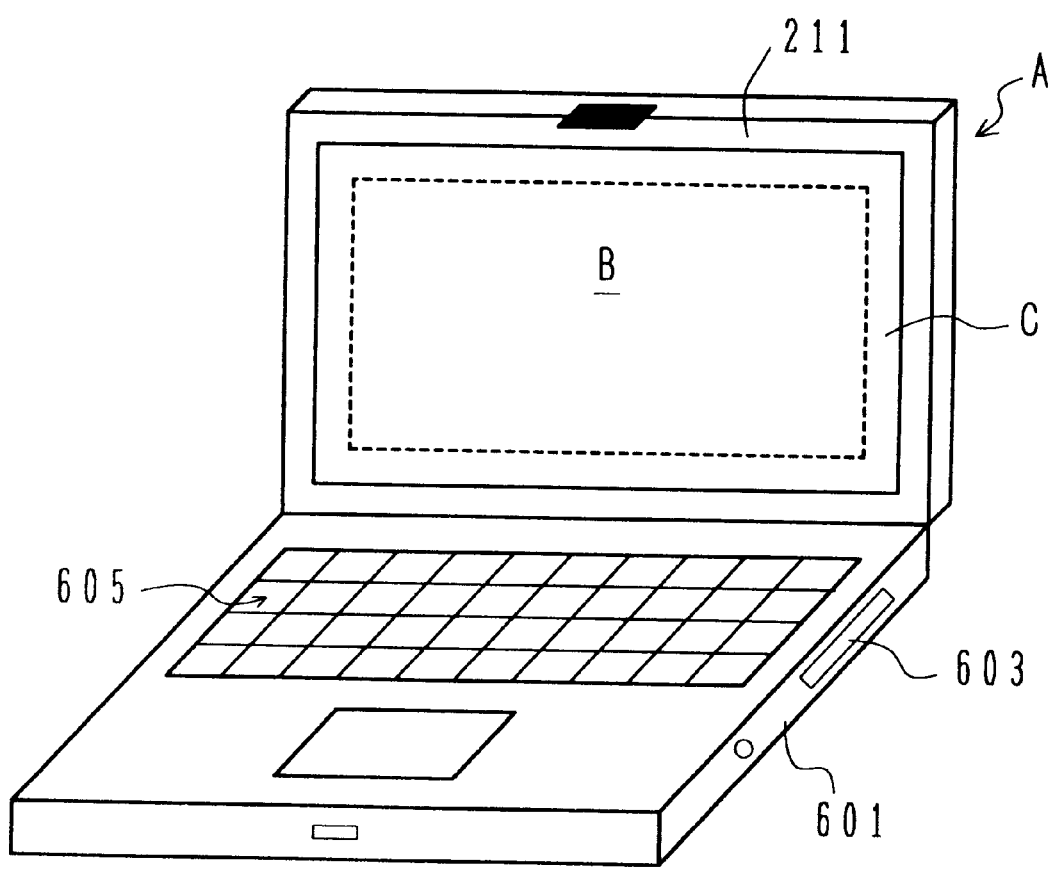
FIG. 15 is a perspective view of an electronic instrument using the liquid crystal display apparatus of one of the first to third embodiments, according to a fourth embodiment of the invention.

FIG. 15 shows a portable electronic instrument according to the fourth embodiment of the invention. This portable electronic instrument (personal computer) uses the liquid crystal display apparatus of one of the first to third embodiments.

The personal computer shown in FIG. 15 uses a liquid crystal display apparatus A including a pixel area B and a peripheral circuit area C.

The other structures of the personal computer are the same as those of a general personal computer. In a housing 601 which is made in unison with the liquid crystal display apparatus A when the latter is folded down, a central processing unit (CPU), a memory circuit and the like (not shown) are housed. An inlet 603 for an external storage device is formed in the side wall of the housing 601, and an input means (keyboard) 605 is mounted on the upper surface of the housing 601.

In the personal computer using the liquid crystal display apparatus of this embodiment, the peripheral circuit area C is integrally formed on a first transparent substrate. As compared to a liquid crystal display apparatus having an external peripheral circuit area C, the bevel of the liquid crystal display apparatus can be made narrow. If the overall size is the same, the pixel area B can be made large. Since polycrystalline TFTs are used as semiconductor active elements of the signal line driver circuit, a high speed performance of the personal computer can be retained. Since the peripheral circuit area, particularly the second peripheral circuit, is covered with an insulating shading film, it is possible to prevent malfunction of polycrystalline TFTs to be caused by incidence light.

The structures of the embodiments described above are not intended to be limited only thereto. For example, the outer-cell shading film may be formed directly on the second transparent substrate, or indirectly on a polarizing plate formed on the second transparent substrate. BM may be made of metal of a single layer or a multi-layer. All the shading films for the peripheral circuit area may use an insulating shading film.

Although the glass substrate is used as the first and second transparent substrates, a quartz or organic film may also be used. The first substrate is not necessary to be transparent if a reflection type liquid crystal display apparatus is to be manufactured. A ceramic substrate, a silicon substrate covered with an insulating film, or the like may be used.

In the case of a reflection type display panel, the ITO electrode on the first transparent substrate may be substituted by other metal material such as Al.

If a black and white display panel is to be manufactured, color filters in the pixel area are not necessary.

A planarizing film of the substrate may be a silicon nitride film or a silicon oxide film. A planarizing film may not be provided on the second transparent substrate side.

Next, with reference to FIGS. 17 to 23, a reflection type liquid crystal display apparatus and a display panel using this apparatus according to the fifth embodiment of the invention will be described.

Figure 17:
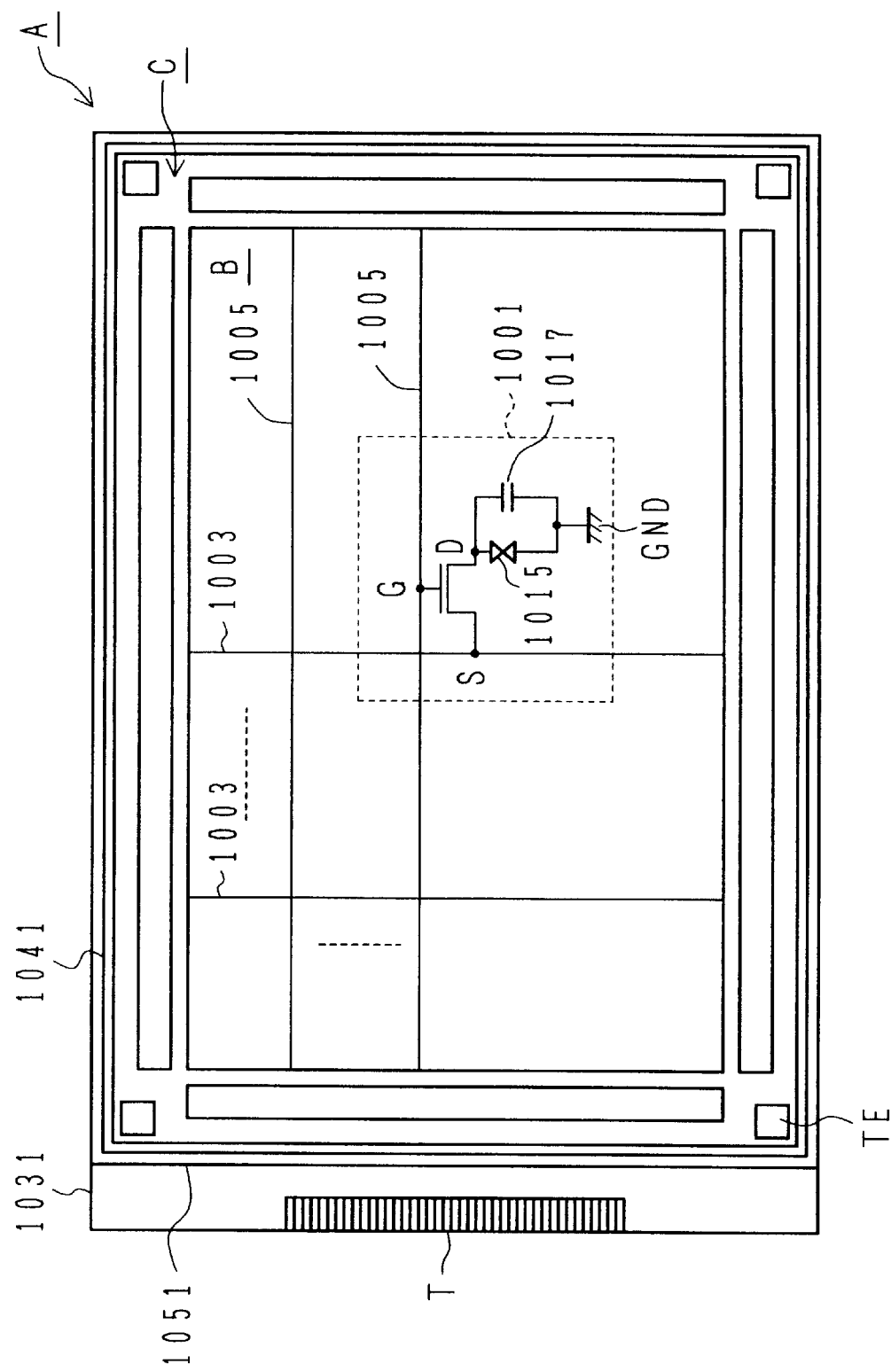
FIG. 17 is a plan view of a reflection type liquid crystal display apparatus according to a fifth embodiment of the invention.
Figure 18:
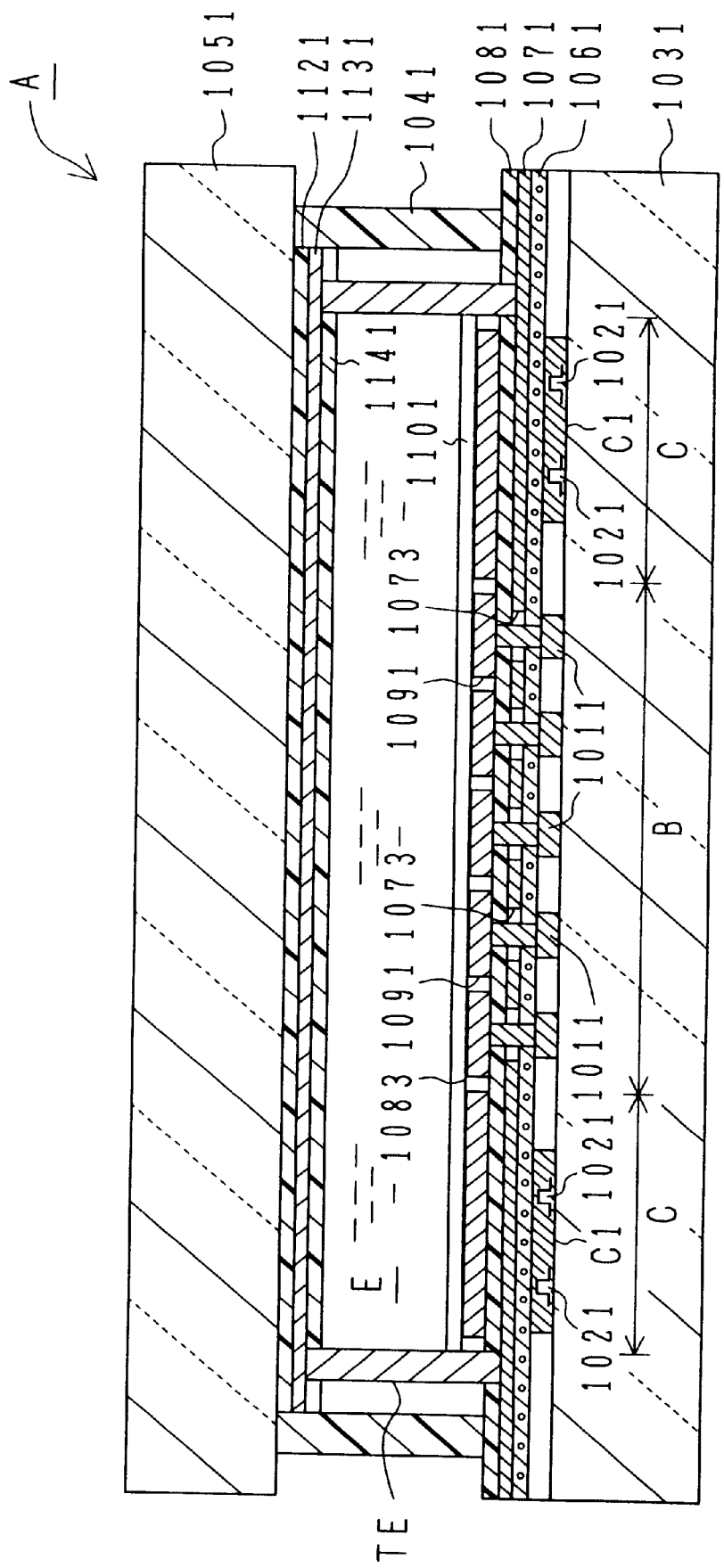
FIG. 18 is a cross sectional view of the reflection type liquid crystal display apparatus of the fifth embodiment.

FIG. 17 shows an example of a plan layout of a reflection type liquid crystal display apparatus A monolithically integrating a pixel area for displaying an image and a peripheral circuit area for controlling the pixel area on the same substrate. FIG. 18 shows a cross sectional structure of the reflection type liquid crystal display apparatus A.

The liquid crystal display apparatus shown in FIGS. 17 and 18 includes a pixel area B of generally a rectangular shape for displaying an image and a peripheral circuit area C disposed around the pixel area B for driving the pixel area.

In the pixel area B, a plurality of pixels 1001 is disposed in a matrix pattern.

In the pixel area B, a plurality of signal lines 1003, 1003, 1003, . . . are disposed in a column direction and a plurality of scan lines 1005, 1005, 1005, . . . are disposed in a row direction.

Each pixel 1001 includes a pixel thin film transistor TFT 1011 having a source, drain and gate, a liquid crystal cell 1015, and a storage capacitor 1017. The source S of the pixel TFT 1011 is connected to the signal line 1003, and the gate G thereof is connected to the scan line 1005. The liquid crystal cell 1015 and storage capacitor 1017 are connected in parallel between the drain D of the pixel TFT 1001 and the ground terminal GND.

As shown in FIG. 18, between transparent first and second glass substrates 1031 and 1051 (hereinafter called "first glass substrate" and "second glass substrate"), liquid crystal material E is filled in. The liquid crystal material is sealed by a seal member 1041 made of resin and interposed between the substrates 1031 and 1051. Instead of a transparent glass substrate, an opaque substrate such as an Si substrate may be used as the first glass substrate 1031.

A common electrode generally fixed to the ground potential is formed on the second glass substrate 1051.

Pixel TFTs 1011, 1011, 1011, . . . , preferably polysilicon TFTS, are formed in island shapes on the first glass substrate 1031 in the pixel area B. The peripheral circuit area C is defined around the pixel area B. In the peripheral circuit area C, polysilicon TFTs 1021, 1021, 1021 are used as semiconductor active elements capable of a high speed operation.

An interlayer insulating film 1061 is formed over the first glass substrate 1031, covering TFTs 1011 and 1021.

A second common electrode 1071 applied with a fixed potential is formed on the interlayer insulating film 1061 over the whole pixel area B. The second contact electrode 1071 is formed with openings 1073 corresponding to contact holes to be later described. A planarizing insulating film 1081 is formed on the second common electrode 1071.

Contact holes 1083 are formed through the interlayer insulating film 1061 and planarizing insulating film 1081 at positions corresponding to the openings 1073. Reflection electrodes 1091 for pixels 1001 are formed on the planarizing insulating film 1081, filling the contact holes 1083. The reflection electrode 1091 is connected to the drain D of the pixel TFT 1011 in the contact hole 1083. An orientation film 1101 is formed on the reflection electrodes 1091.

On the second substrate 1051 as an opposing substrate to the first substrate 1031, color filters 1121, the first common electrode 1131 generally fixed to the ground potential, and an orientation film 1141 are sequentially deposited.

A transfer electrode TE is connected between the fixed potential electrode 1071 and first common electrode 1131.

Figure 19A:
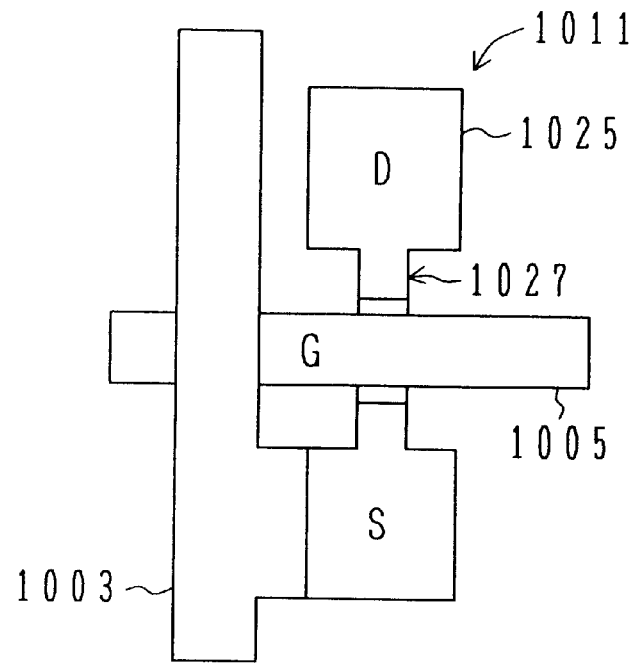
FIGS. 19A and 19B are plan view showing a TFT, a signal line and a scan line of the reflection type liquid crystal display apparatus of the fifth embodiment.
Figure 19B:
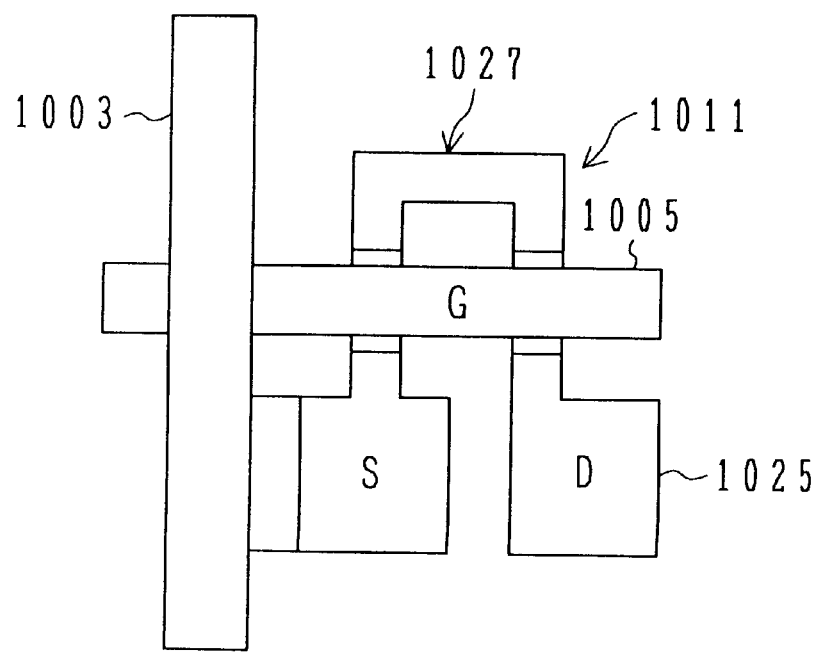

FIGS. 19A and 19B are plan views of the pixel TFT 1011.

FIG. 19A shows a single gate type TFT. The single gate type TFT 1011 uses a polysilicon layer as a semiconductor layer. The polysilicon layer is formed by first forming an amorphous silicon layer and then crystallizing the amorphous silicon layer by a laser annealing method using excimer layer or the like. The polysilicon layer is patterned to form an island polysilicon layer.

In the single gate type pixel TFT 1011, the gate electrode G traverses once the polysilicon layer 1027 via a gate insulating film, and defines the channel layer under the gate electrode. A source region S and a drain region D are formed in areas at opposite ends of the polysilicon layer 1027.

The gate electrode G is made of Al—Nd and used in common with a scan line 1005.

The source electrode S on the source region and a signal line 1003 are made of Ti/Al/Ti and electrically connected.

FIG. 19B shows a double-gate type pixel TFT 1011.

The double-gate type TFT 1011 has a channel layer 1027 of an inverted U-character shape between the source and drain. The channel layer 1027 crosses the gate electrode twice in order to improve the controllability of current flowing through the source and drain. Leakage current to be generated by light can be lowered in a polysilicon TFT which is susceptible to the influence of incidence light.

In this embodiment, a liquid crystal display apparatus using a double-gate type TFT as the pixel TFT 1011 will be described. A single gate type TFT may also be used.

Figure 20:
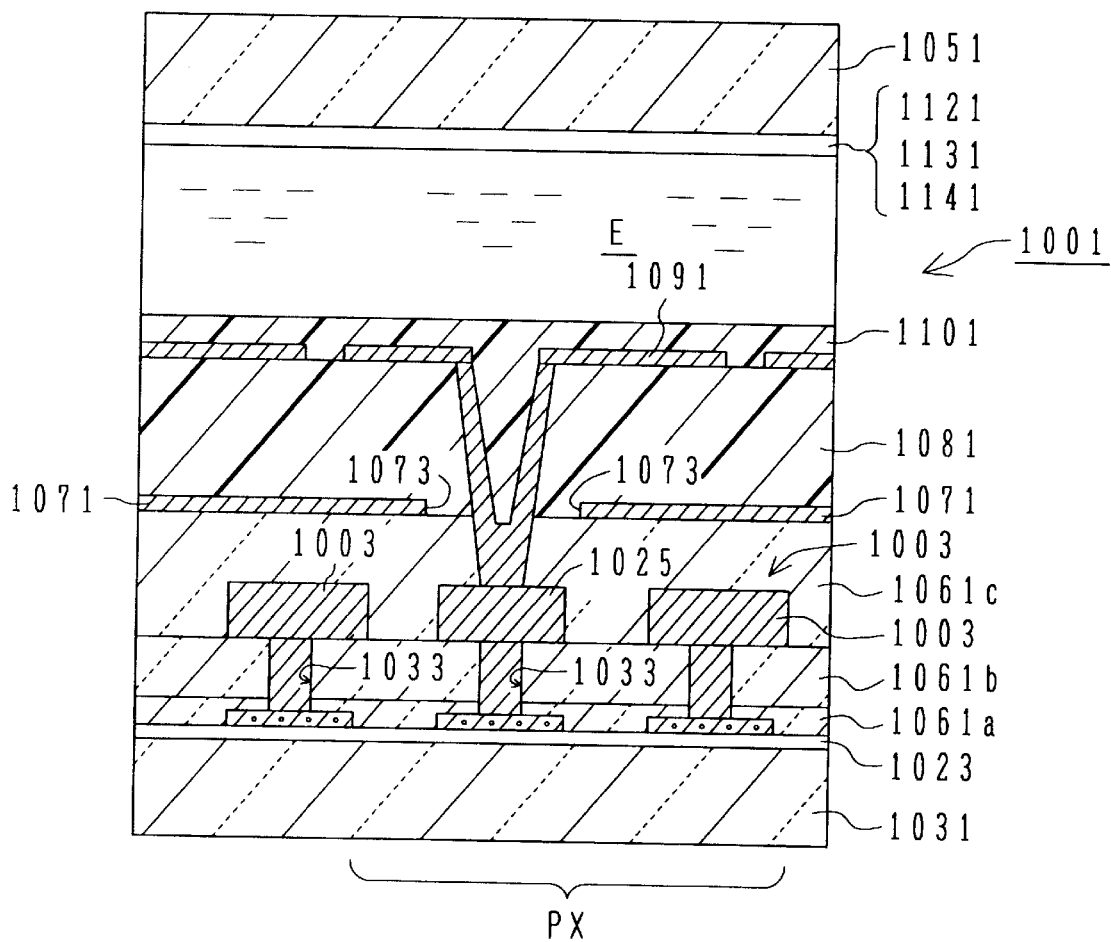
FIG. 20 is a cross sectional view of the reflection type liquid crystal display apparatus of the fifth embodiment, showing a pixel in the pixel area.
Figure 21:
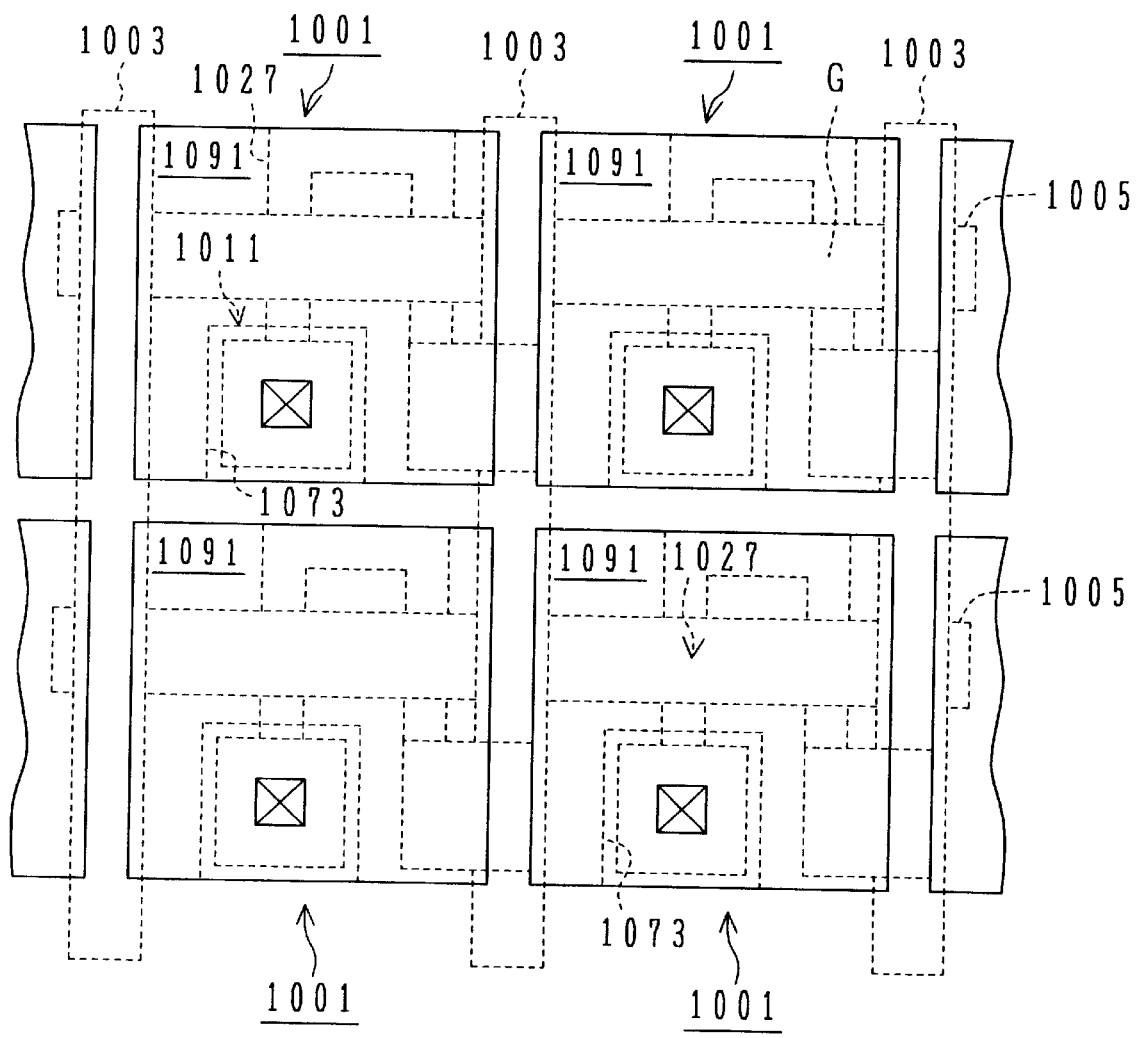
FIG. 21 is a plan view of the reflection type liquid crystal display apparatus of the fifth embodiment, showing reflection electrodes, TFTs, signal lines and scan lines.

The detailed cross sectional view and plan view of the reflection type liquid crystal display apparatus using polysilicon TFTs 1011 of this embodiment are shown in FIGS. 20 and 21.

FIG. 20 is a plan view of the reflection type liquid crystal display apparatus A. FIG. 21 a cross sectional view taken along line VI—VI shown in FIG. 20.

As shown in FIG. 20, on the first glass substrate 1031, a substrate surface coverage layer 1023 made of $SiO_2$ is formed in order to prevent impurity diffusion from glass. On the substrate surface coverage layer 1023, the polysilicon layer 1027 is formed in an inverted U-character shape as described above.

On the polysilicon layer 1027, an insulating film 1061 is deposited.

More specifically, the insulating film 1061 includes a gate insulating film 1061 a formed on the polysilicon layer 1027, a first interlayer insulating film 1061b formed on the gate insulating film 1061a, and a second interlayer insulating film j1061c formed on the first interlayer insulating film 1061b.

As shown in FIG. 21, the gate electrode/scan line 1005 is formed on the gate insulating film 1061a.

The first interlayer insulating film 1061a is formed covering the gate electrode G/scan line 1005. Contact holes are formed through the interlayer insulating film 1061b and gate insulating film 1061a at positions corresponding to the source region S and drain region D.

A source electrode/signal line 1003 and a drain electrode 1025 are formed on the first interlayer insulating film 1061a, filling the contact holes. The signal line 1003 is connected to the source region of the pixel TFT 1011 via a signal line contact hole 1033 formed through the gate insulating film 1061a and first interlayer insulating film 1061b. The grain electrode 1025 is connected to the drain region of the pixel TFT 1011 via a signal line contact hole 1033 formed through the gate oxide film 1061a and first interlayer insulating film 1061b.

On the first interlayer insulating film 1061a, a second interlayer insulating film 1061c is formed covering the signal line 1003 and drain electrode 1025. On the second interlayer insulating film 1061c, a second common electrode 1071 is formed covering the whole pixel area.

Figure 22:
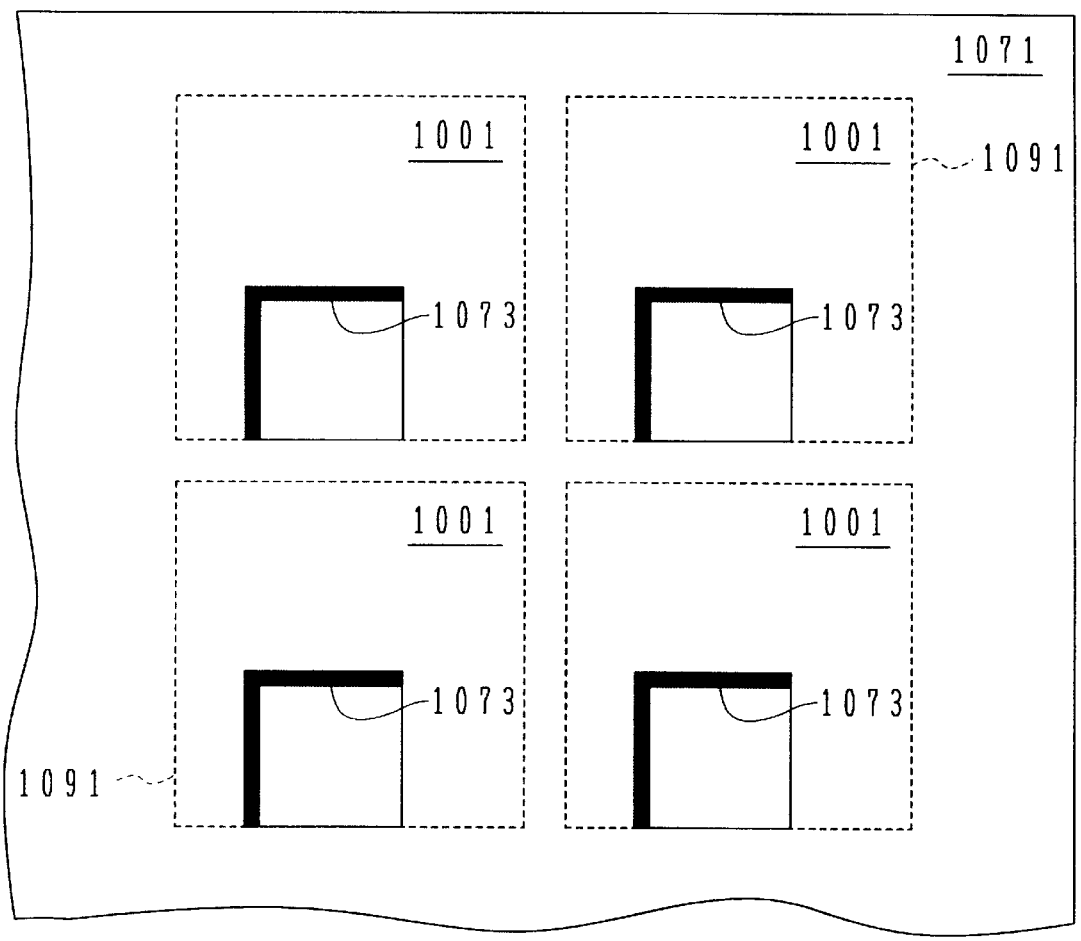
FIG. 22 is a plan view of the reflection type liquid crystal display apparatus of the fifth embodiment, showing fixed potential electrodes.

FIG. 22 is a plan view of the second common electrode 1071.

The second common electrode 1071 covers generally the whole areas of the pixel area with a plurality of pixels 1001, 1001, 1001, . . . . and the peripheral circuit area C.

Since the potential of the second common electrode 1071 has a fixed potential, the second common electrode 1071 functions as an electric shield for the pixels TFTs 1011 and signal lines 1003 under the electrode 1071.

As described earlier, the openings 1073 are formed through the second common electrode 1071 at the positions corresponding to the contact holes 1083 via which the reflection electrode 1091 and drain electrode 1025 are connected.

The planarizing insulating film 1081 made of polyimide is formed on the second interlayer insulating film 1061c. The planarizing insulating film 1081 alleviates the irregular surface of an underlying layer and provides a flat upper surface of the film 1081. If the reflection surface of the reflection electrode is irregular, light reflects at the reflection surface toward various directions. Light reflected more than a predetermined range cannot be used. Planarizing the reflection surface is effective for improving the incidence light use efficiency.

The reflection electrode 1091 is formed on the planarizing film 1081. The reflection electrode 1091 is connected to the drain electrode 1025 via the contact hole 1083. TFT 1011 receives a supplied image signal and stores it in the liquid crystal material. The orientation film 1101 is formed on the reflection electrode 1091.

On the second glass substrate 1051, the color filters 1121, first common electrode 1131 and orientation film 1141 are formed as described earlier.

The second common electrode 1071 and reflection electrodes 1091 occupy most of the pixel area, and have openings at different positions as viewed vertically. Since the double optical shield structure is formed relative to incidence light from the second glass substrate 1051 side, the shading performance for the incidence light from the second glass substrate 1051 side to the first glass substrate 1031 side can be improved.

The second common electrode 1071 applied with the fixed potential, the reflection electrode 1091 facing the second common electrode 1071, and the planarizing insulating film 1081 formed therebetween constitute the storage capacitor 1017 (refer to FIG. 17).

The storage capacitor 1017 is formed between the reflection electrode 1091 and the second common electrode 1071 except the openings 1073, with the planarizing film 1081 being interposed therebetween. The pixel TFT 1011 is disposed under the storage capacitor 1017. It is therefore possible to efficiently dispose the pixel TFT 1011 and storage capacitor 1017 in one pixel area.

The second common electrode 1071 forms a fixed potential surface between the reflection electrode 1091 and a pixel driving wiring lines such as the signal line 1003. Therefore, the reflection electrode 1091 and the pixel driving wiring line such as the signal line 1003 are electrically shielded and interference therebetween such as crosstalk can be suppressed.

The outline of manufacture processes for the liquid crystal display apparatus A of the fifth embodiment will be described. First, the outline of manufacture processes for the structure on the first glass substrate 1031 side will be described.

(1) A base silicon oxide film 1023 is grown on the first glass substrate 1031.

(2) An amorphous silicon layer is deposited on the silicon oxide film 1023 by plasma CVD.

(3) The amorphous silicon layer with a thickness of 50 nm is crystallized by using excimer laser of 308 nm in wavelength supplied from an XeCl light source to form a polysilicon layer 1027.

(4) After the polysilicon layer 1027 is etched in islands, a silicon oxide film 1061a as a gate insulating film is deposited by 120 nm by plasma CVD.

(5) An Al—ND film is deposited on the gate insulating film and patterned into gate electrodes and scan lines, for example, by wet etching using mixed acid etchant.

(6) Impurity ions of n- and p-type are implanted into the polysilicon film 1027 in source and drain regions and activated through laser radiation.

(7) A first interlayer insulating film 1061a (silicon nitride or silicon oxide) is deposited to a thickness of, for example, 500 nm by plasma CVD.

(8) A contact hole is formed through the first interlayer insulating film 1061 and underlying gate insulating film 1061a. A Ti/Al/Ti lamination film is deposited filling the contact hole and patterned to form a source wiring line used as the source electrode S and signal line 1003, and a drain electrode 1025.

(9) As a second interlayer insulating film 1061c, a silicon nitride film is formed on the first interlayer insulating film by plasma CVD to a thickness of, for example, 400 nm, the second interlayer insulating film covering the source wiring line and the like.

(10) A Ti film is deposited on the second interlayer insulating film 1061c to a thickness of, for example, 200 nm. Al may be used in place of Ti. Openings 1073 are formed through the Ti film, and a second common electrode 1071 is formed through dry etching using a resist mask and chlorine containing gas.

(11) A planarizing film 1081 made of polyimide is formed on the second common electrode 1071 and second interlayer insulating film 1061 c. Instead of the polyimide planarizing film, a silicon nitride film formed by plasma CVD may be used.

(12) A contact hole 1083 is formed through the planarizing film 1081 and second interlayer insulating film 1061c, via the opening 1073 exposing the upper drain electrode 1025, by dry etching using fluorine containing gas.

(13) An Al reflection electrode layer 1091 is deposited on the planarizing film 1081, filling the contact hole 1083. The electrode layer is separated into electrically independent reflection electrodes of pixels 1001 through dry etching using chlorine containing gas.

(14) An orientation film 1101 is formed on the reflection electrode 1091.

The structure on the second glass substrate 1051 side is formed by the following processes.

(1) On the second glass substrate 1051, a red color resist film of 1.5 μm in thickness is coated to form red color filters in the pixel area B by a normal photolithography process including drying, exposure and development processes. Green and blue color filters are formed by the similar process.

(2) A planarizing resin film is formed to planarize the uneven surfaces of the color filters and the like.

(3) An ITO film having a thickness of 1000 angstroms is formed by sputtering to form a common electrode 1131 by a predetermined patterning process.

(4) An orientation film of polyimide or the like is formed covering the first common electrode 1131.

With the above processes the structure on the second transparent substrate 1051 side is completed.

The first and second transparent substrates 1031 and 1051 manufactured by the above methods are mounted to form the liquid crystal display apparatus A. This method will be described next.

(1) The orientation films 1101 and 1141 formed on the first and second transparent substrates 1031 and 1051 are heated and hardened when necessary.

(2) A rubbing process is performed to rub the orientation films 1101 and 1141 in a predetermined direction with a buff cloth to form the orientation structure in the orientation films 1101 and 1141.

(3) Spherical spacers of polymer, glass, silica or the like are sprayed on the first transparent substrate 1031.

(4) Sealing resin is coated with a dispenser in an area outside of the peripheral circuit area C of the first glass substrate 1031.

(5) The first and second glass substrates 1031 and 1051 are stacked upon each other and the sealing resin is hardened through heat and pressure. The first and second glass substrates 1031 and 1051 are therefore adhered together by the sealing member 1041. The spherical spacers maintain a predetermined distance between the substrates 1031 and 1051.

(6) Liquid crystal material E is injected into the liquid crystal storing space via an unrepresented liquid crystal inlet, and thereafter, the inlet is sealed.

Figure 23A:
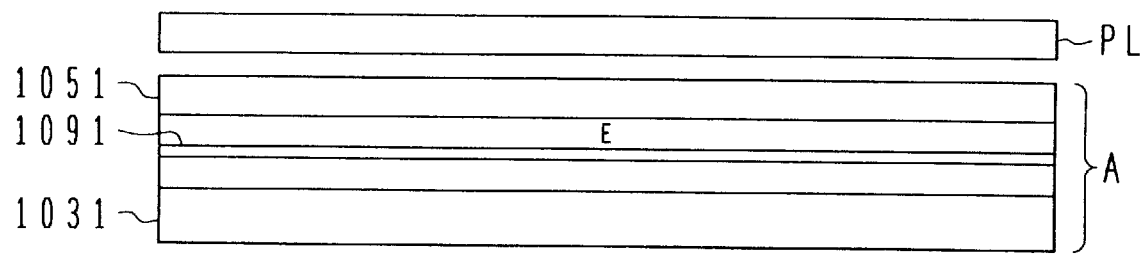
FIGS. 23A and 23B show examples of applications of the reflection type liquid crystal display apparatus of the fifth embodiment.
Figure 23B:
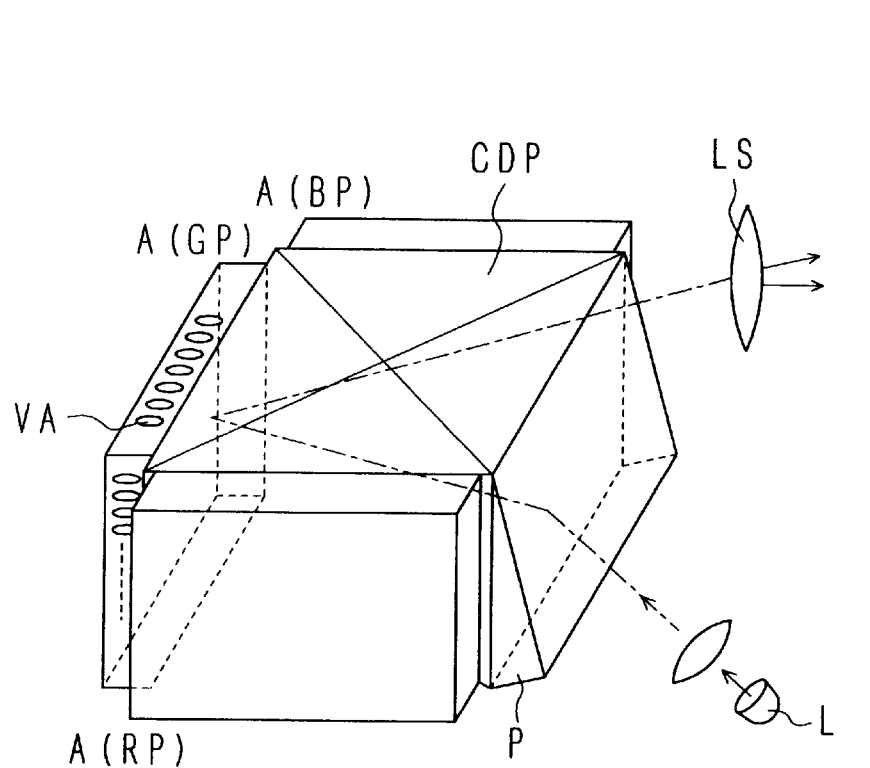

FIGS. 23A and 23B show a liquid crystal panel using the reflection type liquid crystal display apparatus of this embodiment.

FIG. 23A shows the outline structure of a reflection type direct view panel.

This reflection type direct view panel has a structure that a polarizing plate PL is disposed on a second glass substrate 1051 side of a reflection type liquid crystal panel A. As liquid crystal material E of the reflection type liquid crystal panel A, vertical orientation liquid crystal is used preferably.

FIG. 23B shows a three-chip projection type liquid crystal panel.

The projection type liquid crystal panel has reflection type liquid crystal. display apparatuses A1, A2 and A3 for R (red), G (green) and B (blue) colors disposed on the back and opposite side surfaces of a cross dichroic prism (CDP).

A wedge prism WP is disposed on the front surface of the cross dichroic prism CDP. A light source L is provided in order to apply light to the R, G and B reflection type liquid crystal display apparatuses A1, A2 and A3.

Light radiated from the light source L becomes incident upon the R, G and B reflection type liquid crystal display apparatuses A1, A2 and A3.

Reflection light from each of the reflection type liquid crystal display apparatuses A1, A2 and A3 is refracted by the wedge prism WP, the optical path of the output light being different from that of the input light. The refracted light is focussed upon a screen S by an optical system LS including a lens. The optical system LS may include either an optical lens or a cold mirror.

In the reflection type liquid crystal display apparatus of this embodiment, a pixel TFT and storage capacitor of each pixel cell can be disposed efficiently in each pixel area, so that a fine pixel can be formed. Since the size of a panel, particularly a reflection direct view panel and a projection type liquid crystal panel, is required to be compact, the reflection type liquid crystal display apparatus of this embodiment is suitable.

Figure 24:
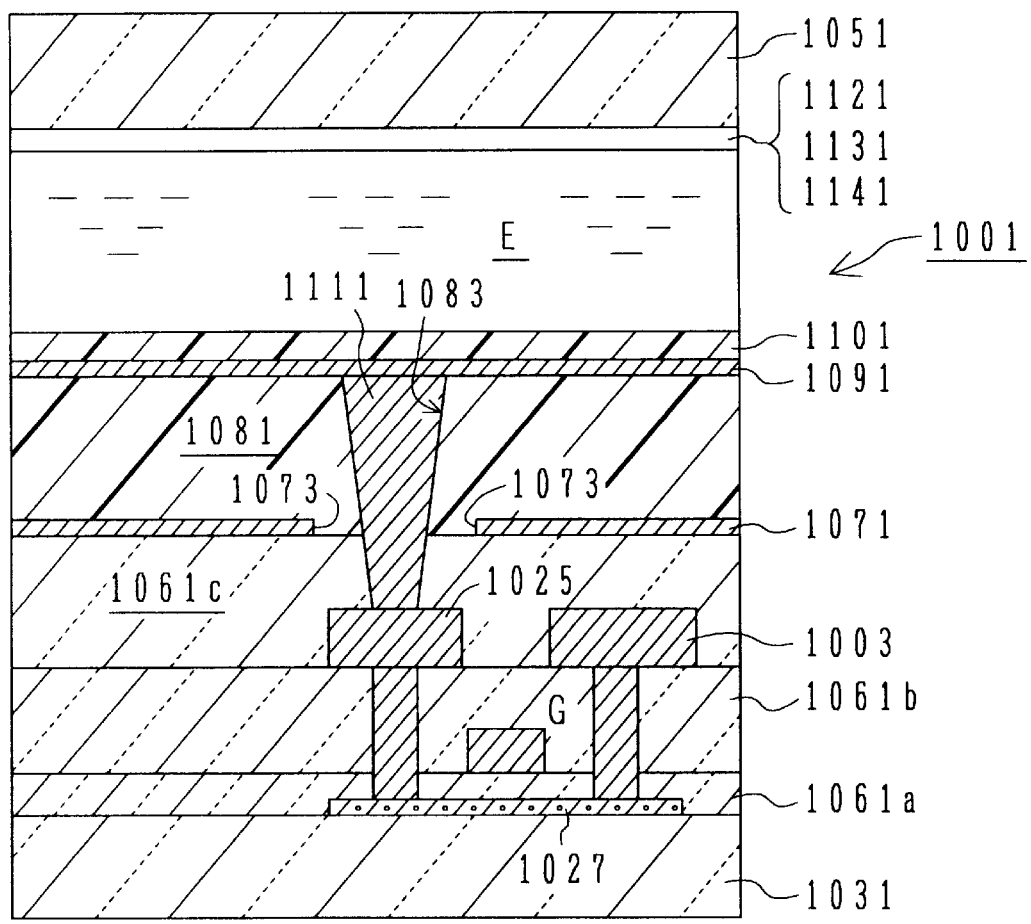
FIG. 24 is a cross sectional view of a reflection type liquid crystal display apparatus according to a modification of the fifth embodiment, showing the pixel area.

FIG. 24 shows a reflection type liquid crystal display apparatus according to a modification of the fifth embodiment. FIG. 24 corresponds to FIG. 20 showing the cross sectional view of the reflection type liquid crystal display apparatus of the fifth embodiment. Although a single gate type TFT shown in FIG. 3A is used as a pixel TFT in this modification, this is not an essential different point of this modification from the fifth embodiment.

In the reflection type liquid crystal display apparatus shown in FIG. 24, an electrically conducting filler 1111 made of conductive organic resin is filled in a contact hole 1083 extending from a reflection electrode 1091 to a drain electrode 1025. The conducting filler 1111 is preferably filled to the level flush with the upper surface of a planarizing film 1081.

This conducting filler 1111 electrically connects the reflection electrode 1091 and drain electrode 1025.

Of a method of manufacturing the reflection type liquid crystal display apparatus shown in FIG. 24, processes after the planarizing film 1081 was formed will be described briefly. The processes up to forming the planarizing film may use the same processes described above.

Figure 25:
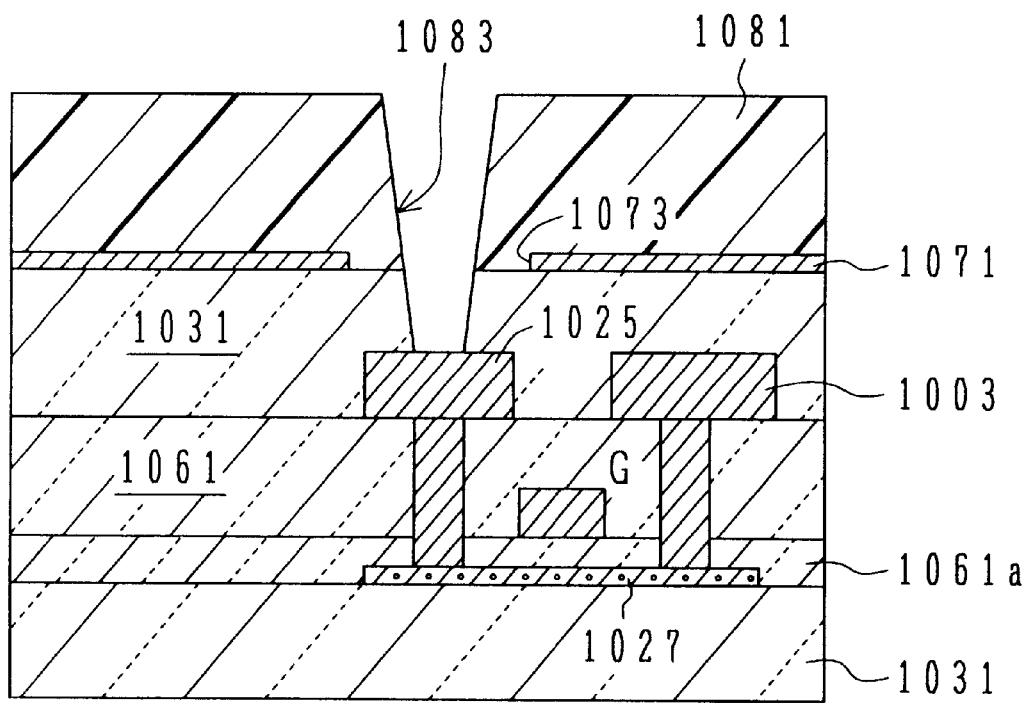
FIG. 25 is a cross sectional view illustrating a manufacture process for a reflection type liquid crystal display apparatus according to another modification of the fifth embodiment.

As shown in FIG. 25, as the conducting filler 1111, conducting transparent organic material added with SnO or the like is coated on the planarizing film 1081 with the contact hole 1083.

Figure 26:
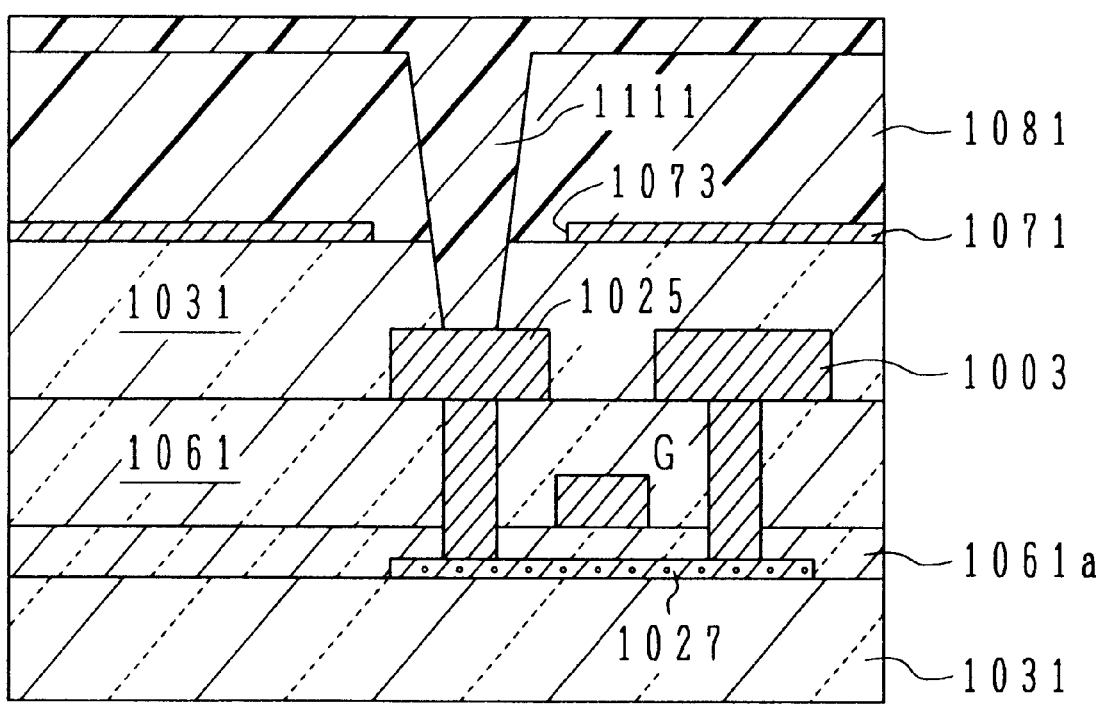
FIG. 26 is a cross sectional view illustrating another manufacture process for the reflection type liquid crystal display apparatus according to the modification of the fifth embodiment.

As shown in FIG. 26, the conductive filler 1111 is filled in the contact hole 1083 and covers the upper surface of the planarizing film 1081.

Figure 27:
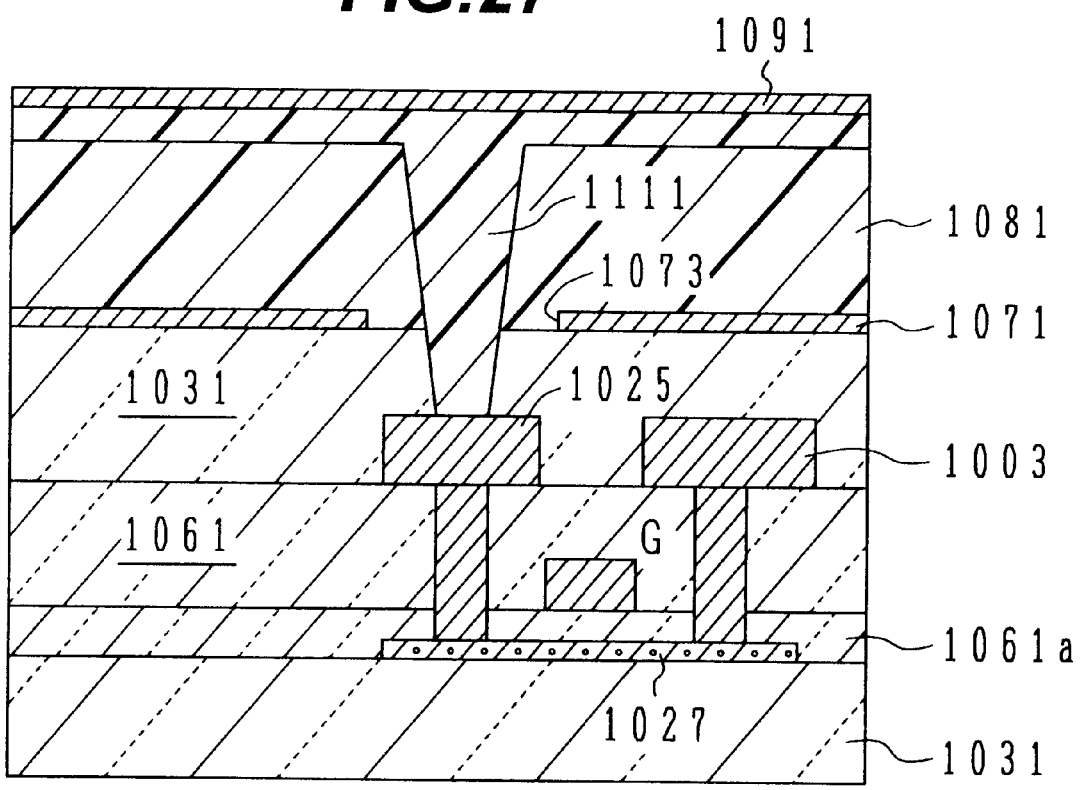
FIG. 27 is a cross sectional view illustrating another manufacture process for the reflection type liquid crystal display apparatus according to the modification of the fifth embodiment.

As shown in FIG. 27, an Al film to be used for reflection electrodes is deposited.

Photo-resist masks are patterned by an ordinary patterning process to form reflection electrodes as a mask.

Figure 28:
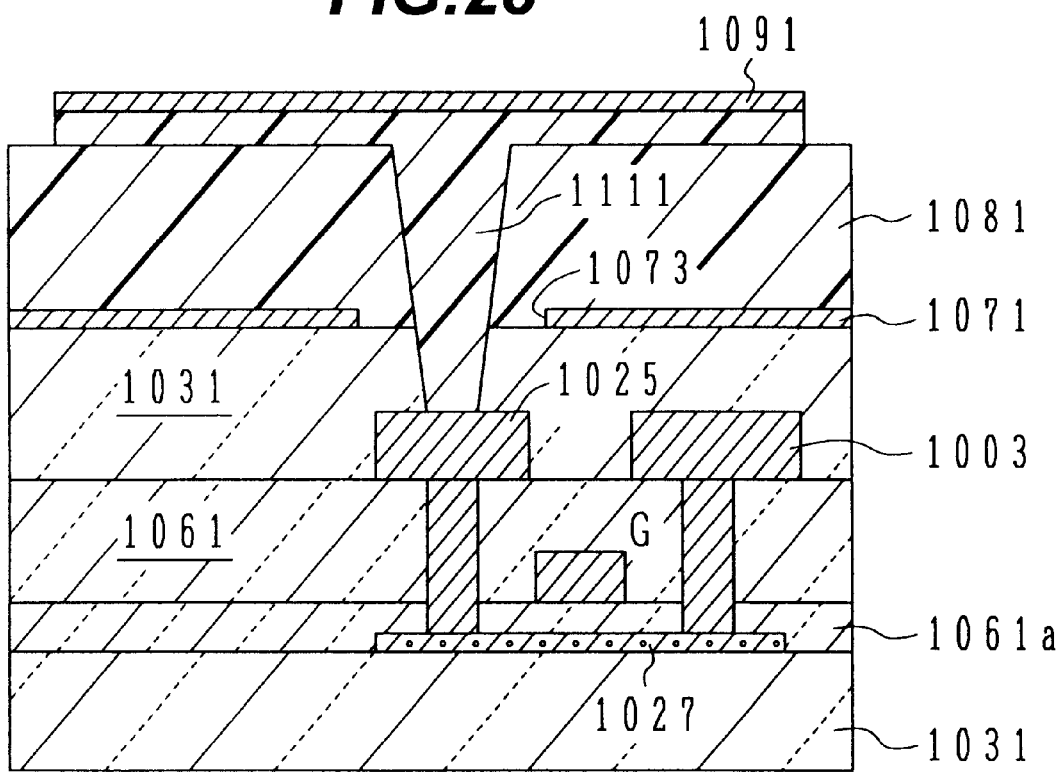
FIG. 28 is a cross sectional view illustrating another manufacture process for the reflection type liquid crystal display apparatus according to the modification of the fifth embodiment.

As shown in FIG. 28, the Al film is patterned through dry etching using chlorine containing gas, and the conducting filler 1111 of conductive organic material is etched through dry etching using fluorine containing gas to form reflection electrodes 91.

The reflection type liquid crystal display apparatus shown in FIG. 24 has a better flatness of a reflection electrode than that shown in FIG. 20.

Figure 29:
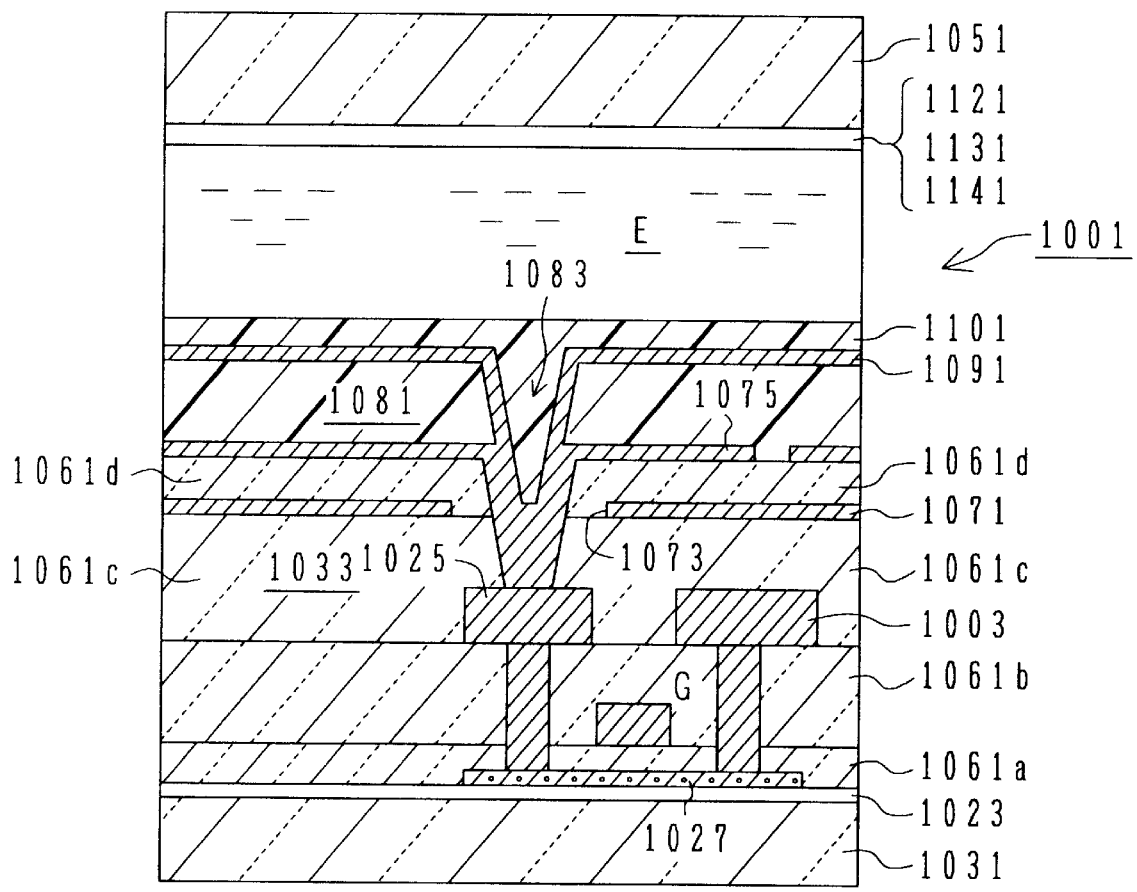
FIG. 29 is a cross sectional view of a reflection type liquid crystal display apparatus according to a sixth embodiment of the invention, showing the pixel area.

FIG. 29 is a cross sectional view of a reflection type liquid crystal display apparatus A according to the sixth embodiment of the invention. In the reflection type liquid crystal display apparatus of this embodiment, a third interlayer insulating film 1061d, a storage capacitor electrode 1075 and a planarizing film 1081 are formed between a second common electrode 1071 and a reflection electrode 1091. The storage capacitor electrode 1075 as well as the reflection electrode 1091 is connected to a drain electrode 1025 via a contact hole 1083.

The third interlayer insulating film 1061d may be made of any film so long as it provides a sufficient electric insulation between wiring layers, and may be a silicon nitride film having a thickness of 200 nm.

The storage capacitor electrode 1075 is made of Al. Ti may be used instead of Al.

In the liquid crystal display apparatus of this embodiment, the pixel storage capacitor is constituted of the second common electrode 1071 and storage capacitor electrode 1075, and the third interlayer insulating film 1061d between both the electrodes 1071 and 1075. Since the function of retaining the flatness of the reflection electrode 1091 is established by an upper planarizing film 1081, the thickness of the third interlayer insulating film 1061d can be relatively freely designed. It is therefore possible to thin the third interlayer insulating film 1061d and obtain a large capacitance. From the viewpoint of obtaining a large capacitance, a silicon nitride film is used preferably or a Ta oxide film having a higher dielectric constant may also be used.

Since the pixel TFT 1011 and signal line 1003 are covered by three metal layers including the second common electrode 1071, storage capacitor electrode 1075 and reflection electrode 1091, the electrical shielding function can be improved and the shading performance of shielding incidence light from the second glass substrate side can be improved, more than the reflection type liquid crystal display apparatus of the fifth embodiment.

Figure 30:
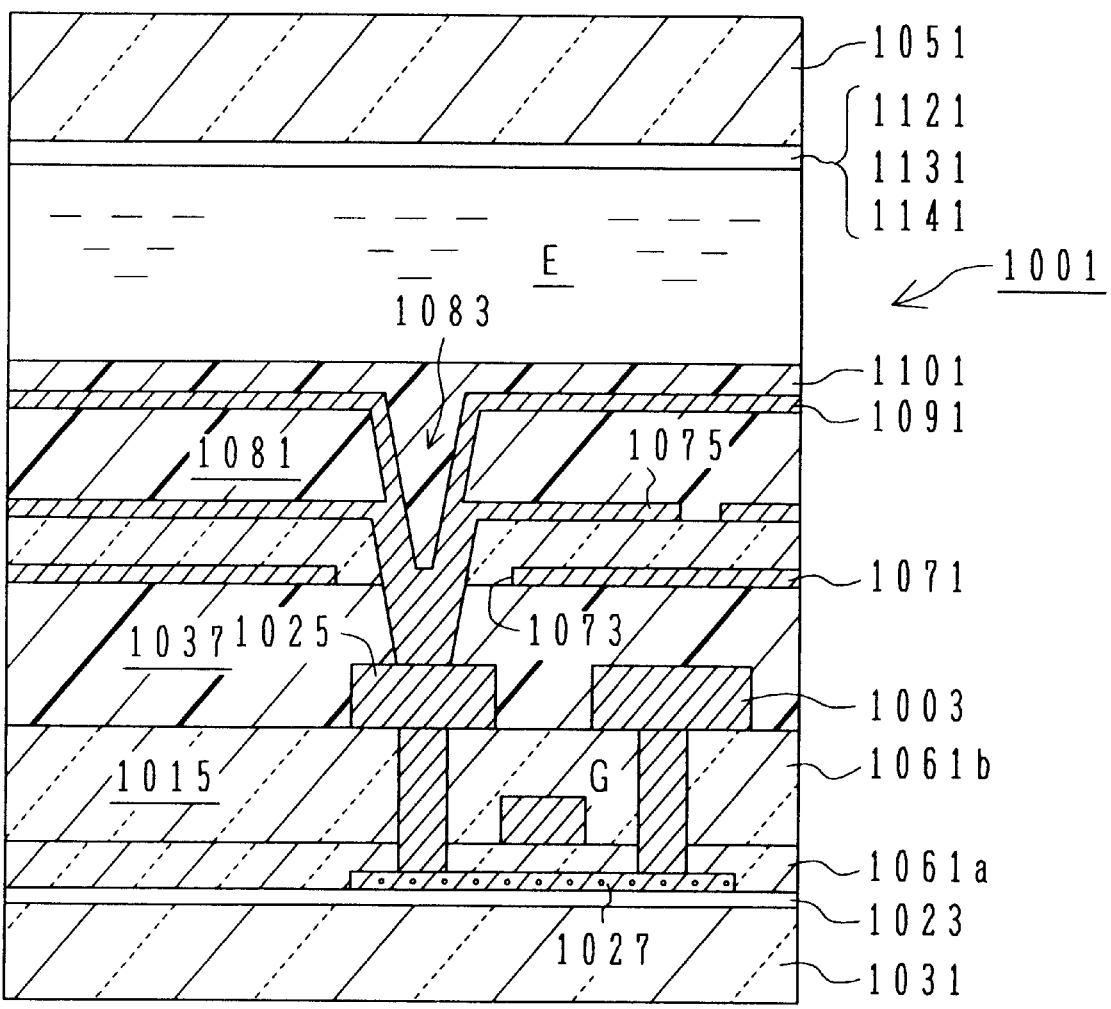
FIG. 30 is a cross sectional view of a reflection type liquid crystal display apparatus according to a first modification of the sixth embodiment of the invention, showing the pixel area.

FIG. 30 shows a reflection type liquid crystal display apparatus according to a first modification of the sixth embodiment.

The reflection type liquid crystal display apparatus A of the first modification is different from the reflection type liquid crystal display apparatus shown in FIG. 29 in that a second interlayer insulating film 1061c is made of polyimide and servers as a planarizing film.

In this reflection type liquid crystal display apparatus A, an irregular upper surface of a first interlayer insulating film 1061a to be formed by a signal line 1003 and an upper drain electrode 1025 can be alleviated by using the second interlayer insulating film 1061c made of polyimide. Therefore, a flatness of a second common electrode 1071 formed on this second interlayer insulating film 1061b can be improved so that the value of capacitance of the storage capacitor formed by the second common electrode 1071, third interlayer insulating film 1061d and storage capacitor electrode can be controlled precisely.

Figure 31:
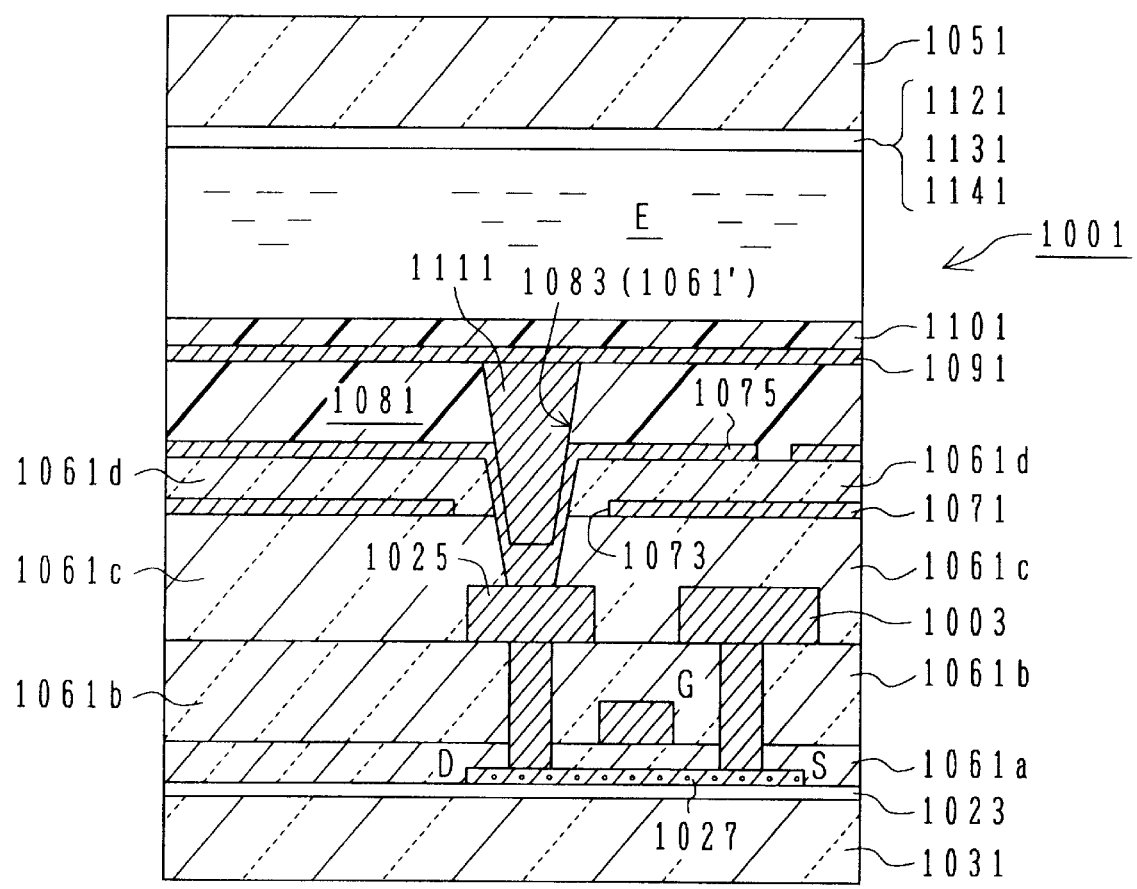
FIG. 31 is a cross sectional view of a reflection type liquid crystal display apparatus according to a second modification of the sixth embodiment of the invention, showing the pixel area.

FIG. 31 shows a reflection type liquid crystal display apparatus according to a second modification of the sixth embodiment.

FIG. 31 corresponds to FIG. 30 showing the reflection type liquid crystal display apparatus of the first modification.

In the reflection type liquid crystal display apparatus shown in FIG. 31, a storage capacitor electrode 1075 is connected to a drain electrode 1025 via a contact hole 1083 extending from a reflection electrode 1091 to the drain electrode 1025. Furthermore, an electrically conducting filler 1111 made of conductive polyimide (resin) is filled in the contact hole 1083. The conducting filler 1111 is preferably filled to the level flush with the upper surface of a planarizing film 1081.

This conducting filler 1111 electrically connects the reflection electrode 1091 and drain electrode 1025 via the capacitor storage electrode 1075.

With reference to FIGS. 32 to 35, a method of manufacturing the reflection type liquid crystal display apparatus shown in FIG. 31 will be described briefly.

Figure 32:
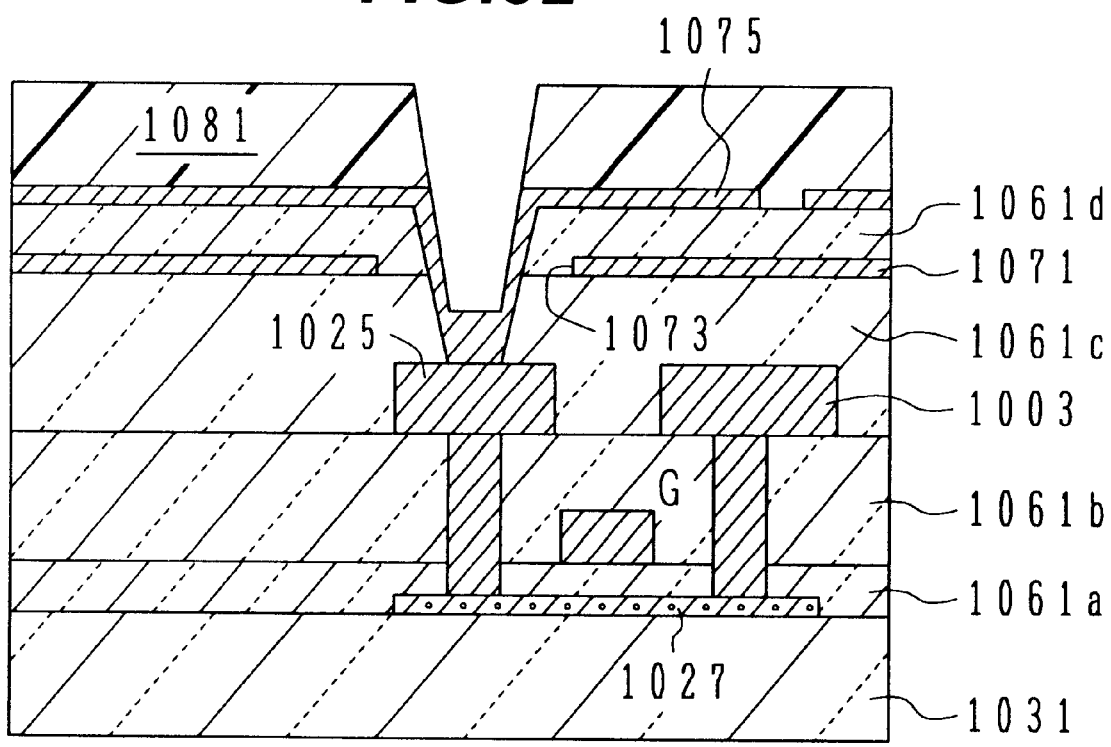
FIG. 32 is a cross sectional view illustrating a manufacture process for the reflection type liquid crystal display apparatus according to the second modification of the sixth embodiment.

As shown in FIG. 32, in the state that the planarizing film 1081 was formed by similar processes described above, the storage capacitor electrode 1075 is connected to the drain electrode 1025 in the contact hole 1083. As the conducting filler 1111, electrically conducting and transparent organic material is coated on the planarizing film 1081 with the contact hole 1083.

Figure 33:
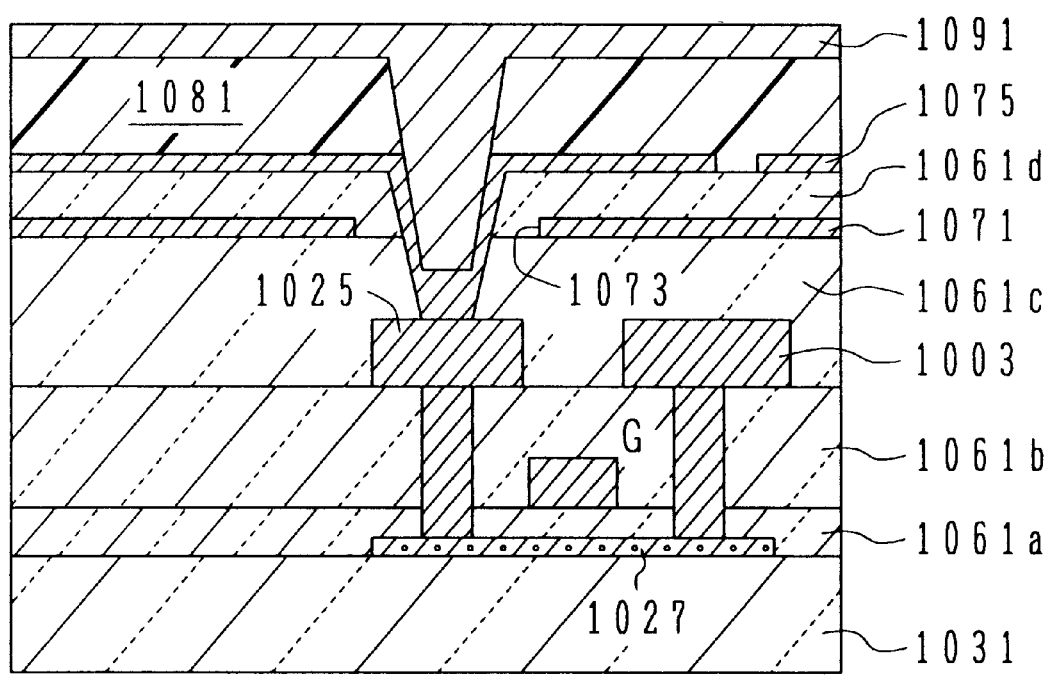
FIG. 33 is a cross sectional view illustrating another manufacture process for the reflection type liquid crystal display apparatus according to the second modification of the sixth embodiment.

As shown in FIG. 33, the conductive filler 1111 is filled in the contact hole 1083 and covers the upper surface of the planarizing film 1081.

Figure 34:
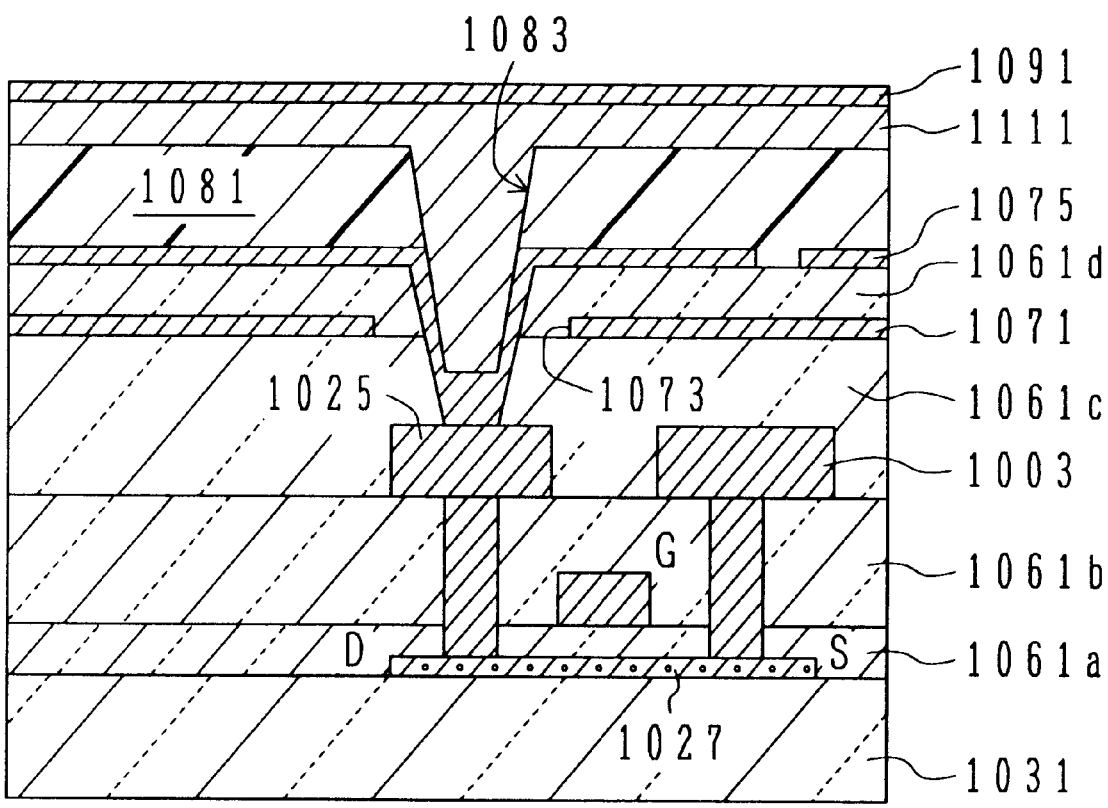
FIG. 34 is a cross sectional view illustrating another manufacture process for the reflection type liquid crystal display apparatus according to the second modification of the sixth embodiment.

As shown in FIG. 34, an Al film to be used for reflection electrodes is deposited and patterned by an ordinary patterning process to form reflection electrodes.

Figure 35:
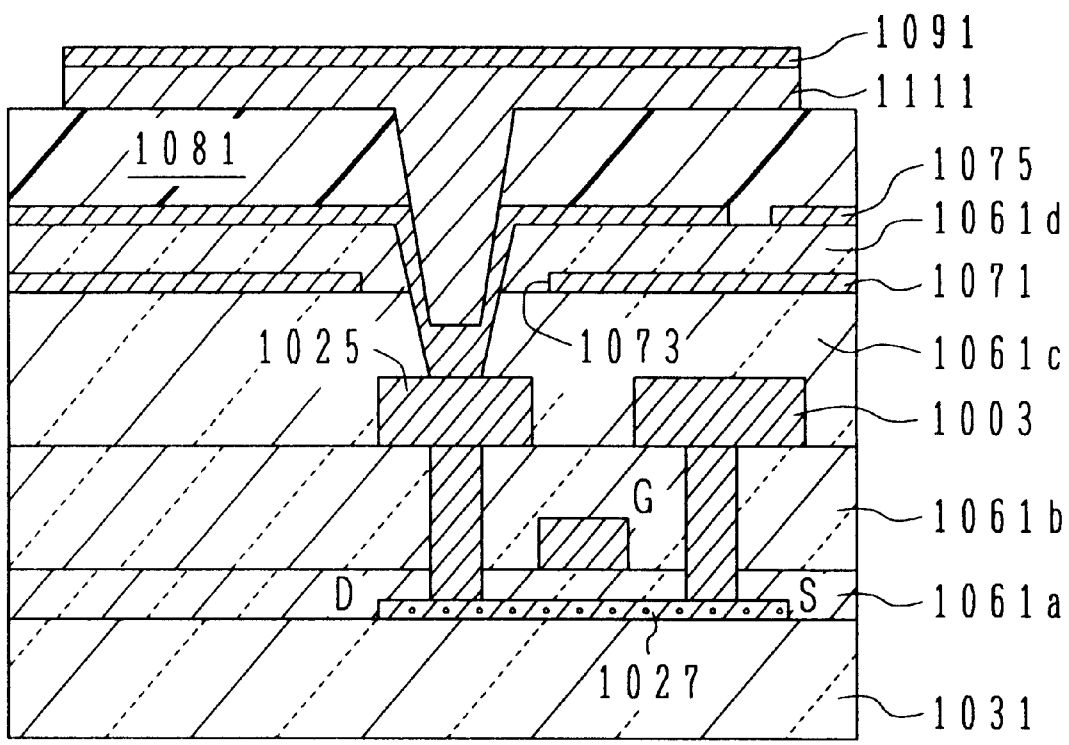
FIG. 35 is a cross sectional view illustrating another manufacture process for the reflection type liquid crystal display apparatus according to the second modification of the sixth embodiment.

As shown in FIG. 35, the Al film is patterned through dry etching using chlorine containing gas, and the conducting filler 1111 of conductive organic material is etched through dry etching using fluorine containing gas to form reflection electrodes 91.

The reflection type liquid crystal display apparatus shown in FIG. 33 has a better flatness of a reflection electrode than that shown in FIG. 16.

Figure 36:
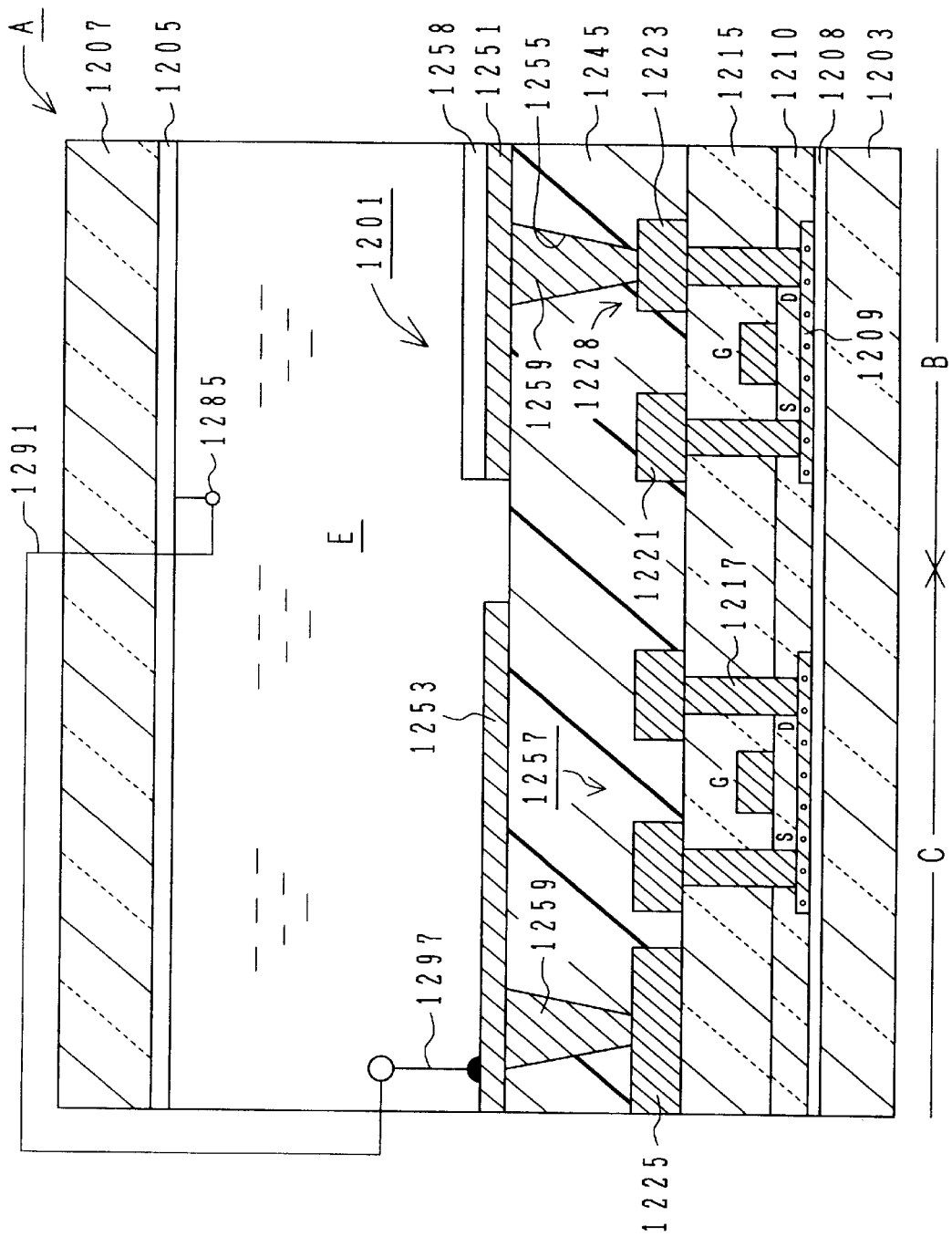
FIG. 36 is a cross sectional view of a reflection type liquid crystal display apparatus according to a seventh embodiment of the invention, showing the pixel area and peripheral circuit area.

FIG. 36 is a cross sectional view of a reflection type liquid crystal display apparatus A according to the seventh embodiment of the invention.

As the size of a reflection type liquid crystal display apparatus is becoming compact, there is a strong need for a peripheral circuit integrated type liquid crystal display apparatus in which a pixel area for displaying an image and a peripheral circuit area for controlling the pixel area are monolithically fabricated on the same substrate.

In a peripheral circuit integrated type liquid crystal display apparatus using polysilicon TFTs faster than amorphous silicon TFTs as semiconductor active elements of the peripheral circuit, it is necessary to form a shading film over the peripheral circuit in order to solve the problem of leakage current of TFT to be caused by light.

If a common electrode to be formed on the opposing substrate (second substrate) and a shading film to be formed over a peripheral circuit area are formed by different processes, the manufacture processes become complicated.

Further, in the adhesion process for the first and second substrates, a position alignment precision is required. If an adhesion margin is set large, it is difficult to increase the area of the pixel area.

Conventionally, planarizing material is used in the pixel area, and it is not used under the black matrix (BM) which covers the peripheral circuit area. Therefore, the parasitic capacitance of the peripheral circuit and BM becomes large.

The reflection type liquid crystal display apparatus shown in FIG. 36 includes a pixel area B for displaying an image and a peripheral circuit area C for controlling the pixel area B.

As shown in FIG. 36, liquid crystal material E is filled in a space between a first glass substrate 1203 and a second glass substrate 1207.

Instead of a transparent glass substrate, an opaque substrate such as an Si substrate may be used as the first glass substrate 1203.

On the second glass substrate 1207, a first common electrode 1205 is formed which is generally fixed to a ground potential.

Pixel TFTs 1228 of an island shape are formed on the first glass substrate 1203 in the pixel area B.

A peripheral circuit C is formed on the first glass substrate 1203 around the outer area of the pixel area B. In the peripheral circuit C, polysilicon TFTs 1257 are used as semiconductor active elements.

A silicon oxide film 1208 is formed on the first glass substrate 1203 formed with pixel TFTs 1228. On the silicon oxide film 1208, polysilicon layers 1209 are formed as islands each forming a channel layer of TFT. On the silicon oxide film 1208, a gate oxide film 1210 is formed covering the polysilicon layer 1209. On the gate oxide film 1210, a gate electrode G also serving as a scan line is formed.

A first interlayer insulating film 1215 is formed on the gate oxide film 1210, covering the gate electrode G. Contact holes 1217, 1217, 1217, . . . are formed through the first interlayer insulating film 1215 and gate oxide film 1210, reaching source and drain regions.

A source electrode S also serving as a signal line 1221 is formed on the first interlayer insulating film 1215, the source electrodes S being connected to the source regions of the pixel TFT 1228 and peripheral circuit TFT 1257 via contact holes 1217. The drain electrode 1223 is formed contacting the drain region.

A first electrode 1225 is formed on the first interlayer insulating film 1215 in an outer peripheral area in the peripheral circuit area.

A planarizing film 1245 is formed on the first interlayer insulating film 1215.

Second contact holes 1255 are formed through the planarizing film 1245 in the areas corresponding to the upper drain electrode 1223 of the pixel TFT 1228 and the first electrode 1225.

A reflection electrode 1251 is formed on the planarizing film 1245, covering the pixels 1001 including pixel TFTs 1228. On the reflection electrode 1251, an orientation film 1258 is formed.

A peripheral circuit shading film 1253 is formed on the planarizing film 1245 over the peripheral circuit C including the peripheral circuit TFTs 1257, the shading film 1253 being formed by the same process as used for the reflection electrode 1251.

The drain electrode 1223 and reflection electrode 1251 are electrically connected by an electrically conducting filler 1259 filled in the contact hole 1255. The first electrode 1225 and peripheral circuit shading film 1258 are also electrically connected by an electrically conducting filler 1259 filled in the contact hole 1255.

A connection terminal 1287 of the peripheral circuit shading film 1258 is electrically connected via a wiring lead 1291 to a connection terminal 1285 of the common electrode 1205 formed on the second glass substrate 1207.

In the reflection type liquid crystal display apparatus of this embodiment, at the same time when the reflection electrode is formed, the peripheral circuit shading film is formed. An additional process of forming the peripheral circuit shading film is not necessary.

The peripheral circuit shading film shields light from the peripheral circuit TFTs 1257. Leakage current to be generated by light can be reduced and a probability of malfunction of the peripheral circuit to be caused by light can be lowered.

Since the peripheral circuit shading film is connected to the common electrode to set it to the ground potential, no bias will be applied to the liquid crystal material on the peripheral circuit. It is therefore possible to prevent the liquid crystal material from being applied with a d.c. bias (e.g., power supply voltage and ground voltage) and being degraded.

Even if normally black liquid crystal is used, a black display state is always maintained at the periphery of a displayed area and there is no reflected light, because no bias is applied to the liquid crystal. Since the peripheral circuit shading film is formed at the highest level of the first glass substrate, it can be used as a transfer electrode to the second glass substrate. A degree of freedom of the structure and position of a transfer electrode can be increased.

This reflection type liquid crystal display apparatus is particularly effective when it is used with a reflection projection type panel which is required to be made compact.

Figure 37:
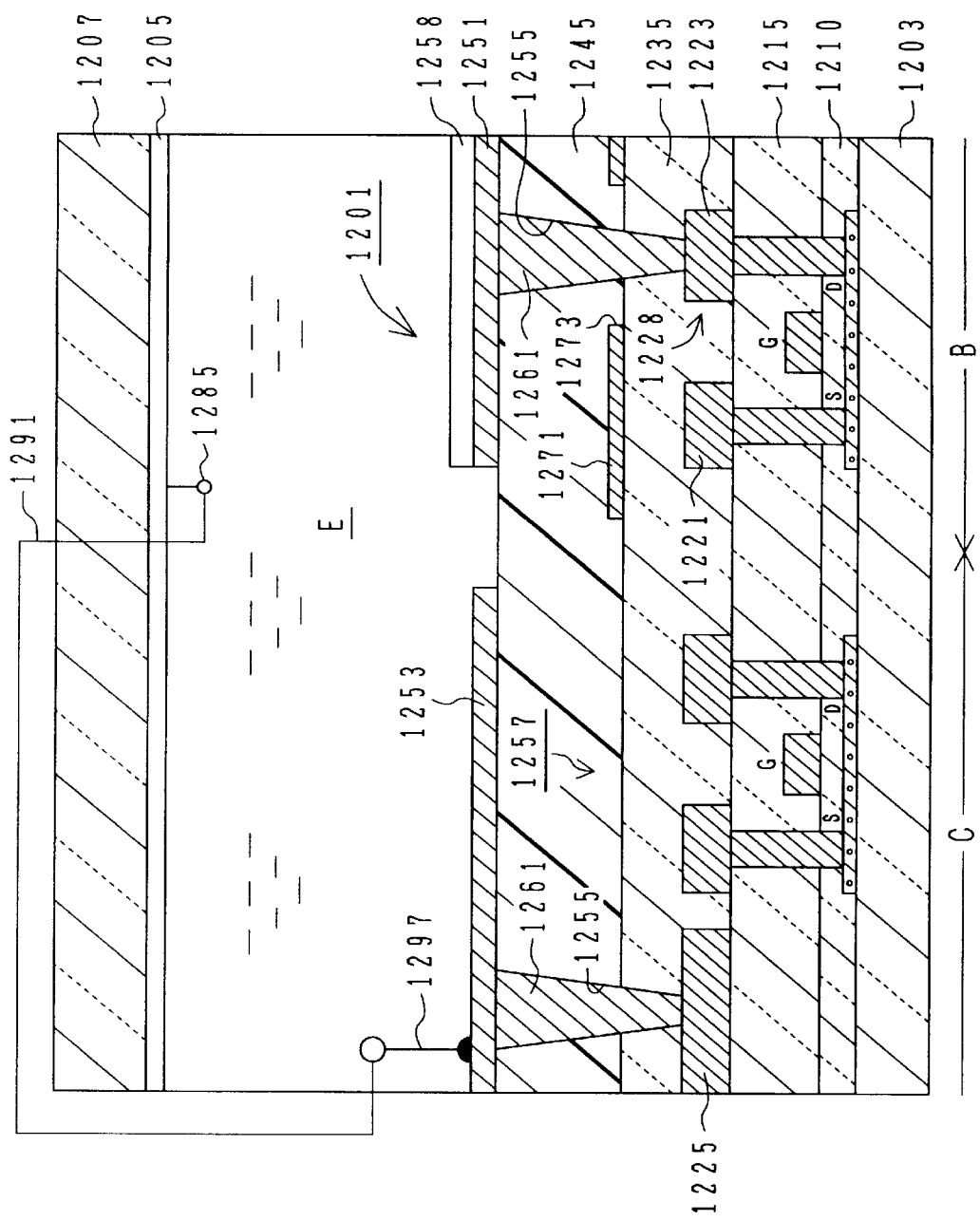
FIG. 37 is a cross sectional view of a reflection type liquid crystal display apparatus according to a first modification of the seventh embodiment, showing the pixel area and peripheral circuit area.

FIG. 37 shows a reflection type liquid crystal display apparatus A according to a first modification of the seventh embodiment.

In the reflection type liquid crystal display apparatus A shown in FIG. 37, a second interlayer insulating film 1235 is formed between a first interlayer insulating film 1215 and a planarizing film 1245. A second common electrode 1271 is formed on the second interlayer insulating film 1235, covering the pixel TFTs 1228. The second common electrode 1271 is formed with an opening 1273 above an upper drain electrode 1923 of the pixel TFT 1228.

The second common electrode 1271 may be made to cover each pixel separately, to cover a plurality of pixels, or to cover the whole pixel area.

The second common electrode 1271 is preferably connected to the first common electrode 1205 to be applied with the ground potential.

In the liquid crystal display apparatus of this modification, a pixel storage capacitor is constituted of the second common electrode 1271, planarizing insulating film 1245 and reflection electrode 1251.

The storage capacitor is formed in approximately the whole area of one pixel including the pixel TFT 1228. The pixel TFT and storage capacitor can be disposed efficiently in this area so that the pixel can be made fine and the apparatus can be made compact.

Figure 38:
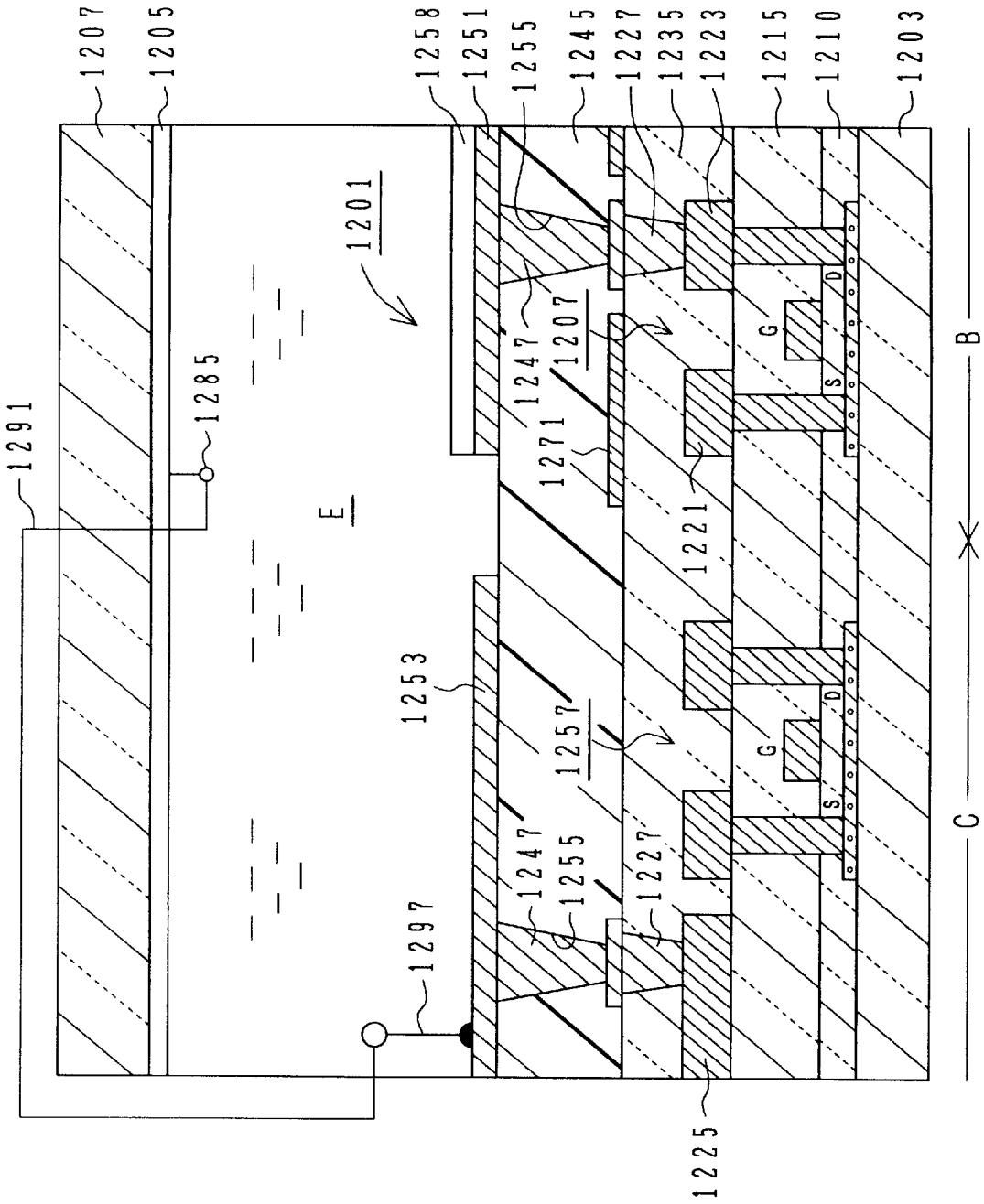
FIG. 38 is a cross sectional view of a reflection type liquid crystal display apparatus according to a second modification of the seventh embodiment, showing the pixel area and peripheral circuit area.

FIG. 38 shows a reflection type liquid crystal display apparatus A according to a second modification of the seventh embodiment.

In the reflection type liquid crystal display apparatus A shown in FIG. 38, a second interlayer insulating film 1235 is formed between a first interlayer insulating film 1215 and a planarizing film 1245. A second common electrode 1271 is formed on the second interlayer insulating film 1235, covering the pixel TFTs 1228. The second common electrode 1271 is formed with an opening 1273 above an upper drain electrode 1223 of the pixel TFT 1228.

In the opening 1273, a contact hole formed through the second interlayer insulating film 1235 is filled with a filler 1227. This filler 1227 may be formed by the same process as the second common electrode 1271.

A filler 1247 is also filled in a contact hole formed through the planarizing film 1245. The first electrode 1225 is connected to the peripheral circuit shading film 1253 via similar fillers 1227 and 1247.

Since the contact hole is filled twice by the fillers 1227 and 1247, filling the contact hole becomes easy. The upper drain electrode 1222 and the reflection electrode 1251 can be more reliably connected electrically.

Figure 39:
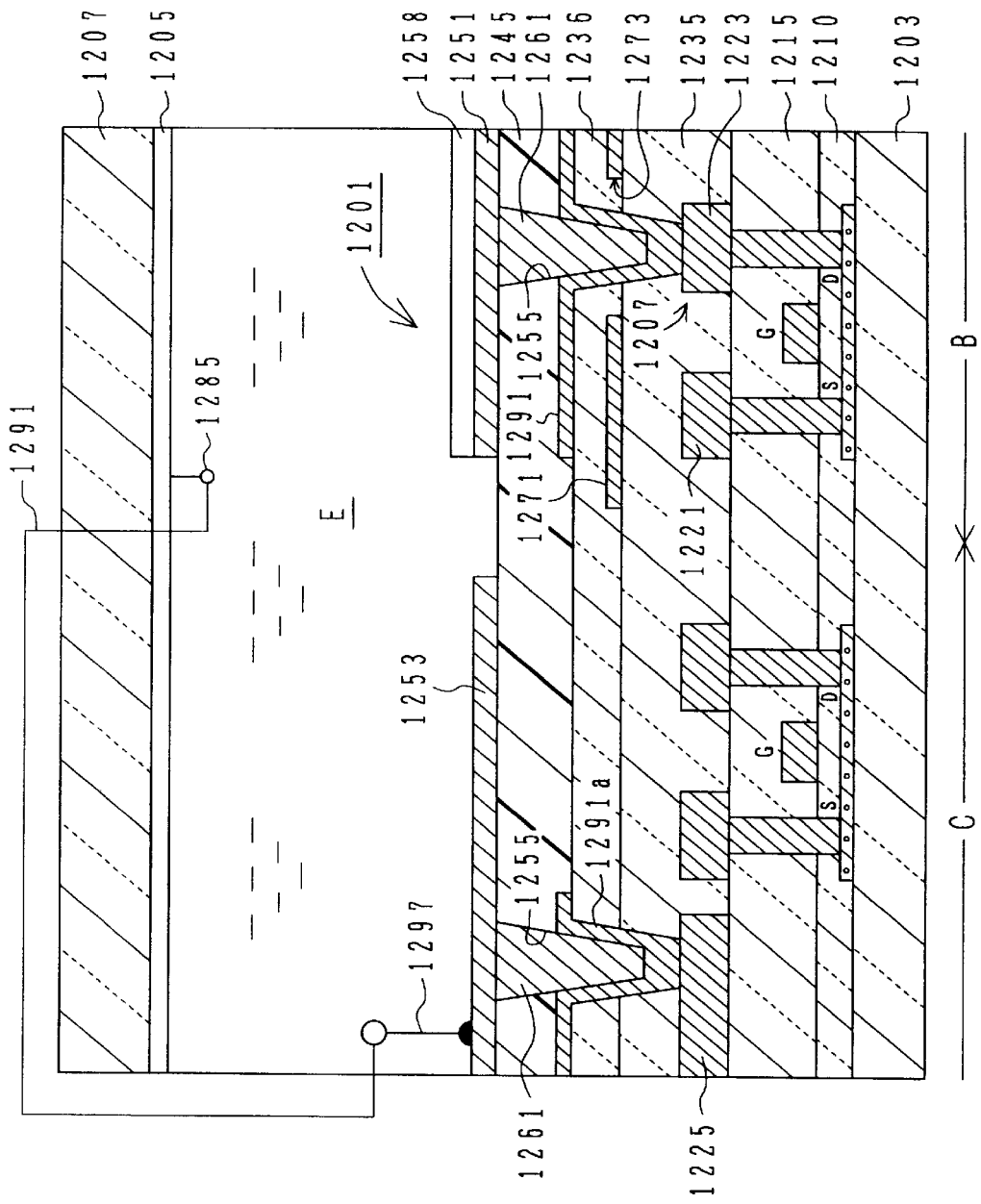
FIG. 39 is a cross sectional view of a reflection type liquid crystal display apparatus according to a third modification of the seventh embodiment, showing the pixel area and peripheral circuit area.

FIG. 39 shows a reflection type liquid crystal display apparatus A according to a third modification of the seventh embodiment.

In the reflection type liquid crystal display apparatus A shown in FIG. 39, a second interlayer insulating film 1235 and a third interlayer insulating film 1236 are formed between a first interlayer insulating film 1215 and a planarizing film 1245. A second common electrode 1271 is formed on the second interlayer insulating film 1235, covering the pixel TFTs 1228. The second common electrode 1271 is formed with an opening 1273 above an upper drain electrode 1223 of the pixel TFT 1228.

The third interlayer insulating film 1236 covers the second common electrode 1271. A contact hole is formed through the third and first interlayer insulating films 1236 and 1235 to expose the drain electrode 1223. A storage capacitor electrode 1291 is formed on the third interlayer insulating film 1236, covering the contact hole and facing the second common electrode 1271.

In the opening 1273, the storage capacitor electrode 1291 covers the contact hole formed through the second interlayer insulating film 1235.

In the area including the first electrode 1225, a contact hole is formed through the third and first interlayer insulating films 1236 and 1235 to expose the first electrode 1225. An intermediate electrode 1291a made of the same material as the storage capacitor electrode 1291 covers the contact hole.

A planarizing film 1245 is formed covering the storage capacitor electrode 1291 and intermediate electrode 1291a, and contact holes are formed through the planarizing film 1245 to expose the electrodes 1291 and 1291a.

Fillers 1261 fill and cover the electrodes 1291 and 1291a in the contact holes. A reflection electrode 1251 and a peripheral circuit shading film 1253 are formed covering the fillers 1261 and planarizing film 1245.

In this structure, the first electrode 1255 is connected to the peripheral circuit shading film 1253.

The storage capacitor is constituted of the fixed potential electrode 1271, third interlayer insulating film 1236 and storage capacitor electrode 1291. As compared to the capacitor structure with the planarizing film, a degree of freedom of storage capacitor value design can be increased. A large capacitance can be obtained and a fine pixel can be formed.

Figure 40:
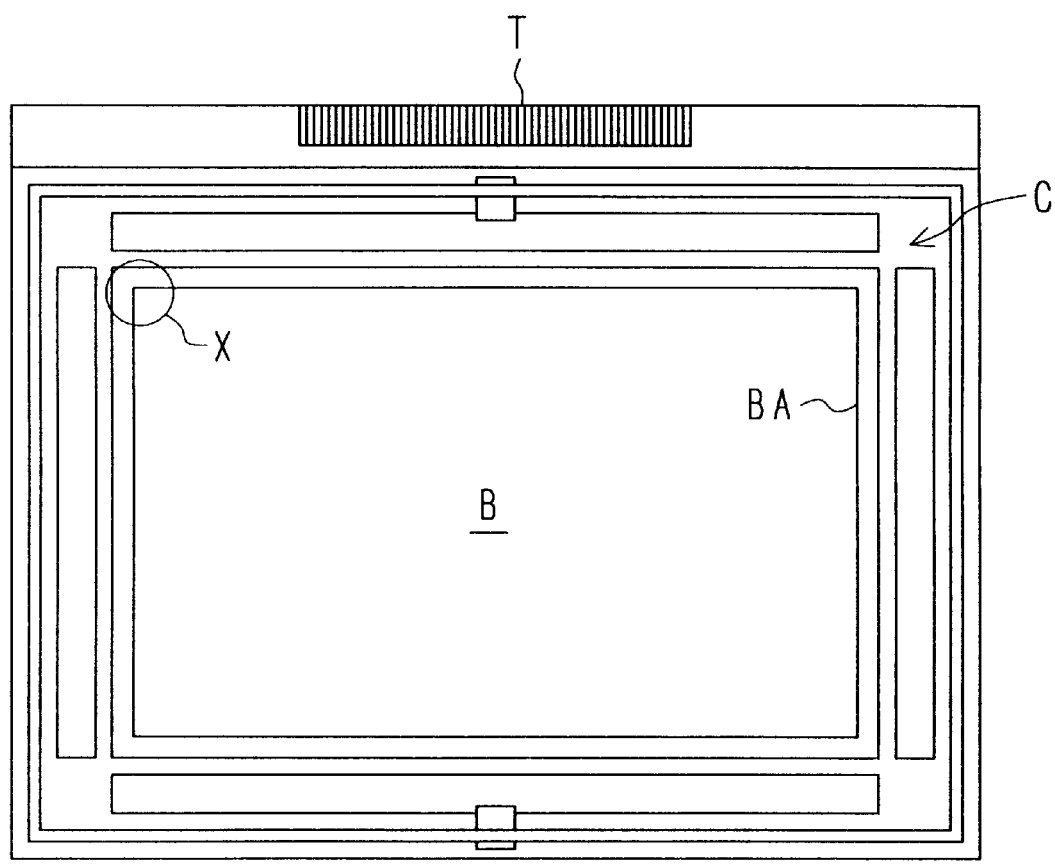
FIG. 40 is a plan view of a reflection type liquid crystal display apparatus according to an eighth embodiment of the invention.
Figure 41:
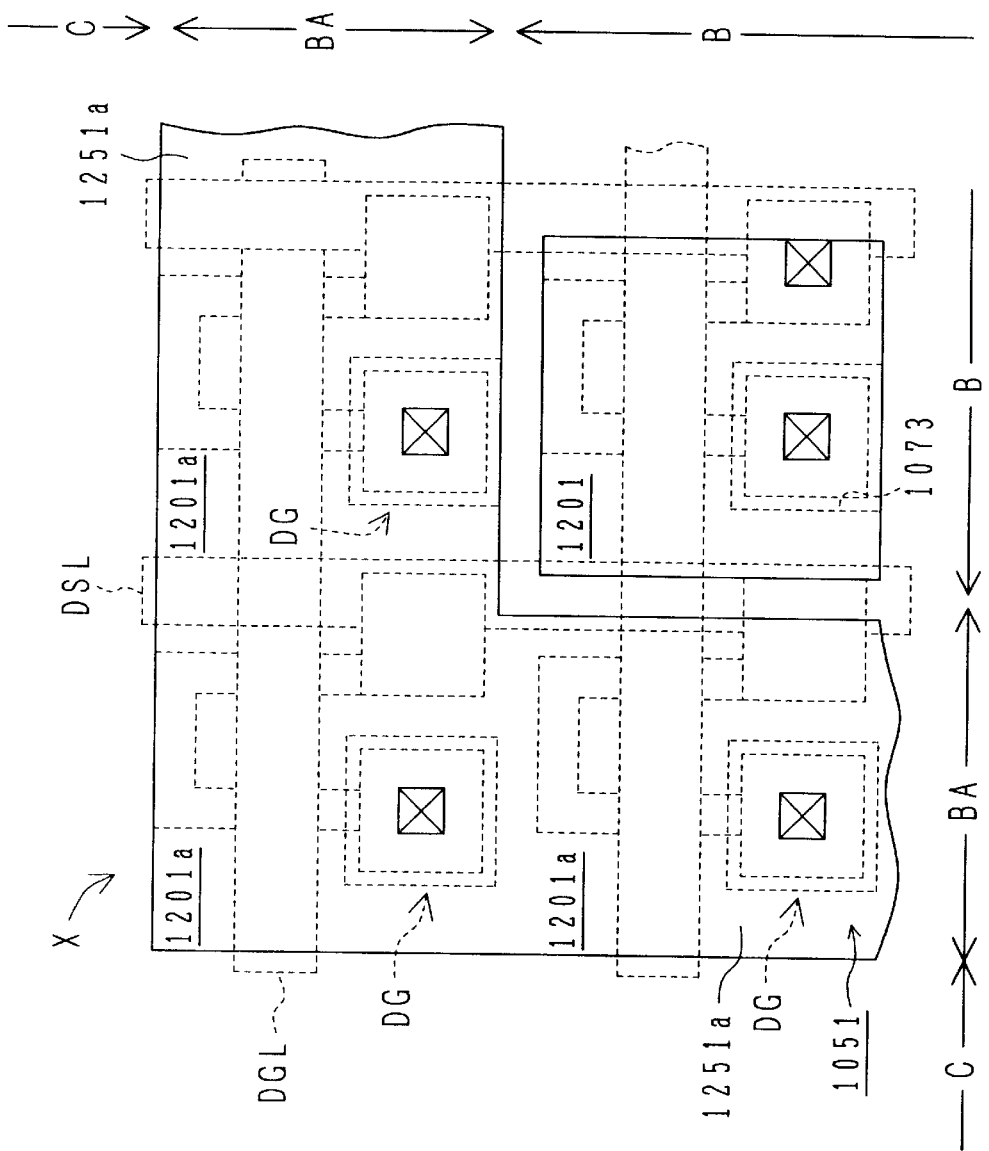
FIG. 41 is a plan view of the reflection type liquid crystal display apparatus of the eighth embodiment, showing an upper left corner area in a boundary area.

FIGS. 40 and 41 show a reflection type liquid crystal display apparatus according to the eighth embodiment of the invention.

FIG. 40 is a plan view of the liquid crystal display apparatus A.

This reflection type liquid crystal display apparatus includes a boarder area between a pixel area B and a peripheral circuit area C.

FIG. 41 is a plan view of an area X including the upper left corner of the boarder area BA.

A dummy reflection electrode 1251a made of the same metal layer as a reflection electrode 1251 of a pixel 1201 is formed above pixel TFTs formed in the boarder area BA.

The dummy reflection electrode 1251a is formed above dummy pixels 1201a, 1201a and 1201a formed in the boarder area BA.

The dummy reflection electrode 1251a is connected to the common electrode formed on the second glass substrate.

Since the metal film having the same potential as the common electrode is present near the peripheral area of the pixel area, this peripheral area is displayed always as "black" in a normally black liquid crystal mode, so that the influence of stray light can be suppressed.

The dummy reflection electrodes 1251a may be formed integrally with the peripheral circuit shading film 1253 and connected to the common electrode.

Although one dummy pixel 1201 is formed in horizontal and vertical directions, two or more dummy pixels 1201a may be formed in horizontal and vertical directions.

Figure 42:
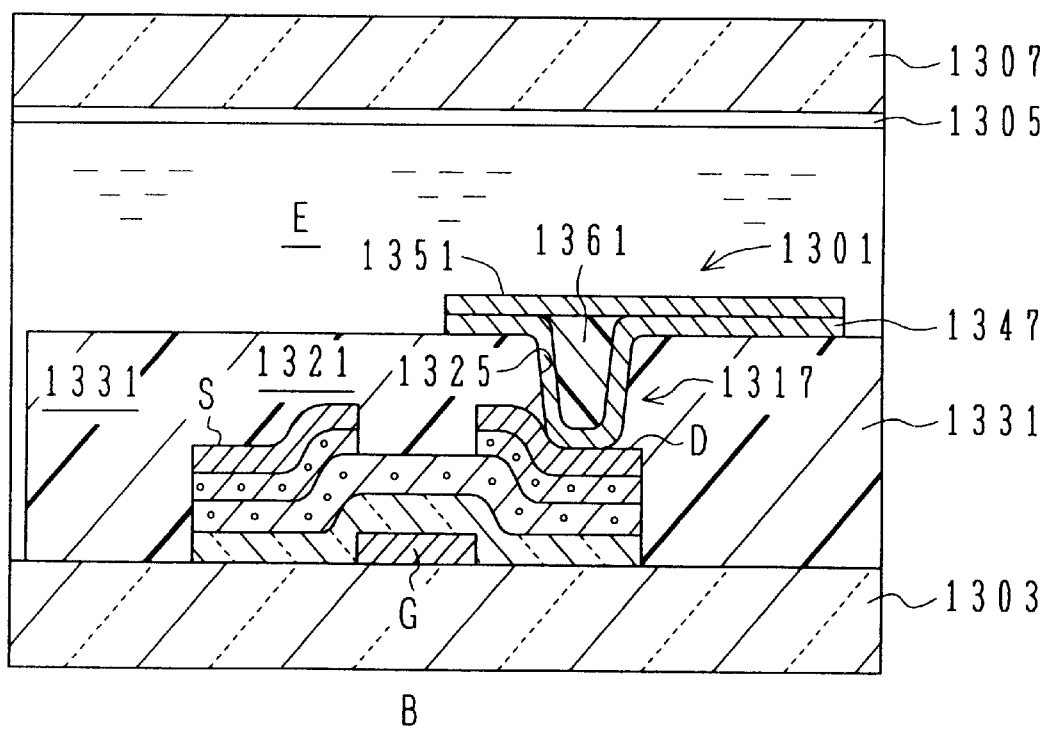
FIG. 42 is a cross sectional view of a reflection type liquid crystal display apparatus according to a ninth embodiment of the invention, showing the pixel area.

With reference to FIG. 42, a reflection type liquid crystal display apparatus according to the ninth embodiment will be described.

In a reflection type liquid crystal display apparatus, semiconductor active elements and signal lines can be disposed under reflection electrodes. A high opening rate can therefore be achieved.

However, in order to electrically connect a terminal of a semiconductor active element to a reflection electrode, it is necessary to form a contact hole through an interlayer insulating film.

The flatness of an interlayer insulating film in the area of the contact hole and nearby area becomes bad. The area of a poor flatness does not fundamentally contribute to display.

High integration (fine patterning) of liquid crystal display apparatuses is progressing. A poor flatness to be caused by a contact hole poses a problem not neglected.

In recent reflection type liquid crystal display apparatuses, techniques of planarizing an irregular surface of a first substrate having active elements such as TFTs by covering the irregular surface with a planarizing film or the like have been adopted.

By planarizing an irregular surface of the first substrate, the influence of electric field in an in-plane direction of a substrate and the influence of a step formed by a bus line such as a signal line can be alleviated and the opening rate of a pixel can be improved.

In general, active elements and bus lines can be formed under reflection electrodes of a reflection type liquid crystal display apparatus so that a high opening rate can be realized. However, the following problems are associated with a reflection type liquid crystal display apparatus.

It is necessary to electrically connect a terminal (e.g., a drain terminal of TFT) of an active element to a reflection electrode (display electrode) formed on an interlayer insulating film over the active element terminal. To this end, a contact hole is formed through the interlayer insulating film, and a reflection electrode (display electrode) is deposited conformal to a recessed shape of the contact hole to fill the contact hole with the electrode material.

The upper surface of the reflection electrode filled in the contact hole has a recessed shape. The orientation of liquid crystal molecules on the reflection electrode is disturbed by this recessed shape. The disturbed orientation area does not contribute to image display. As pixels are made finer, the influence of disturbed orientation near the contact hole cannot be neglected. Even if resin or the like is filled in the recessed area on the reflection electrode, a problem of bias polarization still remains.

In the reflection type liquid crystal display apparatus shown in FIG. 42, a polysilicon TFT 1317 having a source S, gate G and drain D is formed on a first glass substrate 1303.

On a second glass substrate 1307 opposing the first glass substrate 1303, a first common electrode 1305 is formed. Liquid crystal material E is filled in between the first and second glass substrates 1303 and 1307.

On the polysilicon TFT 1317, a planarizing insulating film 1331 made of acrylic resin and having a thickness of 2 $\mu$m is formed. A contact hole 1325 of 5 $\mu$m square is formed through the planarizing insulating film 1331 at the position corresponding to the drain electrode S. The contact hole has a taper so that its upper opening is 10 $\mu$m square. A first reflection electrode 1347 is deposited conformal to the recessed shape of the contact hole 1325.

A contact hole filler 1361 of acrylic resin is filled in a recessed space of the first reflection electrode 1347 in the contact hole 1325. This contact hole filler 1361 is formed by coating acrylic region over the first glass substrate by spin coating and then performing an ashing process until the upper flat surface of the first reflection electrode 1347 becomes flush with the upper surface of the coated acrylic resin.

A second reflection electrode 1351 of Al is formed on the upper flat surface of the first reflection electrode 1347 and on the flat surface of the acrylic resin filler 1361 filling the recessed space.

The first reflection electrode 1347 may be made of Ti or Ti/Al/Ti in order to improve tight adhesion to the drain electrode.

The reflection type liquid crystal display apparatus shown in FIG. 42 has a good flatness of the second reflection electrode 1352 functioning as an actual reflection electrode.

With the reflection type liquid crystal display apparatus of this embodiment, liquid crystal orientation is not disturbed by a contact hole interconnecting the reflection electrode and drain electrode. Since the surface of the reflection electrode is flat, bias polarization is hard to be generated. An area not contributing to image display, to be caused by the disturbed orientation at the contact hole when a pixel is made fine, becomes small.

Figure 43:
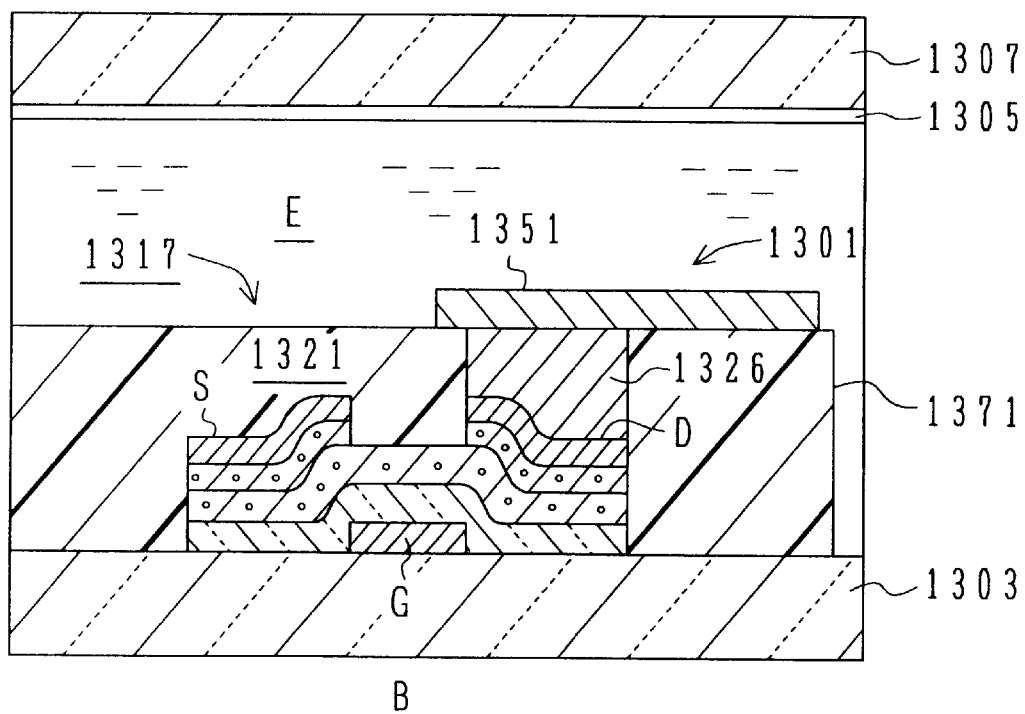
FIG. 43 is a cross sectional view of a reflection type liquid crystal display apparatus according to a tenth embodiment of the invention, showing the pixel area.

With reference to FIG. 43, a reflection type liquid crystal display apparatus according to the tenth embodiment of the invention will be described.

In the reflection type liquid crystal display apparatus shown in FIG. 43, a polysilicon TFT 1317 having a source S, gate G and drain D is formed on a first glass substrate 1303.

On a second glass substrate 1307 opposing the first glass substrate 1303, a first common electrode 1305 is formed. Liquid crystal material E is filled in between the first and second glass substrates 1303 and 1307.

On the drain electrode D of the polysilicon TFT 1317, a protruded drain electrode 1326 made of Ti/Al/Ti and having a height of 1 $\mu$m is formed.

A planarizing insulating film 1321 made of acrylic resin and having a thickness of 2 $\mu$m covers the polysilicon TFT 1317 with the protruded drain electrode 1326. The protruded drain electrode 1326 and planarizing insulating film 1321 have substantially the same upper surface level.

A reflection electrode 1351 of Al is formed on the upper surface of the protruded drain electrode 1326 exposed at the surface level of the planarizing insulating film 1321.

The reflection type liquid crystal display apparatus shown in FIG. 43 has a good flatness of the reflection electrode 1351. Electrical connection between the reflection electrode and drain electrode is easy.

With the reflection type liquid crystal display apparatus of this embodiment, the protruded drain electrode is first formed on the drain electrode. Therefore, disturbed liquid crystal orientation does not occur when the reflection electrode and drain electrode are electrically connected. Since the surface of the reflection electrode is flat, bias polarization is hard to be generated. An area not contributing to image display, to be caused by the disturbed orientation at the contact hole when a pixel is made fine, becomes small.

Figure 44:
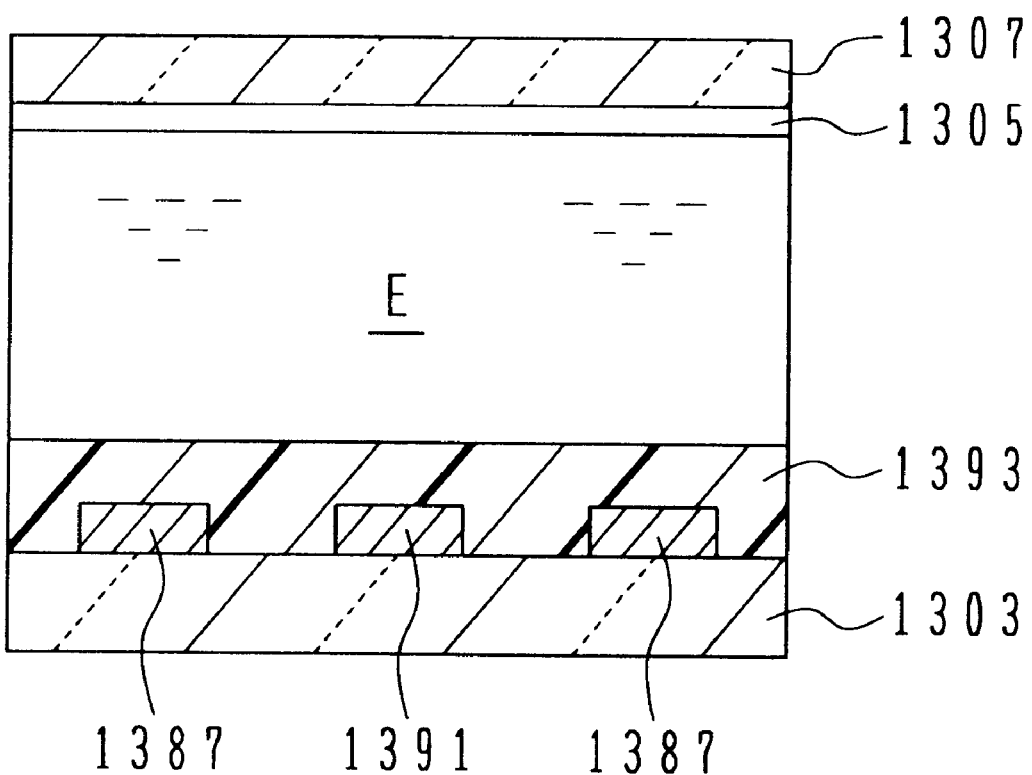
FIG. 44 is a cross sectional view of a reflection type liquid crystal display apparatus according to an eleventh embodiment of the invention, showing the pixel area.

With reference to FIG. 44, a reflection type liquid crystal display apparatus according to the eleventh embodiment of the invention will be described.

In the reflection type liquid crystal display apparatus shown in FIG. 44, on a first glass substrate 1303 with polysilicon TFTs, signal lines (bus lines) 1387 connected to the source electrodes of TFTs via an interlayer insulating film are formed.

On a second glass substrate 1307 opposing the first glass substrate 1303, a first common electrode 1305 is formed. Liquid crystal material E is filled in between the first and second glass substrates 1303 and 1307.

A pixel pitch is 30 μm and a thickness (step) of the signal lines 1387 is 1 μm.

In the reflection type liquid crystal display apparatus shown in FIG. 44, a dummy signal line 1391 not connected to the source electrode of TFT is formed approximately at the center between the signal lines 1387 and 1387, extending in the same direction as the signal line 1387.

After the dummy signal line 1391 is formed, acrylic resin is spin coated to form a planarizing insulating film 1393 having a thickness of 2 μm.

Thereafter, similar to the reflection type liquid crystal display apparatus of the eighth embodiment, a contact hole is formed reaching the drain electrode of TFT. A first reflection electrode of Al is deposited on the contact hole, covering the recessed wall of the contact hole. Then, a contact hole filler of acrylic resin is filled in the recessed space of the first reflection electrode in the contact hole. This contact hole filler is formed by coating acrylic region over the first glass substrate 1303 by spin coating and then performing an ashing process until the upper flat surface of the first reflection electrode becomes flush with the upper surface of the coated acrylic resin.

A second reflection electrode of Al is formed on the upper flat surface of the first reflection electrode.

The reflection type liquid crystal display apparatus with dummy signal lines shown in FIG. 44 has a much better flatness of the second reflection electrode than that of the ninth embodiment.

The liquid crystal display apparatus of the invention is suitable not only for personal computers but also portable diplexers, television, industrial monitoring systems and the like.

The present invention has been described in connection with the preferred embodiments. The invention is not limited only to the above embodiments. It is apparent that various modifications, improvements, combinations, and the like can be made by those skilled in the art.

What is claimed is:

1. A liquid crystal display apparatus comprising:
   a first substrate;
   a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode;
   a first peripheral circuit disposed outside said display section at opposite end portions of said first substrate in the row direction and including a scan line driver circuit including semiconductor active elements for driving the scan lines;
   a second peripheral circuit disposed outside said display section at opposite end portions of said first substrate in the column direction and including a signal line driver circuit including semiconductor active elements for driving the signal lines;
   a transparent second substrate disposed opposing said first substrate; a liquid crystal layer sandwiched between said first and second substrates; and
   an insulating light shielding film formed on an inner surface of said second substrate and covering at least a partial area of said second peripheral circuit.

2. A liquid crystal display apparatus according to claim 1, further comprising another insulating light shielding film disposed on an inner surface of said first substrate and covering at least a partial area of said second peripheral circuit.

3. A liquid crystal display apparatus according to claim 1, wherein at least a portion of said insulating light shielding film serves also as a seal member for sealing said liquid crystal layer between said first and second substrates.

4. A liquid crystal display apparatus according to claim 2, wherein said another insulating light shielding film is formed covering a whole surface of said first and second peripherals circuits.

5. A liquid crystal display apparatus according to claim 1, further comprising an electrically conducting shading film formed on the inner surface of said second substrate above said first peripheral circuit.

6. A liquid crystal display apparats according to claim 5, further comprising a further insulating light shielding film or an electrically conducting light shielding a filmed formed on an outer surface of said second substrate.

7. A liquid crystal display apparatus according to claim 5, further comprising another electrically conducting light shielding film on the inner surface of said second substrate above a circuit having a low operating frequency in said second peripheral circuit.

8. A liquid crystal display apparatus according to claim 5, wherein said second peripheral circuit comprises:
   video signal lines for transferring a video signal externally supplied;
   a plurality of analog switches disposed between the video signal lines and source electrodes of the semiconductor active elements, each analog switch including a control terminal and a pair of current terminal and switching the video signal transferred from the video signal line to the source electrode of the semiconductor active element in response to a signal applied to the control terminal; and
   an analog switch control section for controlling the plurality of analog switches,
   wherein said analog switch control section comprises:
   a shift register circuit including a plurality of stages of flip-flop circuits; a buffer circuit connected to an output of said flip-flop circuit of a corresponding stage; and
   an analog switch control line interconnecting each output of said buffer circuit and the control terminal of a corresponding one of said analog switches.

9. A liquid crystal display apparatus according to claim 8, wherein said shift register circuit includes a plurality of stages of D-type flip-flop circuits serially connected so that an output at a preceding stage is input to a succeeding stage, and said buffer circuit is connected to an output of the D-type flip-flop circuit of a corresponding stage and includes a serial inverter chain with serially connected inverted circuits.

10. A liquid crystal display apparatus comprising:

a first substrate;

a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode;

a first peripheral circuit disposed outside said display section at opposite end portions of said first substrate in the row direction and including a scan line driver circuit including semiconductor active elements for driving the scan lines;

a second peripheral circuit disposed outside said display section at opposite end portions of said first substrate in the column direction and including a signal line driver circuit including semiconductor active elements for driving the signal lines;

a transparent second substrate disposed opposing said first substrate;

a liquid crystal layer sandwiched between said first and second substrates; and a conducting light shielding film formed on an outer surface of said second substrate and covering at least a partial area of said second peripheral circuit.

11. An electronic instrument comprising:

a first substrate;

a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode;

a first peripheral circuit disposed outside said display section at opposite end portions of said first substrate in the row direction and including a scan line driver circuit including semiconductor active elements for driving the scan lines;

a second peripheral circuit disposed outside said display section at opposite end portions of said first substrate in the column direction and including a signal line driver circuit including semiconductor active elements for driving the signal lines;

a transparent second substrate disposed opposing said first substrate;

a liquid crystal layer sandwiched between said first and second substrates;

an insulating light shielding film formed on an inner surface of said second substrate and covering at least a partial area of said second peripheral circuit; and a housing including an electronic circuit.

12. A reflection type liquid crystal display apparatus comprising:

a first substrate including a display section with a plurality of pixels disposed in a matrix pattern;

a second substrate disposed opposing said first substrate and formed with a first common electrode; and a liquid crystal layer sandwiched between said first and second substrates, wherein the display section of said first substrate comprises:

a plurality of semiconductor active elements disposed in a matrix pattern, each having a source, a drain and a gate;

an interlayer insulating film deposited covering said semiconductor active elements;

a plurality of scan lines formed in said interlayer insulating film each for connecting the gate of the semiconductor active element dispose in a row direction;

a plurality of signal lines formed in said interlayer insulating film each for connecting the source of the semiconductor active element disposed in a column direction;

a second common electrode formed in said interlayer insulating film at a height higher than said scan and signal lines, covering a plurality of pixels, electrically connected to a constant voltage, and having an opening above the drain of each semiconductor active element; and a plurality of pixel electrodes formed on said interlayer insulating film, each being connected to the drain of a corresponding one of the semiconductor active element by penetrating through a contact hole formed in said interlayer insulating film in an area corresponding to the opening, said pixel electrode being separated for each pixel and opposing said first common electrode via said liquid crystal layer.

13. A reflection type liquid crystal display apparatus according to claim 12, further comprising a storage capacitor electrode connected to the drain of each semiconductor active element and disposed in said interlayer insulating film at an intermediate height between said pixel electrode and said second common electrode, said storage capacitor electrode being formed separately for each pixel and forming a storage capacitor by opposing said second common electrode.

14. A reflection type liquid crystal display apparatus according to claim 12, wherein said second common electrode is made of light shielding conductive material.

15. A reflection type liquid crystal display apparatus according to claim 12, wherein said pixel electrode includes an electrically conducting filler which fills the contact hole formed in said interlayer insulating film.

16. A reflection type liquid crystal display apparatus according to claim 12, wherein said first substrate includes a peripheral circuit section disposed around the display section and including a driver circuit for driving the display section, and the peripheral circuit section of said first substrate comprises:

a plurality of driver circuit semiconductor active elements each having a source, a drain and a gate;

a peripheral interlayer insulating film covering said driver circuit semiconductor active elements, having an essentially identical structure as said interlayer insulating film, and not including said second common electrode; and a peripheral shading film formed on said peripheral interlayer insulating film and having an essentially identical structure as said pixel electrode.

17. A reflection type liquid crystal display apparatus according to claim 12, wherein said peripheral shading film is electrically connected to said first common electrode.

18. A reflection type projection panel comprising:

a reflection type liquid crystal display apparatus and an optical system apparatus, wherein:

said reflection type liquid crystal display apparatus comprises:

a first substrate including a display section with a plurality of pixels disposed in a matrix pattern;

a second substrate disposed opposing said first substrate and formed with a first common electrode; and a liquid crystal layer sandwiched between said first and second substrates, wherein the display section of said first substrate comprises:

a plurality of semiconductor active elements disposed in a matrix pattern, each having a source, a drain and a gate;

an interlayer insulating film deposited covering said semiconductor active elements;

a plurality of scan lines formed in said interlayer insulating film each for connecting the gate of the semiconductor active element dispose in a row direction;

a plurality of signal lines formed in said interlayer insulating film each for connecting the source of the semiconductor active element disposed in a column direction;

a second common electrode formed in said interlayer insulating film at a level higher than said scan and signal lines, covering a plurality of pixels, electrically connected to said first common electrode, and having an opening above the drain of each semiconductor active element; and a plurality of pixel electrodes formed on said interlayer insulating film, each being connected to the drain of a corresponding one of the semiconductor active element by penetrating through a contact hole formed in said interlayer insulating film in an area corresponding to the opening, said pixel electrode being separated for each pixel and opposing said first common electrode via said liquid crystal layer; and said optical system apparatus comprises:

a light source for radiating light toward said second substrate from an opposite side of said first substrate; and an optical system for focusing light reflected from the pixels.

19. A reflection type direct view panel comprising:

a reflection type liquid crystal display apparatus and a polarizing plate, wherein:

said reflection type liquid crystal display apparatus comprises:

a first substrate including a display section with a plurality of pixels disposed in a matrix pattern;

a second substrate disposed opposing said first substrate and formed with a first common electrode; and a liquid crystal layer sandwiched between said first and second substrates, wherein the display section of said first substrate comprises:

a plurality of semiconductor active elements disposed in a matrix pattern, each having a source, a drain and a gate;

an interlayer insulating film deposited covering said semiconductor active elements;

a plurality of scan lines formed in said interlayer insulating film each for connecting the gate of the semiconductor active element disposed in a row direction;

a plurality of signal lines formed in said interlayer insulating film each for connecting the source of the semiconductor active element disposed in a column direction;

a second common electrode formed in said interlayer insulating film at a level higher than said scan and signal lines, covering a plurality of pixels, electrically connected to said first common electrode, and having an opening above the drain of each semiconductor active element; and a plurality of pixel electrodes formed on said interlayer insulating film, each being connected to the drain of a corresponding one of the semiconductor active element by penetrating through a contact hole formed in said interlayer insulating film in an area corresponding to the opening, said pixel electrode being separated for each pixel and opposing said first common electrode via said liquid crystal layer; and said polarizing plate being disposed facing a surface of said second substrate opposing said first substrate.

20. A reflection type liquid crystal display apparatus having a display section with a plurality of pixels disposed in a matrix pattern and a peripheral circuit disposed around the display section for driving the pixels in the display section, the apparatus comprising:

a first substrate defining the display section and the peripheral circuit;

a second substrate disposed opposing said first substrate and formed with a common electrode; and a liquid crystal layer sandwiched between said first and second substrates, wherein said first substrate comprises:

a plurality of semiconductor active elements for the pixels and the peripheral circuit, each having a source, a drain and a gate;

an interlayer insulating film deposited covering said semiconductor active elements, said interlayer insulating film including as a highest layer a planarizing film having a planarizing function;

a contact hole formed through said interlayer insulating film and reaching the drain of a corresponding one of the semiconductor active elements in the display section;

an electrically conducting connection member filled in said contact hole and having an essentially same surface level as said interlayer insulating film;

a reflection electrode formed on said interlayer insulating film, covering the semiconductor active elements in the display section, and being separated for each pixel; and a peripheral circuit shading film formed on said interlayer insulating film and covering the semiconductor active elements of the peripheral circuit.

21. A reflection type liquid crystal display apparatus according to claim 20, further comprising a storage capacitor electrode disposed under the planarizing film and having an opening inclusive of the contact hole, said storage capacitor electrode forming a storage capacitor by opposing said reflection electrode of a corresponding one of the pixels.

22. A reflection type liquid crystal display apparatus according to claim 21, wherein said peripheral circuit shading film and said storage capacitor electrode are connected to said common electrode.

23. A reflection type liquid crystal display apparatus according to claim 20, further comprising a seal member disposed between said first and second substrates, covering at least a partial area of the peripheral circuit, said seal member sealing said liquid crystal layer.

24. A reflection type liquid crystal display apparatus according to claim 20, further comprising dummy pixels formed in a boarder area between the display section and the peripheral circuit, said dummy pixel having an essentially identical structure as the pixel in the display section and said reflection electrode of said dummy pixel is applied with a same potential as said peripheral circuit shading film.

25. A liquid crystal display apparatus comprising:
 a first substrate;
 a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode connected to a drain electrode of the semiconductor active element;
 a peripheral circuit disposed at opposite end portions of said first substrate in row and column directions and including peripheral semiconductor active elements for driving the scan and signal lines;
 a second substrate disposed opposing said first substrate; and
 a liquid crystal layer sandwiched between said first and second substrates,
 wherein the pixel comprises:
 a planarizing insulating film covering the semiconductor active elements for the pixels;
 at least one contact hole formed through said planarizing insulating film and reaching the drain electrode of the semiconductor active element;
 a first electrode covering an area including said contact hole and leaving a recess on an upper surface of said first electrode;
 a contact hole filler for filling the recess on the upper surface of said first electrode; and
 a second electrode covering said first electrode and said contact hole filler.

26. A liquid crystal display apparatus comprising:
 a first substrate;
 a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes: a semiconductor active element having a source, a drain and a gate; a protruding drain electrode formed on the drain of the semiconductor active element; an insulating film filling an nearby area of the protruding drain electrode and having an essentially same height level as the protruding drain electrode; and a pixel electrode formed on the insulating film and the protruding drain electrode;
 a peripheral circuit disposed at opposite end portions of said first substrate in row and column directions and including peripheral semiconductor active elements for-driving the scan and signal lines;
 a second substrate disposed opposing said first substrate; and
 a liquid crystal layer sandwiched between said first and second substrates.

27. A liquid crystal display apparatus comprising:
 a first substrate;
 a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode connected to a drain electrode of the semiconductor active element;
 a peripheral circuit disposed at opposite end portions of said first substrate in row and column directions and including peripheral semiconductor active elements for driving the scan and signal lines;
 a second substrate disposed opposing said first substrate;
 a liquid crystal layer sandwiched between said first and second substrates;
 at least one dummy protruding member disposed in said peripheral circuit on said first substrate in a broad space on said first substrate; and
 a planarizing film formed on said first substrate, covering said dummy protruding member.

28. A reflection type liquid crystal panel comprising:
 a liquid crystal display apparatus and an optical system apparatus, wherein:
 said liquid crystal display apparatus comprises:
 a first substrate;
 a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes a semiconductor active element and a pixel electrode connected to a drain electrode of the semiconductor active element;
 a peripheral circuit disposed at opposite end portions of said first substrate in row and column directions and including peripheral semiconductor active elements for driving the scan and signal lines;
 a second substrate disposed opposing said first substrate; and
 a liquid crystal layer sandwiched between said first and second substrates,
 wherein the pixel comprises:
 a planarizing circuit film covering the semiconductor active elements for the pixels;
 at least one contact hole formed through said planarizing insulating film and reaching the drain electrode of the semiconductor active element;
 a first electrode covering an area including said contact hole and leaving a recess on an upper surface of said first electrode;
 a contact hole filler for filling the recess on the upper surface of said first electrode; and
 a second electrode covering said first electrode and said contact hole filler; and
 said optical system apparatus comprises:
 a light source for radiating light toward said second substrate from an opposite side of said first substrate; and an optical system for focussing light reflected from the pixels.

29. A reflection type liquid crystal panel comprising:

a liquid crystal display apparatus and an optical system apparatus, wherein:

said liquid crystal display apparatus comprises: a first substrate;

a display section formed on said first substrate and including a plurality of pixels disposed in a matrix pattern, a plurality of scan lines extending in a row direction and a plurality of signal lines extending in a column direction, wherein one pixel is connected at each cross point between the scan and signal lines and each pixel includes: a semiconductor active element having a source, a drain and a gate: a protruding drain electrode formed on the drain of the semiconductor active element; an insulating film filling a nearby area of the protruding drain electrode and having an essentially same height level as the protruding drain electrode; and a pixel electrode formed on the insulating film and the protruding drain electrode;

a peripheral circuit disposed at opposite end portions of said first substrate in row and column directions and including peripheral semiconductor active elements for driving the scan and signal lines;

a second substrate disposed opposing said first substrate; and a liquid crystal layer sandwiched between said first and second substrates; and said optical system apparatus comprises:

a light source for radiating light toward said second substrate from an opposite side of said first substrate; and an optical system for focussing light reflected from the pixels.

30. A reflection tpe liquid crystal panel comprising:

liquid crystal display apparatus and an optical system apparatus, wherein:

said liquid crystal display apparatus comprises:

a first substrate;

a display section formed on said first substrate and including a plurality of pixels disposed in a matrix pattern, plurality of scan lines extending in a row direction and a plurality of signal lines extending in a column direction, wherein one pixel is connected at each cross point between the scan and signal lines and each pixel includes a semiconductor active element and a pixel electrode connected to a drain electrode of the semiconductor active element;

a peripheral circuit disposed at opposite end potions of said first substrate in row and column directions and including peripheral semiconductor active elements for driving the scan and signal lines;

a second substrate disposed opposing said first substrate;

a liquid crystal layer sandwiched between said first and second substrates;

at least one dummy protruding member disposed in said peripheral circuit on said first substrate in a broad space on said first substrate; and a planarizing film formed on said first substrate, covering said dummy protruding member; and said optical system apparatus comprises:

a light source for radiating light toward said second substrate from an opposite side of said first substrate; and an optical system for focusing light reflected from the pixels.

* * * * *

UNITED STATES PATENT AND TRADEMARK OFFICE
CERTIFICATE OF CORRECTION

PATENT NO. : 6,396,470 B1 Page 1 of 1
DATED : May 28, 2002
INVENTOR(S) : Zhang et al.

It is certified that error appears in the above-identified patent and that said Letters Patent is hereby corrected as shown below:

Column 34,
Line 32, please delete "apparats" and insert -- apparatus --
Line 34, please delete "a filmed" and insert -- film --

Column 35,
Line 2, please delete "inverted" and insert -- inverter --

Column 40,
Line 51, please delete "circuit" and insert -- insulating --

Column 42,
Line 1, please delete "tpe" and insert -- type --
Line 2, please insert -- a -- before liquid crystal display
Line 16, please delete "potions" and insert -- portions --

Signed and Sealed this

Eighth Day of April, 2003

JAMES E. ROGAN
*Director of the United States Patent and Trademark Office*